(12) United States Patent
Miyairi et al.

(10) Patent No.: US 8,604,481 B2
(45) Date of Patent: Dec. 10, 2013

(54) THIN FILM TRANSISTOR

(71) Applicant: Semiconductor Energy Laboratory Co., Ltd., Atsugi (JP)

(72) Inventors: Hidekazu Miyairi, Kanagawa (JP); Takeyoshi Watabe, Kanagawa (JP); Takashi Shimazu, Tokyo (JP)

(73) Assignee: Semiconductor Energy Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/633,900

(22) Filed: Oct. 3, 2012

(65) Prior Publication Data

US 2013/0270525 A1  Oct. 17, 2013

Related U.S. Application Data

(63) Continuation of application No. 12/716,002, filed on Mar. 2, 2010, now Pat. No. 8,304,775.

(30) Foreign Application Priority Data

Mar. 9, 2009  (JP) ................ 2009-055549

(51) Int. Cl.
  *H01L 29/04* (2006.01)
  *H01L 31/036* (2006.01)
  *H01L 31/0376* (2006.01)
  *H01L 31/20* (2006.01)

(52) U.S. Cl.
  USPC .. 257/59; 257/72; 257/E29.117; 257/E29.273

(58) Field of Classification Search
  USPC ......... 257/40, 59, 72, 347, E29.117, E29.273
  See application file for complete search history.

(56) References Cited

U.S. PATENT DOCUMENTS

| 4,409,134 | A | 10/1983 | Yamazaki |
| 5,101,242 | A | 3/1992 | Ikeda et al. |
| 5,221,631 | A | 6/1993 | Ikeda et al. |
| 5,311,040 | A | 5/1994 | Hiramatsu et al. |

(Continued)

FOREIGN PATENT DOCUMENTS

| CN | 101369604 | 2/2009 |
| EP | 0 449 539 A2 | 10/1991 |

(Continued)

OTHER PUBLICATIONS

Song. J et al., "34.1: Advanced Four-Mask Process Architecture for the A-Si TFT Array Manufacturing Method,", SID Digest '02 : SID International Symposium Digest of Technical Papers, 2002, vol. 33, pp. 1038-1041.

(Continued)

*Primary Examiner* — Hoai V Pham
(74) *Attorney, Agent, or Firm* — Nixon Peabody LLP; Jeffrey L. Costellia

(57) ABSTRACT

A thin film transistor includes a gate insulating layer covering a gate electrode, a semiconductor layer in contact with the gate insulating layer, and impurity semiconductor layers which are in contact with part of the semiconductor layer and which form a source region and a drain region. The semiconductor layer includes a microcrystalline semiconductor layer formed on the gate insulating layer and a microcrystalline semiconductor region containing nitrogen in contact with the microcrystalline semiconductor layer. The thin film transistor in which off-current is small and on-current is large can be manufactured with high productivity.

26 Claims, 28 Drawing Sheets

(56) References Cited

U.S. PATENT DOCUMENTS

| | | |
|---|---|---|
| 5,453,858 A | 9/1995 | Yamazaki |
| 5,514,879 A | 5/1996 | Yamazaki |
| 5,591,987 A | 1/1997 | Yamazaki et al. |
| 5,600,154 A | 2/1997 | Shimizu et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 6,011,277 A | 1/2000 | Yamazaki |
| 6,017,781 A | 1/2000 | Shimizu et al. |
| 6,023,075 A | 2/2000 | Yamazaki |
| 6,153,893 A | 11/2000 | Inoue et al. |
| 6,171,674 B1 | 1/2001 | Yamazaki et al. |
| 6,183,816 B1 | 2/2001 | Yamazaki et al. |
| 6,188,085 B1 | 2/2001 | Shimizu et al. |
| 6,246,070 B1 | 6/2001 | Yamazaki et al. |
| 6,252,249 B1 | 6/2001 | Yamazaki |
| 6,255,146 B1 | 7/2001 | Shimizu et al. |
| 6,281,520 B1 | 8/2001 | Yamazaki |
| 6,306,213 B1 | 10/2001 | Yamazaki |
| 6,410,372 B2 | 6/2002 | Flewitt |
| 6,468,617 B1 | 10/2002 | Yamazaki et al. |
| 6,468,839 B2 | 10/2002 | Inoue et al. |
| 6,483,124 B2 | 11/2002 | Flewitt |
| 6,737,676 B2 | 5/2004 | Yamazaki |
| 6,750,086 B2 | 6/2004 | Jinno et al. |
| 6,756,258 B2 | 6/2004 | Zhang et al. |
| 6,835,523 B1 | 12/2004 | Yamazaki et al. |
| 7,045,818 B2 | 5/2006 | Jinno et al. |
| 7,067,844 B2 | 6/2006 | Yamazaki |
| 7,098,479 B1 | 8/2006 | Yamazaki |
| 7,115,902 B1 | 10/2006 | Yamazaki |
| 7,199,846 B2 | 4/2007 | Lim |
| 7,442,592 B2 | 10/2008 | Ichijo et al. |
| 7,511,709 B2 | 3/2009 | Koyama et al. |
| 7,968,879 B2 * | 6/2011 | Yamazaki .................. 257/52 |
| 8,017,946 B2 | 9/2011 | Yamazaki et al. |
| 8,395,158 B2 | 3/2013 | Yamazaki et al. |
| 2002/0009819 A1 | 1/2002 | Flewitt |
| 2005/0022864 A1 | 2/2005 | Fujioka et al. |
| 2005/0115930 A1 | 6/2005 | Tanaka et al. |
| 2007/0181945 A1 | 8/2007 | Nakamura |
| 2009/0033818 A1 | 2/2009 | Nakajima et al. |
| 2009/0057683 A1 | 3/2009 | Nakajima et al. |
| 2009/0061574 A1 | 3/2009 | Nakajima et al. |
| 2009/0114921 A1 | 5/2009 | Yamazaki et al. |
| 2009/0321737 A1 | 12/2009 | Isa et al. |

FOREIGN PATENT DOCUMENTS

| | | |
|---|---|---|
| EP | 0 535 979 A2 | 4/1993 |
| JP | 57-071126 | 5/1982 |
| JP | 58-092217 | 6/1983 |
| JP | 59-072781 | 4/1984 |
| JP | 03-278466 | 12/1991 |
| JP | 04-266019 | 9/1992 |
| JP | 05-129608 | 5/1993 |
| JP | 06-326312 | 11/1994 |
| JP | 07-099207 | 4/1995 |
| JP | 07-131030 | 5/1995 |
| JP | 10-275913 | 10/1998 |
| JP | 2000-277439 | 10/2000 |
| JP | 2001-007024 | 1/2001 |
| JP | 2001-053283 | 2/2001 |
| JP | 2004-014958 | 1/2004 |
| JP | 2005-049832 | 2/2005 |
| JP | 2005-167051 | 6/2005 |
| JP | 2005-191546 | 7/2005 |
| JP | 2008-124392 | 5/2008 |
| JP | 2009-135436 | 6/2009 |
| JP | 2009-278075 | 11/2009 |
| WO | WO-02/07207 A1 | 1/2002 |
| WO | WO 2004-086487 A1 | 10/2004 |

OTHER PUBLICATIONS

Esmaeili-Rad. M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Kim.C et al., "A Novel Four-Mask-Count Process Architecture for TFT-LCDS,", SID Digest '00 : SID International Symposium Digest of Technical Papers, 2000, vol. 31, pp. 1006-1009.

Arai.T et al., "41.2: Micro Silicon Technology for Active Matrix OLED Display,", SID Digest '07 : SID International Symposium Digest of Technical Papers, 2007, vol. 38, pp. 1370-1373.

Fujiwara.H et al., "Stress-Induced Nucleation of Microcrystalline Silicon from Amorphous Phase,", Jpn. J. Appl. Phys. ( Japanese Journal of Applied Physics ) , May 15, 2002, vol. 41, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. ( Japanese Journal of Applied Physics ) , Mar. 1, 1998, vol. 37, No. 3A, pp. L265-L268.

Lee.C et al., "Directly Deposited Nanocrystalline Silicon Thin-Film Transistors With Ultra High Mobilities,", Appl. Phys. Lett. ( Applied Physics Letters ) , Dec. 18, 2006, vol. 89, No. 25, pp. 252101-1-252101-3.

Song.J et al., "34.1: Advanced Four-Mask Process Architecture for the A-Si TFT Array Manufacturing Method,", SID Digest '02 : SID International Symposium Digest of Technical Papers, 2002, vol. 32, pp. 1038-1041.

Choi.S et al., "P-16: Novel Four-Mask Process in the FFS TFT-LCD With Optimum Multiple-Slit Design Applied by the Use of a Gray-Tone Mask,", SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Appl. Phys. Lett. ( Applied Physics Letters ) , May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Lee.C et al., "How to Achieve High Mobility Thin Film Transistors by Direct Deposition of Silicon Using 13.56 MHZ RF PECVD?,", IEDM, 2006, pp. 295-298.

Lee.H et al., "Leakage Current Mechanisms in Top-Gate Nanocrystalline Silicon Thin-Film Transistors,", Appl. Phys. Lett. ( Applied Physics Letters ) , Feb. 28, 2008, vol. 92, pp. 083509-1-083509-3.

Lee.C et al., "Stability of NC-SI:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,"Proceedings of the IEEE, Aug. 1, 2005, vol. 93, No. 8, pp. 1420-1428.

Lee.C et al., "Top-Gate TFTS Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75C Hydrogenated Nanocrystalline Silicon Plasma-Enhanced Chemical Vapor Deposition Films ,", J. Appl. Phys. ( Journal of Applied Physics ) , Aug. 4, 2005, vol. 98, No. 3, pp. 034305-1-034305-7.

(56) References Cited

OTHER PUBLICATIONS

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Real-time spectroscopic ellipsometry studies of the nucleation and grain growth processes in microcrystalline silicon thin films,", Phys. Rev. B (Physical Review. B), Feb. 23, 2001, vol. 63, pp. 115306-1-115306-9.

Invitation to pay additional fees (application No. PCT/JP2009/061795;PCT11623/12200/12401), International Searching Authority, dated July 28, 2009.

International Search Report (Application No. PCT/JP2010/052574; PCT12223) Dated Mar. 16, 2010.

Written Opinion (Application No. PCT/JP2010/052574;PCT12223) Dated Mar. 16, 2010.

Chinese Office Action (Application No. 201080011849.9; PCTCN12223) Dated Apr. 28, 2013.

\* cited by examiner

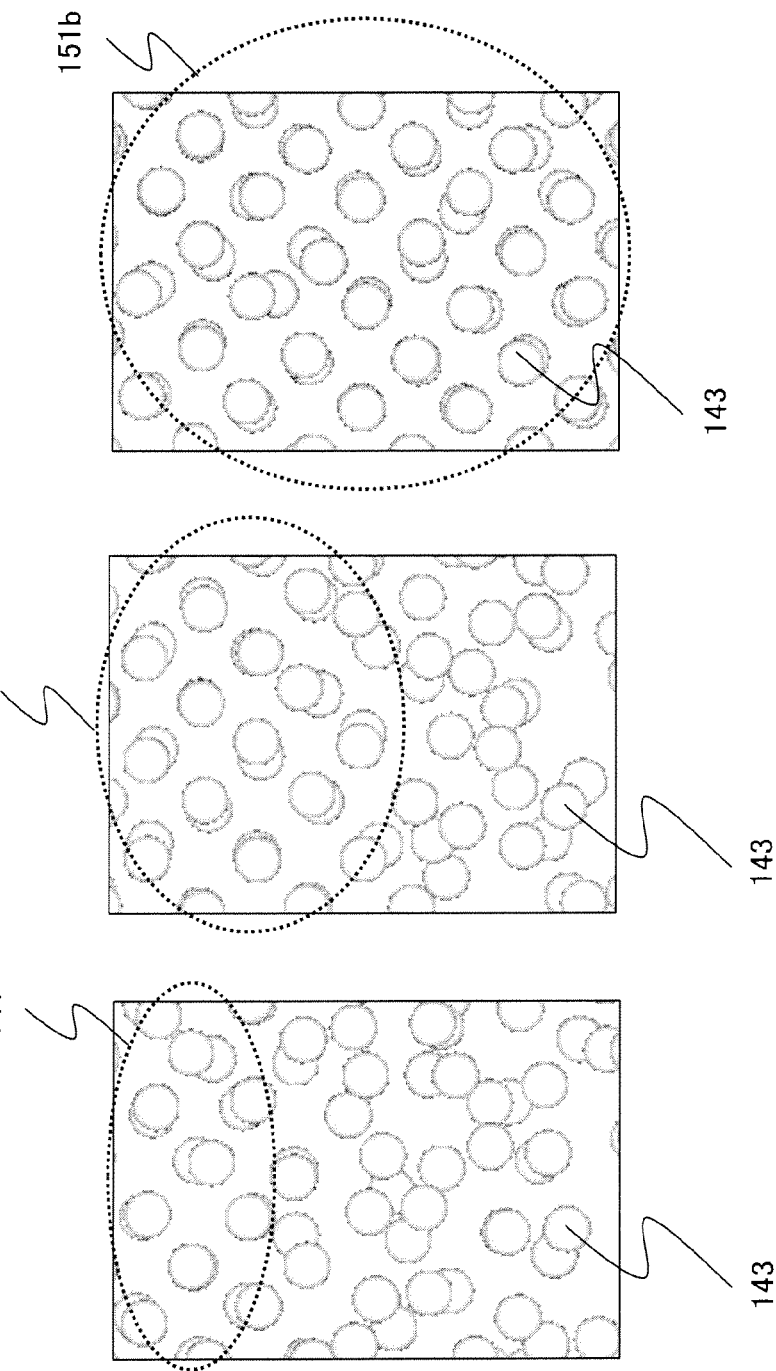

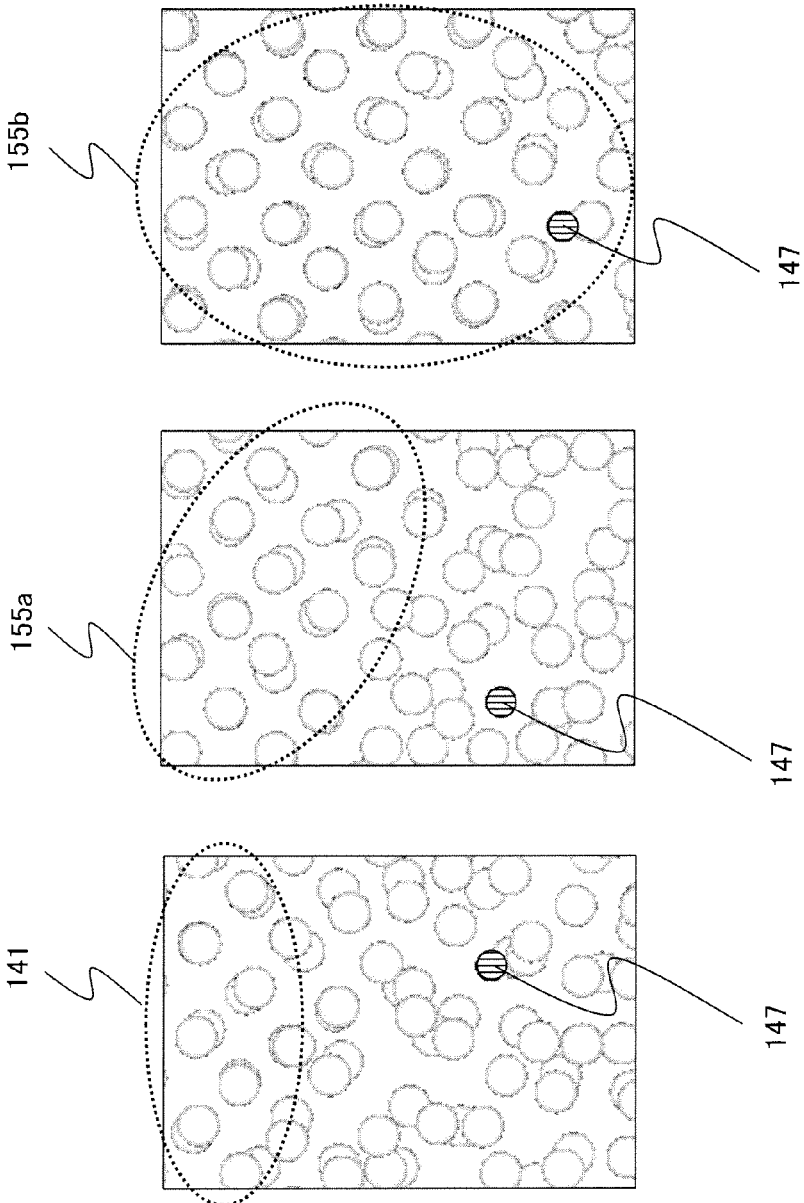

THIN FILM TRANSISTOR

TECHNICAL FIELD

The present invention relates to a thin film transistor and a method for manufacturing the thin film transistor, and a display device to which the thin film transistor is applied.

BACKGROUND ART

As a kind of field-effect transistor, a thin film transistor in which a channel formation region is formed in a semiconductor layer formed over a substrate having an insulating surface is known. Techniques for using amorphous silicon, microcrystalline silicon, and polycrystalline silicon for semiconductor layers in thin film transistors have been disclosed (see Patent Documents 1 to 5). A typical application of the thin film transistor is a liquid crystal television device in which the thin film transistor has been put to practical use as a switching transistor for a pixel that constitutes a display screen.

REFERENCE

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546

DISCLOSURE OF INVENTION

A thin film transistor in which a channel is formed using an amorphous silicon layer has problems such as low field-effect mobility and small on-current. On the other hand, a thin film transistor in which a channel is formed using a microcrystalline silicon layer has a problem in that, whereas the field-effect mobility is higher than that of the thin film transistor in which a channel is formed using an amorphous silicon layer, off-current is large, and thus sufficient switching characteristics cannot be obtained.

A thin film transistor in which a polycrystalline silicon layer is used for a channel formation region has characteristics such as much higher field-effect mobility and large on-current than those of the above-described two types of thin film transistors. Because of such characteristics, this thin film transistor can be used not only as a switching transistor provided in a pixel but also used in a driver circuit for which high-speed operation is needed.

However, the thin film transistor formed using a polycrystalline silicon layer needs a crystallization process of a semiconductor layer and has a problem of higher manufacturing cost, compared to the thin film transistor formed using an amorphous silicon layer. For example, a laser annealing technique involved in the process for forming a polycrystalline silicon layer has a problem in that large-screen liquid crystal panels cannot be produced efficiently because the laser beam irradiation area is small.

A glass substrate for manufacturing display panels has grown in size from year to year as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), and the 8th generation (2200 mm×2400 mm). From now on, the size of the glass substrate is expected to grow to the 9th generation (2400 mm×2800 mm or 2450 mm×3050 mm) and the 10th generation (2950 mm×3400 mm). The increase in size of the glass substrate is based on the concept of minimum cost design.

However, a technique for manufacturing thin film transistors capable of high-speed operation over a large-area mother glass substrate like that of the 10th generation (2950 mm×3400 mm) with high productivity has not been established yet, which is a problem in industry.

Therefore, it is an object of an embodiment of the present invention to provide a method for manufacturing a thin film transistor which has favorable electric characteristics with high productivity.

According to one embodiment of the present invention, a thin film transistor includes a gate insulating layer covering a gate electrode; a semiconductor layer in contact with the gate insulating layer; and impurity semiconductor layers which are in contact with part of the semiconductor layer and which form a source region and a drain region. The semiconductor layer includes a microcrystalline semiconductor layer formed on the gate insulating layer side and a microcrystalline semiconductor region containing nitrogen which is in contact with the microcrystalline semiconductor layer.

According to another embodiment of the present invention, a thin film transistor includes a gate insulating layer covering a gate electrode; a semiconductor layer in contact with the gate insulating layer; and impurity semiconductor layers which are in contact with part of the semiconductor layer and which form a source region and a drain region. The semiconductor layer includes a microcrystalline semiconductor layer formed on the gate insulating layer side, a microcrystalline semiconductor region containing nitrogen which is in contact with the microcrystalline semiconductor layer, and an amorphous semiconductor region containing nitrogen which is in contact with the microcrystalline semiconductor region.

A nitrogen concentration profile in the semiconductor layer which is obtained by SIMS has an increase from the gate insulating layer side toward the impurity semiconductor layers and then a decrease. Alternatively, the nitrogen concentration profile in the semiconductor layer which is obtained by SIMS has an increase from the gate insulating layer side toward the impurity semiconductor layers and then is flat. Further alternatively, the nitrogen concentration profile obtained by SIMS has a maximum value in the semiconductor layer. The maximum value at this time falls within the range of $1\times10^{20}$ atoms/cm$^3$ to $1\times10^{21}$ atoms/cm$^3$ inclusive, preferably $2\times10^{20}$ atoms/cm$^3$ to $1\times10^{21}$ atoms/cm$^3$ inclusive.

According to another embodiment of the present invention, a thin film transistor includes a gate insulating layer; a microcrystalline semiconductor layer in contact with the gate insulating layer; a mixed layer in contact with the microcrystalline semiconductor layer; a layer containing an amorphous semiconductor which is in contact with the mixed layer; and a source region and a drain region which are in contact with the layer containing an amorphous semiconductor. The mixed layer and the layer containing an amorphous semiconductor each contain nitrogen.

According to another embodiment of the present invention, a thin film transistor includes a gate insulating layer; a microcrystalline semiconductor layer in contact with the gate insulating layer; a mixed layer in contact with the microcrystalline semiconductor layer; a layer containing an amorphous semiconductor which is in contact with the mixed layer; and a source region and a drain region which are in contact with the layer containing an amorphous semiconductor. The nitrogen concentration profile obtained by SIMS has a peak concentration in the mixed layer.

The nitrogen concentration profile has a peak concentration within the range of $1\times10^{20}$ atoms/cm$^3$ to $1\times10^{21}$ atoms/cm$^3$ inclusive, preferably $2\times10^{20}$ atoms/cm$^3$ to $1\times10^{21}$ atoms/cm$^3$ inclusive. The mixed layer includes a microcrystalline semiconductor region and an amorphous semiconductor region. Here, the microcrystalline semiconductor region includes a semiconductor crystal grain having a diameter of 1 nm 10 nm inclusive and/or a conical or pyramidal crystal region.

Further, the mixed layer and the layer containing an amorphous semiconductor each contain nitrogen, an NH group, or an $NH_2$ group.

In addition, in the mixed layer and the layer containing an amorphous semiconductor, dangling bonds of semiconductor atoms which exist at the interface between adjacent microcrystalline semiconductor regions (i.e., crystal grain boundaries) and the interface between the microcrystalline semiconductor region and the amorphous semiconductor region are cross-linked with an NH group and thus defect levels are reduced, so that a path through which carriers are transferred is formed. Alternatively, a dangling bond is terminated with an $NH_2$ group and thus defect levels are reduced.

As a result, in the thin film transistor, resistance between the gate insulating layer and the source and drain regions of when voltage is applied to a source or drain electrode can be reduced, whereby on-current and field-effect mobility of the thin film transistor can be increased. The layer containing an amorphous semiconductor is formed using a well-ordered semiconductor layer which has fewer defects and whose tail of a level at a band edge in the valence band is steep; therefore, the band gap gets wider, and tunneling current does not easily flow. Therefore, by providing the layer containing an amorphous semiconductor on the back channel side, off-current of the thin film transistor can be reduced.

Here, the concentration is measured by secondary ion mass spectrometry (SIMS) unless a method for measuring the concentration is mentioned.

Note that on-current refers to a current which flows between a source electrode and a drain electrode when a thin film transistor is on. For example, in the case of an n-channel thin film transistor, on-current refers to a current which flows between a source electrode and a drain electrode when gate voltage is higher than the threshold voltage of the thin film transistor.

In addition, off-current refers to a current which flows between a source electrode and a drain electrode when a thin film transistor is off. For example, in the case of an n-channel thin film transistor, off-current refers to a current which flows between a source electrode and a drain electrode when gate voltage is lower than the threshold voltage of the thin film transistor.

As described above, a thin film transistor with small off-current and large on-current can be manufactured with high productivity.

BRIEF DESCRIPTION OF DRAWINGS

FIGS. 9A to 9C each illustrate a semiconductor layer of a thin film transistor.

FIGS. 10A to 10C each illustrate a semiconductor layer of a thin film transistor.

FIGS. 14A-1 to 14B-2 illustrate multi-tone masks applicable to a method for manufacturing a thin film transistor.

BEST MODE FOR CARRYING OUT THE INVENTION

Figure 1:
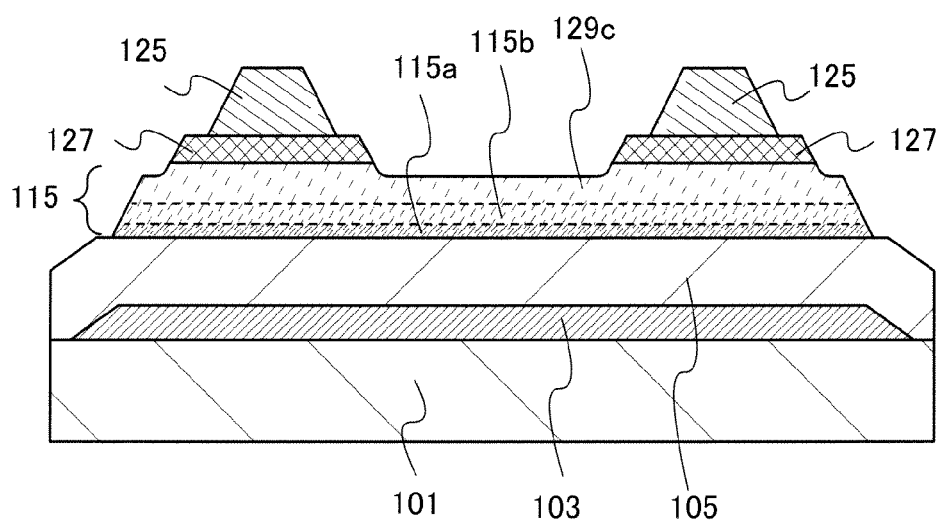
FIG. 1 is a cross-sectional view illustrating a thin film transistor.

Hereinafter, embodiments are described in detail with reference to the drawings. Note that the invention which is disclosed is not limited to the following description, and it is easily understood by those skilled in the art that modes and details thereof can be modified in various ways without departing from the spirit and the scope of the invention. Therefore, the invention which is disclosed should not be interpreted as being limited to the following description of the embodiments. Note that in the structures of the invention described hereinafter, the same portions or portions having similar functions are denoted by the same reference numerals throughout the drawings, and description thereof is not repeated.

Embodiment 1

FIG. 1 is a cross-sectional view of an embodiment of a thin film transistor. The thin film transistor illustrated in FIG. 1 includes a gate electrode 103 over a substrate 101, a semiconductor layer 115 over a gate insulating layer 105, impurity semiconductor layers 127 serving as source and drain regions which are in contact with part of the upper surface of the semiconductor layer 115, and wirings 125 in contact with the impurity semiconductor layers 127. The semiconductor layer 115 includes a microcrystalline semiconductor layer 115a, a mixed layer 115b, and a layer 129c containing an amorphous semiconductor, which are stacked in sequence over the gate insulating layer 105.

As the substrate 101, a glass substrate, a ceramic substrate, a plastic substrate which has high heat resistance enough to withstand a process temperature of this manufacturing process, or the like can be used. In the case where the substrate does not need a light-transmitting property, a metal substrate, such as a stainless steel alloy substrate, provided with an insulating layer on its surface may be used. As a glass substrate, for example, an alkali-free glass substrate formed using barium borosilicate glass, aluminoborosilicate glass, aluminosilicate glass, or the like may be used. Further, as the glass substrate 101, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrode 103 can be formed with a single layer or a stacked layer using a metal material such as molybdenum, titanium, chromium, tantalum, tungsten, aluminum, copper, neodymium, or scandium or an alloy material which contains any of these materials as its main component. Alternatively, a semiconductor layer typified by polycrystalline silicon doped with an impurity element such as phosphorus, or an AgPdCu alloy may be used.

As a two-layer structure for the gate electrode 103, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure for the gate electrode 103, a stack structure of a tungsten layer or a tungsten nitride layer, a layer of an alloy of aluminum and silicon or an alloy of aluminum and titanium, and a titanium nitride layer or a titanium layer is preferable. When a metal layer functioning as a barrier layer is stacked over a layer with low electric resistance, electric resistance can be low and diffusion of a metal element from the metal layer into the semiconductor layer can be prevented.

In order to improve adhesion between the gate electrode 103 and the substrate 101, a layer of a nitride of any of the aforementioned metal materials may be provided between the substrate 101 and the gate electrode 103.

The gate insulating layer 105 can be formed with a single layer or a stacked layer using any of a silicon oxide layer, a silicon nitride layer, a silicon oxynitride layer, and a silicon nitride oxide layer by a CVD method, a sputtering method, or the like.

In this specification, silicon oxynitride contains more oxygen than nitrogen, and in the case where measurements are performed using Rutherford backscattering spectrometry (RBS) and hydrogen forward scattering spectrometry (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Figure 2A:
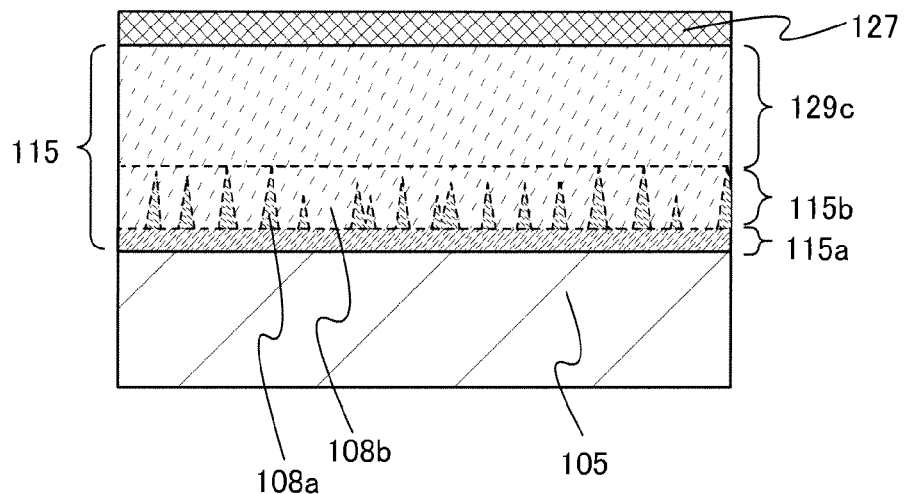
FIGS. 2A and 2B are cross-sectional views each illustrating a thin film transistor.
Figure 2B:
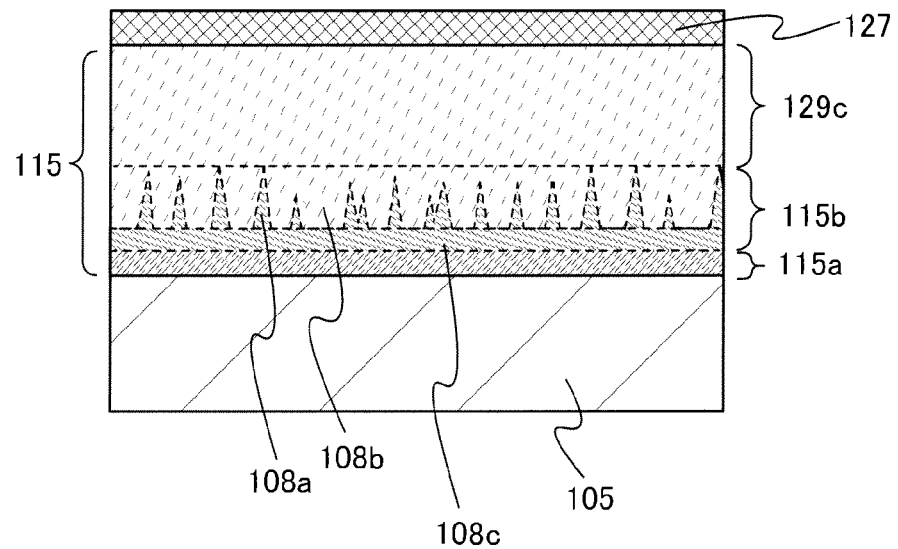

FIGS. 2A and 2B each illustrate the structure of the semiconductor layer 115. FIGS. 2A and 2B are each an enlarged view of a portion from the gate insulating layer 105 to the impurity semiconductor layers 127 serving as source and drain regions in FIG. 1.

As illustrated in FIG. 2A, in the semiconductor layer 115, the microcrystalline semiconductor layer 115a, the mixed layer 115b, and the layer 129c containing an amorphous semiconductor are stacked.

A microcrystalline semiconductor included in the microcrystalline semiconductor layer 115a is a semiconductor having a crystal structure (including a single crystal and a polycrystal). The microcrystalline semiconductor is a semiconductor having a third state that is stable in terms of free energy and is a crystalline semiconductor having short-range order and lattice distortion in which columnar crystals, or conical or pyramidal crystals having a diameter of 2 nm to 200 nm inclusive, preferably 10 nm to 80 nm inclusive, more preferably 20 nm to 50 nm inclusive have grown in a normal direction with respect to the substrate surface. Therefore, a crystal grain boundary is formed at the interface of the columnar crystals, or the conical or pyramidal crystals in some cases.

Microcrystalline silicon which is a typical example of the microcrystalline semiconductor has a peak of Raman spectrum which is shifted to a lower wave number than 520 cm$^{-1}$ that represents single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline semiconductor may contain hydrogen or halogen of at least 1 at. % to terminate a dangling bond. Moreover, a rare gas element such as helium, neon, argon, krypton, or xenon may be contained to further promote lattice distortion, so that stability of the structure of minute crystals is enhanced and a favorable microcrystalline semiconductor can be obtained. Such description about the microcrystalline semiconductor is disclosed in, for example, U.S. Pat. No. 4,409,134.

The concentrations of oxygen and nitrogen contained in the microcrystalline semiconductor layer 115a which are measured by secondary ion mass spectrometry are set to less than $1 \times 10^{18}$ atoms/cm$^3$, which is preferable since the crystallinity of the microcrystalline semiconductor layer 115a can be improved.

The mixed layer 115b and the layer 129c containing an amorphous semiconductor each contain nitrogen. The concentration of nitrogen contained in the mixed layer 115b is $1 \times 10^{20}$ atoms/cm$^3$ to $1 \times 10^{21}$ atoms/cm$^3$ inclusive, preferably $2 \times 10^{20}$ atoms/cm$^3$ to $1 \times 10^{21}$ atoms/cm$^3$ inclusive.

As illustrated in FIG. 2A, the mixed layer 115b includes microcrystalline semiconductor regions 108a and an amorphous semiconductor region 108b which fills a space between the microcrystalline semiconductor regions 108a. Specifically, the mixed layer 115b includes the microcrystalline semiconductor regions 108a which grow with a projecting shape from the microcrystalline semiconductor layer 115a and the amorphous semiconductor region 108b which includes the same kind of semiconductor as that of the layer 129c containing an amorphous semiconductor. A straight dashed line between the microcrystalline semiconductor layer 115a and the mixed layer 115b and a straight dashed line between the mixed layer 115b and the layer 129c containing an amorphous semiconductor each denote an interface between the two layers; however, in an actual case, the interface between the microcrystalline semiconductor layer 115a and the mixed layer 115b and the interface between the mixed layer 115b and the layer 129c containing an amorphous semiconductor are unclear.

The microcrystalline semiconductor region 108a includes a microcrystalline semiconductor having a conical or pyramidal shape or a projecting shape whose end is narrowed from the gate insulating layer 105 toward the layer 129c containing an amorphous semiconductor. Note that the microcrystalline semiconductor region 108a may also include a microcrystalline semiconductor having a conical or pyramidal shape or a projecting shape whose width is increased from the gate insulating layer 105 toward the layer 129c containing an amorphous semiconductor.

In addition, in some cases, a semiconductor crystal grain having a diameter of 1 nm to 10 nm inclusive, preferably 1 nm to 5 nm inclusive, is provided as a microcrystalline semiconductor region in the amorphous semiconductor region 108b of the mixed layer 115b.

Alternatively, as illustrated in FIG. 2B, the mixed layer 115b includes a microcrystalline semiconductor region 108c and the microcrystalline semiconductor region 108a which are successively formed, in some cases. The microcrystalline semiconductor region 108c is deposited with a uniform thickness over the microcrystalline semiconductor layer 115a, and the microcrystalline semiconductor region 108a has a conical or pyramidal shape or a projecting shape whose end is narrowed from the gate insulating layer 105 toward the layer 129c containing an amorphous semiconductor.

The microcrystalline semiconductor region 108a included in the mixed layer 115b illustrated in FIG. 2A is formed continuously from the microcrystalline semiconductor layer 115a. In addition, the microcrystalline semiconductor region 108c included in the mixed layer 115b illustrated in FIG. 2B is formed continuously from the microcrystalline semiconductor layer 115a.

In addition, the amorphous semiconductor region 108b included in the mixed layer 115b includes a semiconductor, the quality of which is substantially the same as that of the layer 129c containing an amorphous semiconductor.

According to the above, an interface between a region formed using a microcrystalline semiconductor and a region formed using an amorphous semiconductor may correspond to the interface between the microcrystalline semiconductor region 108a and the amorphous semiconductor region 108b in the mixed layer; thus, a cross-sectional boundary between the microcrystalline semiconductor region and the amorphous semiconductor region can be described as uneven or zigzag.

In the case where the microcrystalline semiconductor region 108a includes a projecting semiconductor crystal grain whose end is narrowed from the gate insulating layer 105 toward the layer 129c containing an amorphous semiconductor, the proportion of the microcrystalline semiconductor regions in the mixed layer 115b is higher in a region close to the microcrystalline semiconductor layer 115a than in a region close to the layer 129c containing an amorphous semiconductor. The reason for this is as follows. The microcrystalline semiconductor region 108a grows in a film thickness direction from the surface of the microcrystalline semiconductor layer 115a. By adding a gas containing nitrogen in a source gas, or by adding a gas containing nitrogen in a source gas and reducing the flow rate of hydrogen to silane from that under the condition for forming a microcrystalline semiconductor film, growth of the semiconductor crystal grain in the microcrystalline semiconductor region 108a is suppressed, the semiconductor crystal grain becomes a conical or pyramidal microcrystalline semiconductor region, and the amorphous semiconductor is gradually deposited. This is caused by the fact that the solid solubility of nitrogen in the microcrystalline semiconductor region is lower than in the amorphous semiconductor region.

Off-current of the thin film transistor can be reduced by setting the total thickness of the microcrystalline semiconductor layer 115a and the mixed layer 115b, that is, the distance from the interface between the microcrystalline semiconductor layer 115a and the gate insulating layer 105 to the tip of the projection (projecting portion) in the mixed layer 115b, to 3 nm to 80 nm inclusive, preferably 5 nm to 50 nm inclusive.

The layer 129c containing an amorphous semiconductor contains nitrogen and is a semiconductor, the quality of which is substantially the same as that of the amorphous semiconductor region 108b included in the mixed layer 115b. Further, the layer 129c containing an amorphous semiconductor may include a semiconductor crystal grain having a diameter of 1 nm to 10 nm inclusive, preferably 1 nm to 5 nm inclusive. Here, the layer 129c containing an amorphous semiconductor is a semiconductor layer having lower energy at an Urbach edge and a small amount of the absorption spectrum of defects, measured by a constant photocurrent method (CPM) or photoluminescence spectroscopy, compared to a conventional amorphous semiconductor layer. That is, the layer 129c containing an amorphous semiconductor is a well-ordered semiconductor layer which has fewer defects and whose tail of a level at a band edge in the valence band is steep, compared to the conventional amorphous semiconductor layer. Since the tail of a level at a band edge in the valence band is steep in the layer 129c containing an amorphous semiconductor, the band gap gets wider, and tunneling current does not easily flow. Therefore, by providing the layer 129c containing an amorphous semiconductor on the back channel side, off-current of the thin film transistor can be reduced. In addition, by providing the layer 129c containing an amorphous semiconductor, on-current and field-effect mobility of the thin film transistor can be increased.

Note that an amorphous semiconductor contained in the layer 129c containing an amorphous semiconductor is typically amorphous silicon.

In addition, the mixed layer 115b and the layer 129c containing an amorphous semiconductor may each contain an NH group or an $NH_2$ group as a typical example of nitrogen.

Figure 3:
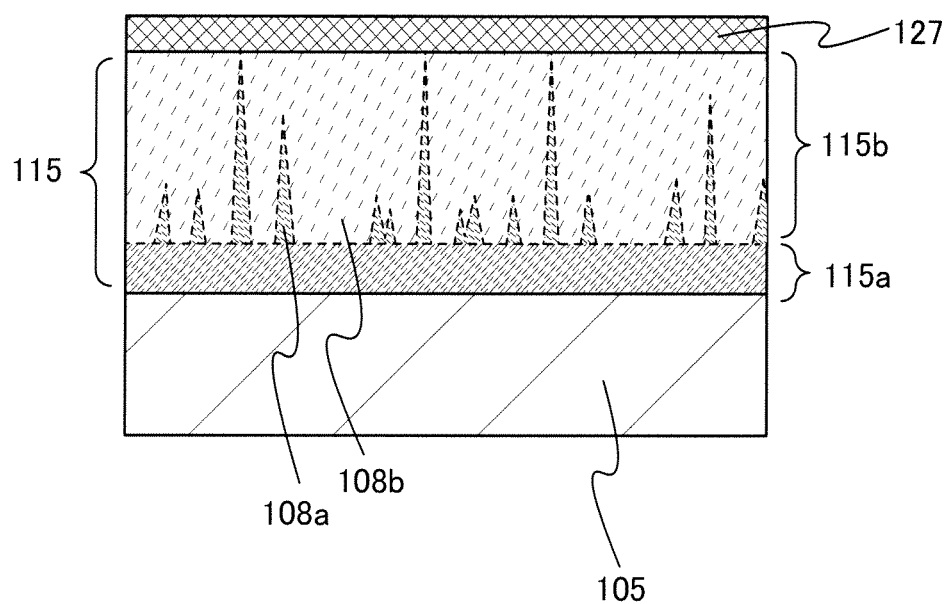
FIG. 3 is a cross-sectional view illustrating a thin film transistor.

As illustrated in FIG. 3, a structure may also be employed in which the mixed layer 115b is provided between the microcrystalline semiconductor layer 115a and the impurity semiconductor layers 127, and the layer 129c containing an amorphous semiconductor is not provided between the mixed layer 115b and the impurity semiconductor layers 127. The mixed layer 115b includes the microcrystalline semiconductor regions 108a and the amorphous semiconductor region 108b which fills a space between the microcrystalline semiconductor regions 108a. Specifically, the mixed layer 115b includes the microcrystalline semiconductor region 108a which extends with a projecting shape from the microcrystalline semiconductor layer 115a and the amorphous semiconductor region 108b. In the structure illustrated in FIG. 3, it is preferable that the proportion of the microcrystalline semiconductor regions 108a in the mixed layer 115b be low. It is further preferable that the proportion of the microcrystalline semiconductor regions 108a in the mixed layer 115b be low in a region between a pair of the impurity semiconductor layers 127, that is, a region where carriers flow. As a result, off-current of the thin film transistor can be reduced. In addition, in the mixed layer 115b, resistance in a vertical direction (a film thickness direction), that is, resistance between the semiconductor layer and the source or drain region can be reduced, and on-current and field-effect mobility of the thin film transistor can be increased.

Note that the mixed layer 115b in FIG. 3 may also include the microcrystalline semiconductor region 108c as illustrated in FIG. 2B.

Figure 4A:
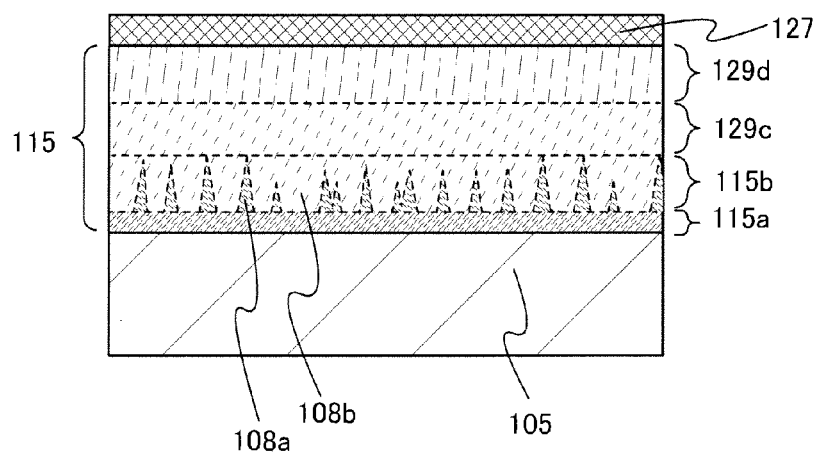
FIGS. 4A and 4B are cross-sectional views each illustrating a thin film transistor.
Figure 4B:
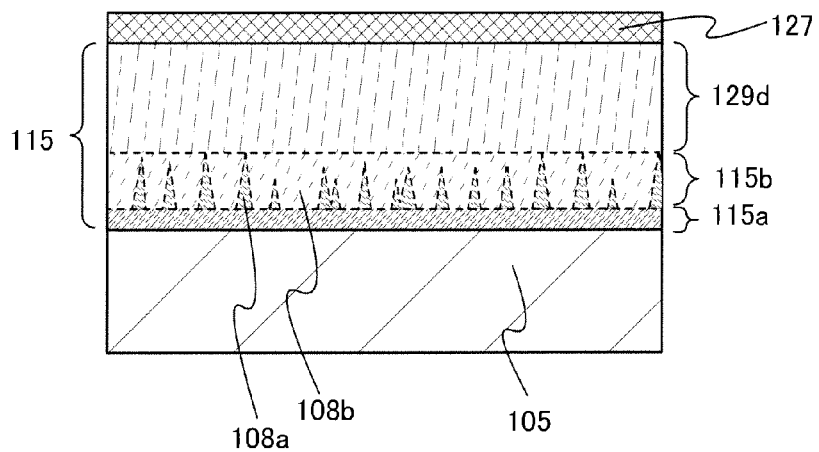

Alternatively, as illustrated in FIG. 4A, a normal amorphous semiconductor layer 129d may be provided between the layer 129c containing an amorphous semiconductor and the impurity semiconductor layers 127. Furthermore, the normal amorphous semiconductor layer 129d may also be provided between the mixed layer 115b and the impurity semiconductor layers 127 as illustrated in FIG. 4B. With such a structure, off-current of the thin film transistor can be reduced.

Note that each of the mixed layers 115b in FIGS. 4A and 4B may also include the microcrystalline semiconductor region 108c as illustrated in FIG. 2B.

Now, concentrations of impurity elements, particularly, concentration profiles of nitrogen and hydrogen, which are measured by SIMS, in the semiconductor layer 115 of the thin film transistor of this embodiment will be described with reference to FIG. 5, FIG. 6, and FIG. 7.

Figure 5:
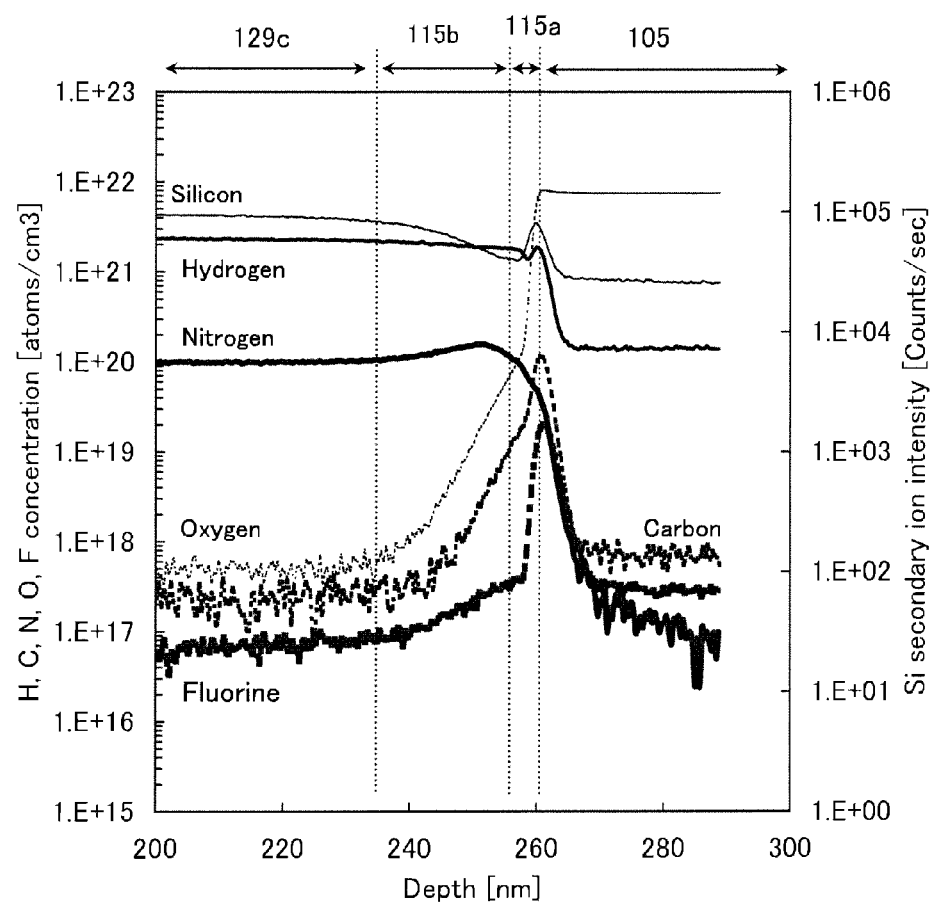
FIG. 5 is a diagram showing a semiconductor layer of a thin film transistor.

FIG. 5 shows the secondary ion intensity of silicon and the concentration profiles of distributions of hydrogen, nitrogen, oxygen, carbon, and fluorine in a depth direction, which are measured by SIMS, of the gate insulating layer 105 and the semiconductor layer 115 formed over the substrate. Specifically, those of the gate insulating layer 105 and the microcrystalline semiconductor layer 115a, the mixed layer 115b, and the layer 129c containing an amorphous semiconductor, which constitute the semiconductor layer 115, illustrated in FIG. 1 are shown.

In this embodiment, SIMS profiling measurement was performed by using a PHI ADEPT-1010 quadrupole SIMS instrument manufactured by ULVAC-PHI, Incorporated, with a 1.0 keV primary Cs$^+$ beam, and irradiation with the 1.0 keV primary Cs$^+$ beam was started from the surface of the layer 129c containing an amorphous semiconductor.

The horizontal axis represents a depth. The layer 129c containing an amorphous semiconductor is formed in a portion from a depth of 200 nm to a depth of 235 nm, the mixed layer 115b is formed in a portion from a depth of 235 nm to a depth of 255 nm, the microcrystalline semiconductor layer 115a is formed in a portion from a depth of 255 nm to a depth of 260 nm, and the gate insulating layer 105 is formed in a portion from a depth of 260 nm to a depth of 300 nm.

The vertical axis on the left side represents the concentrations of hydrogen, nitrogen, oxygen, carbon, and fluorine, and the vertical axis on the right side represents the secondary ion intensity of silicon. Note that the concentrations of hydrogen, nitrogen, oxygen, carbon, and fluorine were measured as for the semiconductor layer 115, and thus, those of the gate insulating layer are not precise. In addition, precise concentrations are not shown as for the interface between the gate insulating layer 105 and the microcrystalline semiconductor layer 115a.

The nitrogen concentration profile has an increase of the concentration from the microcrystalline semiconductor layer 115a to the mixed layer 115b. In the mixed layer 115b, the concentration is continuously increased from the microcrystalline semiconductor layer 115a and then gradually decreased. In other words, the concentration has a peak (the maximum value) in the mixed layer 115b. The nitrogen concentration at this time is $1\times10^{20}$ atoms/cm$^3$ to $1\times10^{21}$ atoms/cm$^3$ inclusive, preferably $2\times10^{20}$ atoms/cm$^3$ to $1\times10^{21}$ atoms/cm$^3$ inclusive.

The nitrogen concentration is constant in the layer 129c containing an amorphous semiconductor. In the nitrogen concentration profile in the microcrystalline semiconductor layer 115a and the gate insulating layer 105, there is a tail from the microcrystalline semiconductor layer 115a to the gate insulating layer 105 due to a knock-on effect, the surface roughness, and an influence of nitrogen remaining in the SIMS measurement apparatus. However, the actual nitrogen concentration in the microcrystalline semiconductor layer 115a and the gate insulating layer 105 is lower than that in FIG. 5.

The hydrogen concentration profile has an increase from the interface between the microcrystalline semiconductor layer 115a and the mixed layer 115b to the mixed layer 115b. The hydrogen concentration is substantially constant in the layer 129c containing an amorphous semiconductor. The peak of the hydrogen concentration profile at the interface between the gate insulating layer 105 and the microcrystalline semiconductor layer 115a is caused by charge up. Therefore, the peak position of the hydrogen concentration profile can be set at the interface between the gate insulating layer 105 and the microcrystalline semiconductor layer 115a. This is also shown by the fact that the above interface has a peak of secondary ion intensity of silicon due to charge-up.

The oxygen concentration profile has a decrease from the microcrystalline semiconductor layer 115a to the mixed layer 115b. The oxygen concentration is substantially constant in the layer 129c containing an amorphous semiconductor.

The fluorine concentration profile has a decrease from the microcrystalline semiconductor layer 115a to the mixed layer 115b. The fluorine concentration is substantially constant in the layer 129c containing an amorphous semiconductor. The peak of the fluorine concentration profile at the interface between the gate insulating layer 105 and the microcrystalline semiconductor layer 115a is caused by fluorine which remains in the chamber and taken into the films while deposition of the microcrystalline semiconductor film 115a.

The semiconductor layer shown in FIG. 5 has a feature that the nitrogen concentration has a peak in the mixed layer 115b and is flat (has a constant value) in the layer 129c containing an amorphous semiconductor, and in addition, the hydrogen concentration is increased in the mixed layer 115b and has a constant value in the layer 129c containing an amorphous semiconductor.

Figure 6:
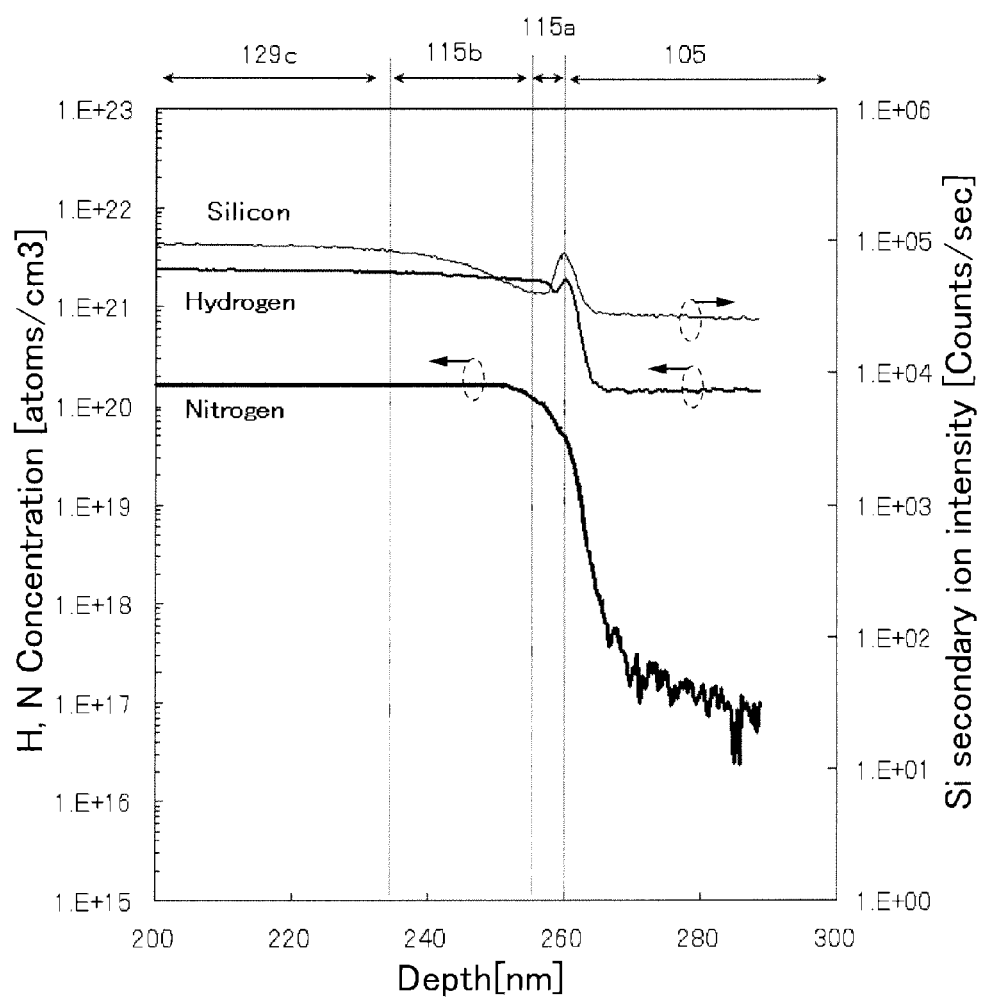
FIG. 6 is a diagram showing a semiconductor layer of a thin film transistor.

Alternatively, as in a model diagram of the nitrogen concentration profile in a depth direction obtained by SIMS in FIG. 6, the nitrogen concentration profile has an increase from the microcrystalline semiconductor layer 115a to the mixed layer 115b. In the mixed layer 115b, the nitrogen concentration profile has a continuous increase from the microcrystalline semiconductor layer 115a and then becomes flat in the mixed layer 115b and the layer 129c containing an amorphous semiconductor in some cases. At this time, the nitrogen concentration profile has a maximum concentration in the mixed layer 115b and the layer 129c containing an amorphous semiconductor. The nitrogen concentration has a maximum value within the range of $1\times10^{20}$ atoms/cm$^3$ to $1×10^{21}$ atoms/cm³ inclusive, preferably $2×10^{20}$ atoms/cm³ to $1×10^{21}$ atoms/cm³ inclusive at this time.

Figure 7:
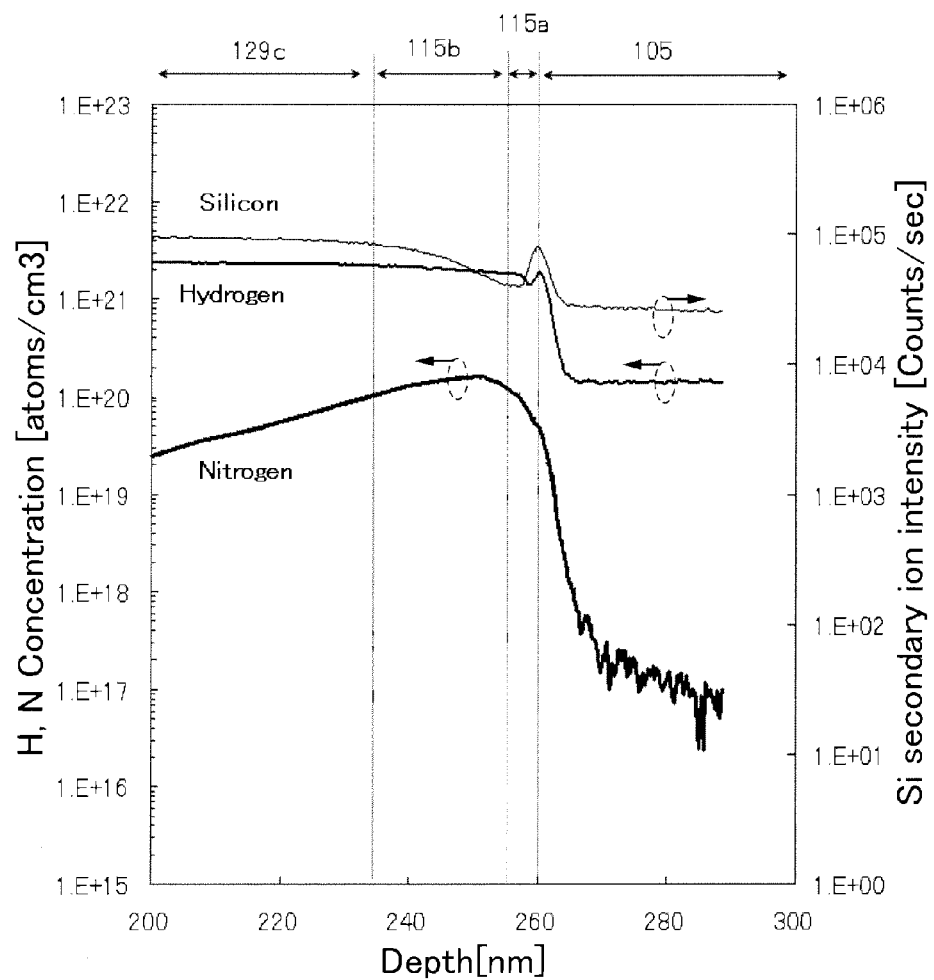
FIG. 7 is a diagram showing a semiconductor layer of a thin film transistor.

Further alternatively, as in a model diagram of the hydrogen and nitrogen concentration profiles in a depth direction obtained by SIMS in FIG. 7, the nitrogen concentration profile has an increase from the microcrystalline semiconductor layer 115a to the mixed layer 115b. The nitrogen concentration profile has, in the mixed layer 115b, a continuous increase from the microcrystalline semiconductor layer 115a and then a decrease, and a continuous decrease also in the layer 129c containing an amorphous semiconductor in some cases. In such a case, the nitrogen concentration profile has a peak concentration (the maximum value) in the mixed layer 115b. The peak concentration of nitrogen falls within the range of $1×10^{20}$ atoms/cm³ to $1×10^{21}$ atoms/cm³ inclusive, preferably $2×10^{20}$ atoms/cm³ to $1×10^{21}$ atoms/cm³ inclusive at this time.

FIG. 5 and FIG. 7 each show a mode in which the maximum value of the nitrogen concentration profile exists not at the interface between the microcrystalline semiconductor layer 115a and the mixed layer 115b but in the mixed layer 115b. However, without limitation to the above, the nitrogen concentration profile may have the maximum value at the interface between the microcrystalline semiconductor layer 115a and the mixed layer 115b.

Note that the nitrogen concentration profile of the microcrystalline semiconductor layer 115a changes in deposition, because of the concentration of nitrogen contained in a base layer or the concentration of nitrogen in a treatment chamber of a deposition apparatus. When the microcrystalline semiconductor layer 115a is formed so as to contain nitrogen as little as possible, the crystallinity of the microcrystalline semiconductor layer 115a can be improved, and field-effect mobility and on-current of the thin film transistor can be increased.

Hereinafter, an influence of nitrogen or oxygen contained in a microcrystalline silicon layer on the crystal growth will be explained.

A crystallization process of Si in the case where an impurity element (an N atom or an O atom) was contained was calculated by classical molecular dynamics simulation. In the classical molecular dynamics simulation, empirical potential characterizing interaction between atoms is defined, whereby force acting on each atom is evaluated. A law of classical mechanics is applied to each atom and Newton's equation of motion is numerically solved, whereby motion (time-dependent change) of each atom can be deterministically tracked.

Figure 8A:
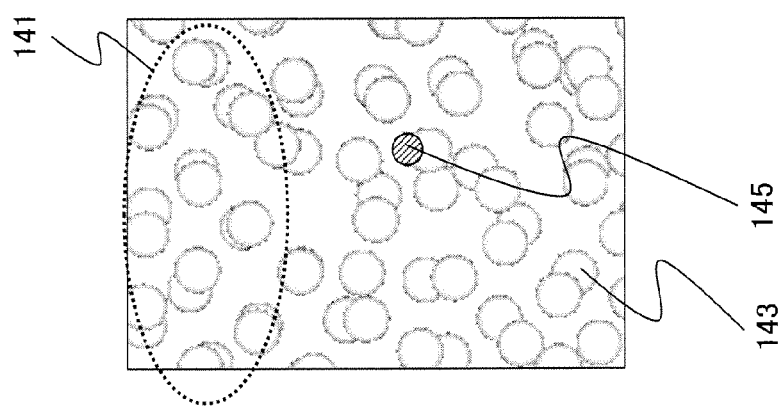
FIGS. 8A to 8C each illustrate a semiconductor layer of a thin film transistor.
Figure 8B:
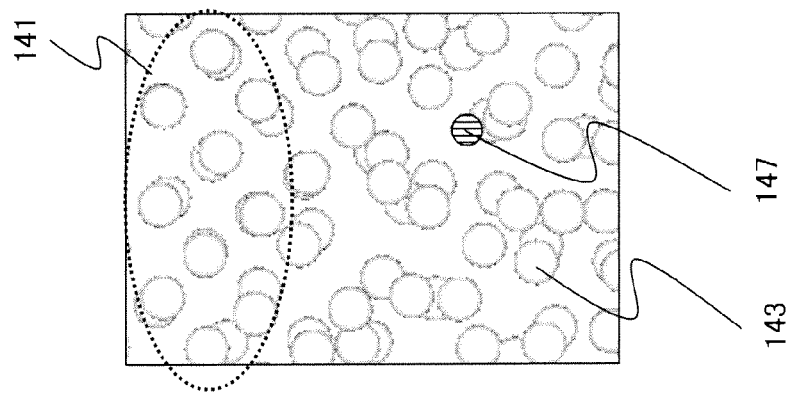
Figure 8C:
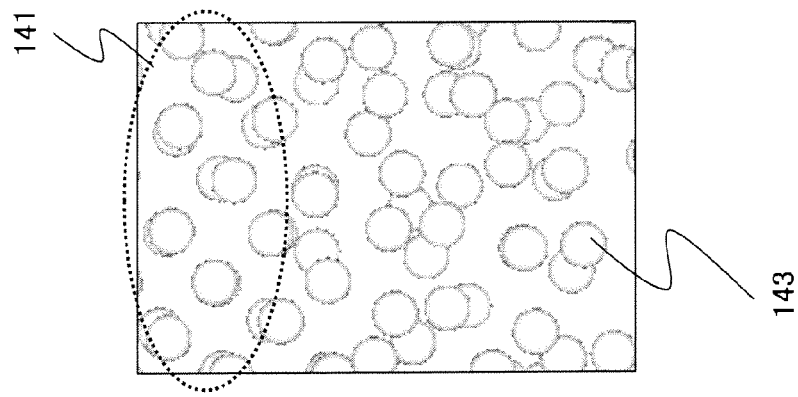

Here, in order to investigate the crystal growth of Si after a crystal nucleus of Si is generated in an a-Si layer, calculation models were made as for the case where the a-Si layer does not contain any impurity element and the case where the a-Si layer contains an impurity element (an N atom and an O atom) as illustrated in FIGS. 8A to 8C.

FIG. 8A illustrates a model in which crystal nuclei 141 are generated in the a-Si layer which does not contain an impurity element and single crystal silicon with a plane orientation (100) grows from the crystal nuclei 141.

FIG. 8B illustrates a model in which the crystal nuclei 141 are generated in the a-Si layer which contains O atoms 147 at 0.5 at. %, that is, at a proportion of about $2.5×10^{20}$ atoms/cm³ as an impurity element and single crystal silicon with a plane orientation (100) grows from the crystal nuclei 141.

FIG. 8C illustrates a model in which the crystal nuclei 141 are generated in the a-Si layer which contains N atoms 145 at 0.5 at. %, that is, at a proportion of about $2.5×10^{20}$ atoms/cm³ as an impurity element and single crystal silicon with a plane orientation (100) grows from the crystal nuclei 141.

Classical molecular dynamics simulation was performed at 1025° C. on the above three calculation models illustrated in FIGS. 8A to 8C.

FIGS. 9A to 9C illustrate that the structure in FIG. 8A is changed by the simulation. Specifically, FIG. 9A illustrates the model after 0 seconds, FIG. 9B illustrates the model after 0.5 nanoseconds at 1025° C., and FIG. 9C illustrates the model after 1 nanosecond at 1025° C.

FIGS. 10A to 10C illustrate that the structure in FIG. 8B is changed by the simulation. Specifically, FIG. 10A illustrates the model after 0 seconds, FIG. 10B illustrates the model after 0.5 nanoseconds at 1025° C., and FIG. 10C illustrates the model after 1 nanosecond at 1025° C.

Figure 11A:
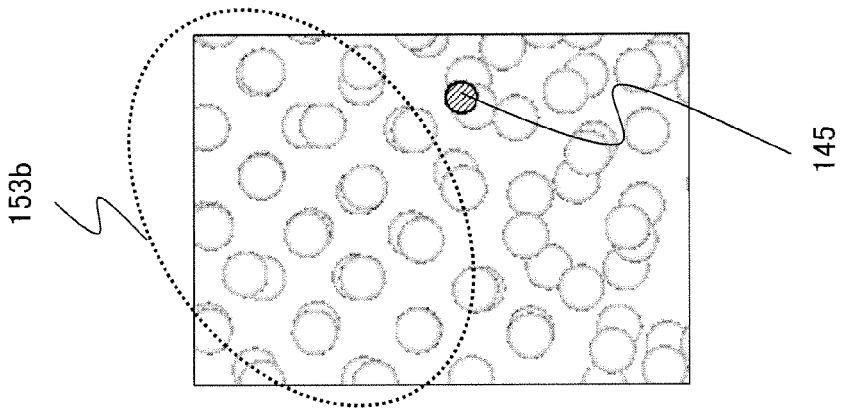
FIGS. 11A to 11C each illustrate a semiconductor layer of a thin film transistor.
Figure 11B:
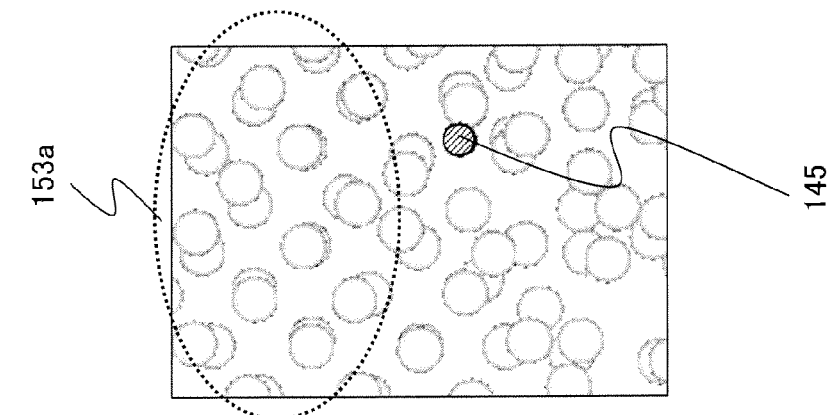
Figure 11C:
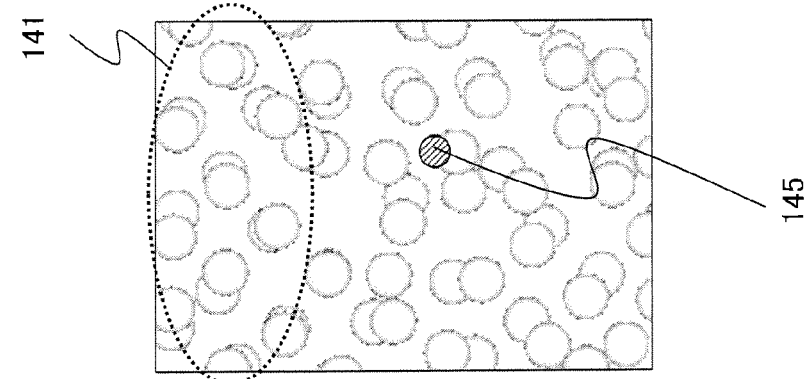

FIGS. 11A to 11C illustrate that the structure in FIG. 8C is changed by the simulation. Specifically, FIG. 11A illustrates the model after 0 seconds, FIG. 11B illustrates the model after 1 nanosecond at 1025° C., and FIG. 11C illustrates the model after 2 nanoseconds at 1025° C.

Table 1 shows a crystal growth rate of Si in each calculation model.

TABLE 1

| Impurity element | Crystal Growth Rate (nm/nano sec.) |
| --- | --- |
| 1. Non | 1.1 |
| 2. N atom | 0.21 |
| 3. O atom | 0.80 |

A growth region of the crystal nuclei 141 illustrated in FIG. 9A is enlarged to a growth region 151a of single crystal silicon in FIG. 9B and to a growth region 151b of single crystal silicon in FIG. 9C. Thus, it is found that Si 143 grows to be crystal in the case where the a-Si layer does not contain an impurity element.

In the case where the a-Si layer contains the O atom 147, a growth region of the crystal nuclei 141 illustrated in FIG. 10A is enlarged to a growth region 155a of single crystal silicon in FIG. 10B and to a growth region 155b of single crystal silicon in FIG. 10C. However, the crystal growth region is small and the crystal growth rate is low, compared to the case where the a-Si layer does not contain an impurity element which is illustrated in FIGS. 9A to 9C. As illustrated in FIG. 10C, it is found that the O atom 147 is incorporated in the growth region 155b of single crystal silicon and the crystallinity of the entire film is comparatively good.

However, when the a-Si layer contains the N atom, although a growth region of the crystal nuclei 141 in FIG. 11A is enlarged to a growth region 153a of single crystal silicon in FIG. 11B and to a growth region 153b of single crystal silicon in FIG. 11C, the crystal growth region is still small when a period of time at 1025° C. is doubled, compared to the case where the a-Si layer does not contain an impurity element which is illustrated in FIGS. 9A to 9C or the case where the a-Si layer contains the O atom 147 which is illustrated in FIGS. 10A to 10C. Therefore, it is found that the crystal growth rate is low in the case where the a-Si layer contains the N atom. In addition, as illustrated in FIGS. 11B and 11C, the N atom 145 is not incorporated in the growth region 153a or 153b of single crystal silicon and exists at the interface of the microcrystalline semiconductor regions or the interface between the microcrystal semiconductor region and the amorphous semiconductor region.

Next, Table 2 shows a bond distance between Si atoms (Si—Si), a bond distance between a Si atom and an N atom (Si—N), and a bond distance between a Si atom and an O atom (Si—O) in single crystal silicon, SiN, and $SiO_2$.

TABLE 2

| | Bond Distance (nm) |
|---|---|
| 1. Si—Si | 0.235 |
| 2. Si—N | 0.175 |
| 3. Si—O | 0.145 |

Figure 28A:
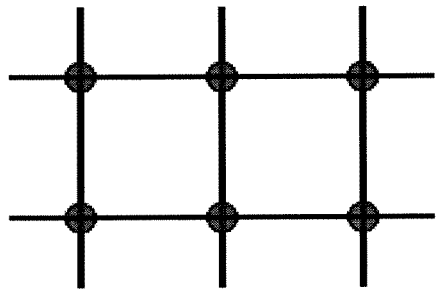
FIGS. 28A to 28D each illustrate a semiconductor layer of a thin film transistor.
Figure 28B:
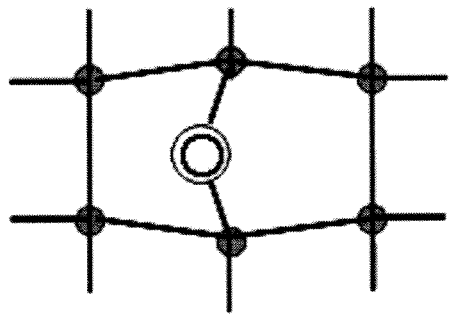
Figure 28C:
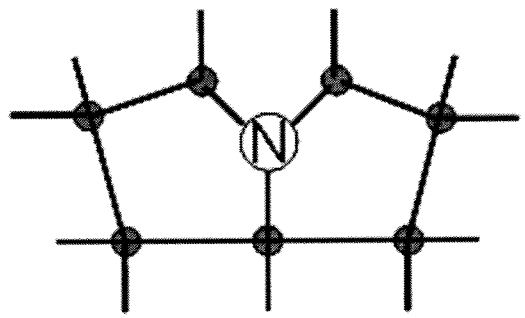

FIGS. 28A to 28C are schematic diagrams each illustrating a local structure of the calculation model in a two-dimensional manner. FIG. 28A is a schematic diagram of single crystal silicon illustrated in FIG. 9C, FIG. 28B is a schematic diagram of a region in which the silicon layer contains the O atom illustrated in FIG. 10C, and FIG. 28C is a schematic diagram of a region in which the silicon layer contains the N atom illustrated in FIG. 11C.

Figure 28D:
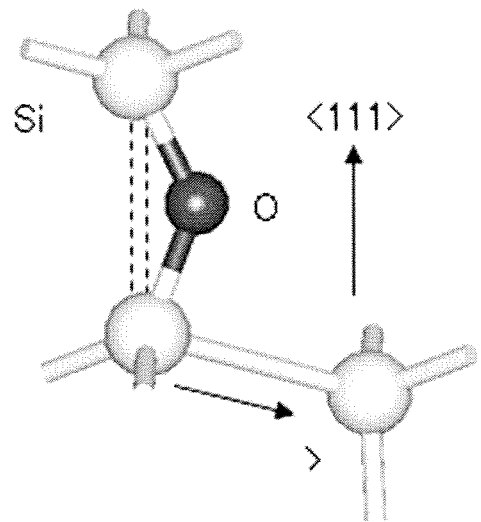

In single crystal silicon, both the N atom and the O atom are interstitial impurities. The coordination number of the O atom is 2, and the Si—O bond distance is shorter than the Si—N bond distance; thus, the O atom tends to be placed between the bonded Si atoms, and distortion is relatively small even when the bond of Si—O—Si results therefrom. On the other hand, the coordination number of the N atom is 3 and the Si—N bond distance is longer than the Si—O bond distance, so that distortion is likely to be caused in the Si layer. Therefore, it is probable that the N atom suppresses crystallization of silicon to a larger degree, than the O atom. FIG. 28D is a diagram in which the O atom that is an impurity is bonded between the bonded Si atoms in single crystal silicon of a <111> structure. The impurity O atom exists at an interstitial site of single crystal silicon, and is placed between the bonded Si atoms with a <111> structure.

Accordingly, it is believed that the N atom degrades crystallinity of silicon to a larger degree than the O atom which is also an interstitial impurity, because of the coordination number and distortion caused by the bond distance between the N atom and the Si atom.

According to the above, when the crystal grows in the mixed layer, nitrogen is not incorporated into the crystal growth region and segregated at the interface between different microcrystalline semiconductor regions, and nitrogen inhibits the crystal growth. Therefore, in the mixed layer, crystal growth is inhibited. Further, nitrogen which is not incorporated into the microcrystalline semiconductor region during the crystal growth is segregated at the interface between different microcrystalline semiconductor regions and the interface between the microcrystalline semiconductor region and the amorphous semiconductor region. Consequently, the nitrogen concentration is increased at the interface between different microcrystalline semiconductor regions and the interface between the microcrystalline semiconductor region and the amorphous semiconductor region. Accordingly, the nitrogen concentration is high in the mixed layer.

In addition, as nitrogen inhibits the crystal growth and the amorphous semiconductor region is increased, the hydrogen concentration profile has a gradual increase. Since a proportion of bonded silicon atoms is high in the microcrystalline semiconductor region, the hydrogen concentration is low in that region. On the other hand, a proportion of bonded silicon atoms is low in the amorphous semiconductor region, and there are more dangling bonds of silicon than in the microcrystalline semiconductor region. The hydrogen concentration can be high provided that hydrogen is bonded to the dangling bonds. Accordingly, a gradual increase in the hydrogen concentration profile measured by SIMS indicates that the crystallinity is degraded, and the constant hydrogen concentration indicates that the amorphous semiconductor region is formed. Moreover, it is found that the microcrystalline semiconductor region has a conical or pyramidal shape.

Since the mixed layer 115b includes the conical or pyramidal microcrystalline semiconductor region 108a, resistance in a vertical direction (film thickness direction) of when voltage is applied to the source or drain electrode, that is, resistance of the microcrystalline semiconductor layer 115a, the mixed layer 115b, and the layer 129c containing an amorphous semiconductor can be reduced.

The mixed layer 115b preferably contains nitrogen. This is because when nitrogen, typically an NH group or an NH$_2$ group, is bonded to a dangling bond of the silicon atom at the interface between different microcrystalline semiconductor regions in the microcrystalline semiconductor region 108a, or at the interface between the microcrystalline semiconductor region 108a and the amorphous semiconductor region 108b, defects are reduced. Accordingly, when the nitrogen concentration of the mixed layer 115b is set to $1\times10^{20}$ atoms/cm$^3$ to $1\times10^{21}$ atoms/cm$^3$ inclusive, preferably $2\times10^{20}$ atoms/cm$^3$ to $1\times10^{21}$ atoms/cm$^3$ inclusive, the dangling bonds of the silicon atoms can be easily cross-linked with nitrogen, preferably an NH group, so that carriers can easily flow. Alternatively, the dangling bond of the semiconductor atom at the aforementioned interfaces may be terminated with the NH$_2$ group, so that the defect level will disappear. As a result, resistance in a vertical direction (a film thickness direction) of when the thin film transistor is on and voltage is applied between the source electrode and the drain electrode is reduced. That is, field-effect mobility and on-current of the thin film transistor are increased.

Further, by reducing the oxygen concentration to be lower than the nitrogen concentration in the mixed layer 115b, bonds which interrupt carrier transfer at the interface between the microcrystalline semiconductor region 108a and the amorphous semiconductor region 108b and in defects at the interface between semiconductor crystal grains can be reduced.

In this manner, off-current of the thin film transistor can be reduced when a channel formation region is formed using the microcrystalline semiconductor layer 115a, and the layer 129c containing an amorphous semiconductor which is a well-ordered semiconductor layer with fewer defects and whose tail of a level at a band edge in the valence band is steep, is provided between the channel formation region and the impurity semiconductor layers 127 serving as source and drain regions. In addition, by providing such a layer 129c containing an amorphous semiconductor, on-current and field-effect mobility of the thin film transistor can be increased. Further, by providing the mixed layer 115b including the conical or pyramidal microcrystalline semiconductor region 108a and such a layer 129c containing an amorphous semiconductor, on-current and field-effect mobility of the thin film transistor can be further increased.

The pair of the impurity semiconductor layers 127 illustrated in FIG. 1 are formed using amorphous silicon to which phosphorus is added, microcrystalline silicon to which phosphorus is added, or the like. Note that, in the case where a p-channel thin film transistor is formed as the thin film transistor, the impurity semiconductor layers 127 are formed using microcrystalline silicon to which boron is added, amorphous silicon to which boron is added, or the like. Note that, in the case where the mixed layer 115b or the layer 129c containing an amorphous semiconductor has an ohmic contact with the wirings 125, the impurity semiconductor layers 127 are not necessarily formed.

The wirings 125 illustrated in FIG. 1 can be formed as a single layer or a stacked layer using any of aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode layer 103) may also be used. The wirings 125 may also have a stack structure in which a layer which is in contact with the impurity semiconductor layers 127 is formed using titanium, tantalum, molybdenum, or tungsten, or nitride of any of these elements and aluminum or an aluminum alloy is formed thereover. Furthermore, a stacked layer structure may also be employed in which upper and lower surfaces of aluminum or an aluminum alloy may each be covered with titanium, tantalum, molybdenum, tungsten, or nitride of any of these elements.

In the thin film transistor illustrated in FIG. 1, FIGS. 2A and 2B, FIG. 3, FIGS. 4A and 4B, FIG. 5, FIG. 6, and FIG. 7, off-current can be reduced, and on-current and field-effect mobility can be increased. In addition, since the channel formation region is formed using the microcrystalline semiconductor layer, the thin film transistor less deteriorates and has high reliability in electric characteristics. Further, since on-current is large, the area of the channel formation region, that is, the area of the thin film transistor can be reduced, compared to a thin film transistor in which amorphous silicon is used for a channel formation region; therefore, such thin film transistors can be highly integrated.

Embodiment 2

In this embodiment, a method for manufacturing the thin film transistor described in Embodiment 1 will be described with reference to FIGS. 12A to 12C, FIGS. 13A to 13C, and FIGS. 14A-1 to 14B-2.

It is preferable that all thin film transistors formed over the same substrate have the same conductivity type because the number of manufacturing steps can be reduced. Therefore, in this embodiment, a method for manufacturing an n-channel thin film transistor is described.

First, a manufacturing process of the thin film transistor illustrated in FIG. 1 is described below.

Figure 12A:
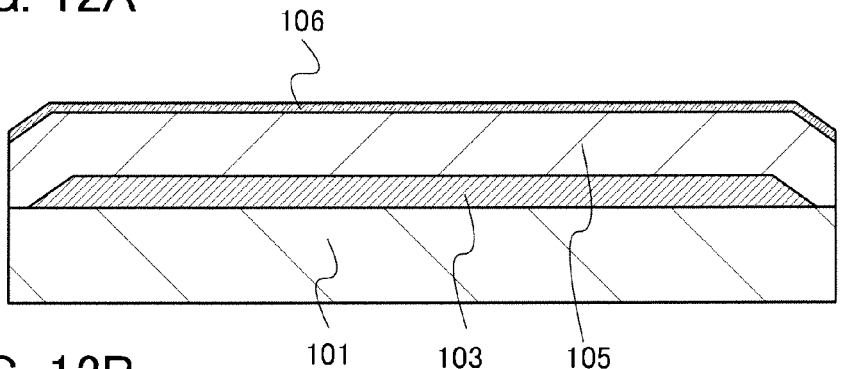
FIGS. 12A to 12C are cross-sectional views illustrating a method for manufacturing a thin film transistor.

As illustrated in FIG. 12A, a gate electrode 103 is formed over a substrate 101. Then, a gate insulating layer 105 is formed so as to cover the gate electrode 103. After that, a first semiconductor layer 106 is formed.

The gate electrode 103 can be formed in such a manner that a conductive layer is formed over the substrate 101 using the material given in Embodiment 1 by a sputtering method or a vacuum evaporation method, a mask is formed over the conductive layer by a photolithography method, an ink-jet method, or the like, and the conductive layer is etched using the mask. Further, the gate electrode 103 can also be formed by discharging a conductive nanopaste of silver, gold, copper, or the like over the substrate by an ink-jet method and baking the conductive nanopaste. Here, a conductive layer is formed over the substrate 101 and then etched using a resist mask which is formed through a first photolithography process, thereby forming the gate electrode 103.

Note that, in the photolithography process, a resist may be applied to the entire surface of the substrate. Alternatively, a resist may be printed by a printing method on a region where a resist mask is to be formed, and then, the resist may be exposed to light, whereby a resist can be saved and cost can be reduced. Further alternatively, instead of exposing a resist to light by using a light-exposure machine, a laser beam direct drawing apparatus may be used to expose a resist to light.

In addition, when side surfaces of the gate electrode 103 have a tapered shape, disconnection of the semiconductor layer and a wiring layer formed over the gate electrode 103 at a step portion can be reduced. In order to form the side surfaces of the gate electrode 103 into a tapered shape, etching may be performed while the resist mask is reduced in its size.

Through the step of forming the gate electrode 103, a gate wiring (a scan line) and a capacitor wiring can also be formed at the same time. Note that a "scan line" means a wiring which selects a pixel, while a "capacitor wiring" means a wiring which is connected to one of electrodes of a capacitor in a pixel. However, without limitation thereto, the gate electrode 103 and one or both of the gate wiring and the capacitor wiring may be formed in separate steps.

The gate insulating layer 105 can be formed by a CVD method, a sputtering method, or the like using the material given in Embodiment 1. In a process of forming the gate insulating layer 105 by a CVD method, glow discharge plasma is generated by applying high-frequency power with a frequency of 3 MHz to 30 MHz, typically 13.56 MHz or 27.12 MHz, or high-frequency power in the VHF band with a frequency of 30 MHz to about 300 MHz, typically 60 MHz. Further, the gate insulating layer 105 may be formed using a microwave plasma CVD apparatus with a high frequency (greater than or equal to 1 GHz). When the gate insulating layer 105 is formed by a microwave plasma CVD apparatus, the withstand voltage between the gate electrode and drain and source electrodes can be increased; therefore, a highly-reliable thin film transistor can be obtained.

Further, by forming a silicon oxide layer by a CVD method using an organosilane gas as the gate insulating layer 105, the crystallinity of the first semiconductor layer which is formed later can be improved, so that on-current and field-effect mobility of the thin film transistor can be increased. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The first semiconductor layer 106 is formed using a microcrystalline semiconductor layer typified by a microcrystalline silicon layer, a microcrystalline silicon-germanium layer, a microcrystalline germanium layer, or the like. The first semiconductor layer 106 is formed thinly to a thickness of 3 nm to 10 nm, preferably 3 nm to 5 nm. Therefore, in a second semiconductor layer which is formed later, the length of each of a plurality of microcrystalline semiconductor regions which are formed with conical or pyramidal projections (projecting portions) can be controlled, and on-current and off-current of the thin film transistor can be controlled.

The first semiconductor layer 106 is formed by glow discharge plasma using a mixture of a deposition gas containing silicon or germanium and hydrogen in a reaction chamber of a plasma CVD apparatus. Alternatively, the first semiconductor layer 106 is formed by glow discharge plasma using a mixture of a deposition gas containing silicon or germanium, hydrogen, and a rare gas such as helium, neon, argon, krypton or xenon. Microcrystalline silicon, microcrystalline silicon-germanium, microcrystalline germanium, or the like is formed using a mixture which is obtained by diluting the deposition gas containing silicon or germanium with hydrogen whose flow rate is 10 to 2000 times, preferably 10 to 200 times that of the deposition gas.

As typical examples of the deposition gas containing silicon or germanium, $SiH_4$, $Si_2H_6$, $GeH_4$, and $Ge_2H_6$ are given.

By using a rare gas such as helium, argon, neon, krypton, or xenon as a source gas for the first semiconductor layer 106, the deposition rate of the first semiconductor layer 106 can be increased. When the deposition rate is increased, the amount of impurities mixed into the first semiconductor layer 106 can be reduced, whereby the crystallinity of the first semiconductor layer 106 can be improved. Accordingly, on-current and field-effect mobility of the thin film transistor are increased and productivity of the thin film transistor can also be increased.

When the first semiconductor layer 106 is formed, glow discharge plasma is generated by applying high-frequency power with a frequency of 3 MHz to 30 MHz, typically, 13.56 MHz, high-frequency power in the HF band with a frequency of 27.12 MHz, or high-frequency power in the VHF band with a frequency of 30 MHz to about 300 MHz, typically 60 MHz. Alternatively, glow discharge plasma is generated by applying high-frequency power with a microwave frequency of greater than or equal to 1 GHz. With the use of high-frequency power in the VHF band or with a microwave frequency, the deposition rate can be increased. In addition, by superimposing high-frequency power in the HF band with high-frequency power in the VHF band, unevenness of plasma when using a large-sized substrate is reduced, the uniformity can be increased, and the deposition rate can be increased.

Note that before the first semiconductor layer 106 is formed, impurity elements in the treatment chamber of the CVD apparatus are removed by introducing a deposition gas containing silicon or germanium while exhausting the air in the treatment chamber, so that the amount of the impurity elements in the gate insulating layer 105 and the first semiconductor layer 106 of the thin film transistor, which are formed later, can be reduced, and thus, electric characteristics of the thin film transistor can be improved.

Figure 12B:
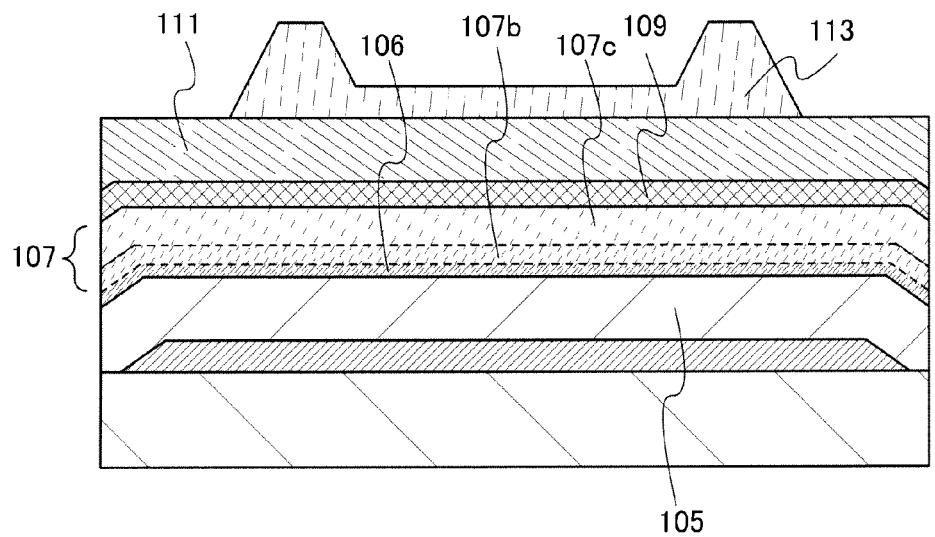

Next, as illustrated in FIG. 12B, a second semiconductor layer 107 is deposited over the first semiconductor layer 106, whereby a mixed layer 107b and a layer 107c containing an amorphous semiconductor are formed. Then, an impurity semiconductor layer 109 and a conductive layer 111 are formed over the second semiconductor layer 107. After that, a second resist mask 113 is formed over the conductive layer 111.

The mixed layer 107b and the layer 107c containing an amorphous semiconductor are formed by using the first semiconductor layer 106 (microcrystalline semiconductor layer) as a seed crystal under a condition that a crystal grows partly.

The second semiconductor layer 107 is formed by glow discharge plasma using a mixture of a deposition gas containing silicon or germanium, hydrogen, and a gas containing nitrogen in the treatment chamber of the plasma CVD apparatus. Examples of the gas containing nitrogen include ammonia, nitrogen, nitrogen fluoride, nitrogen chloride, chloroamine, fluoroamine, and the like.

In this case, a flow ratio of the deposition gas containing silicon or germanium to hydrogen is the same as that for forming a microcrystalline semiconductor layer as in the case of forming the first semiconductor layer 106, and a gas containing nitrogen is used for the source gas, whereby crystal growth can be further suppressed compared to the deposition condition of the first semiconductor layer 106. As a result, the mixed layer 107b and the layer 107c containing an amorphous semiconductor, which is formed with a well-ordered semiconductor layer having fewer defects and a steep tail slope in a level at a band edge in the valence band, can be formed in the second semiconductor layer 107.

Here, a typical example of a condition for forming the second semiconductor layer 107 is as follows. The flow rate of hydrogen is 10 to 2000 times, preferably, 10 to 200 times that of the deposition gas containing silicon or germanium. Note that in a typical example of a condition for forming a normal amorphous semiconductor layer, the flow rate of hydrogen is 0 to 5 times that of the deposition gas containing silicon or germanium.

A rare gas such as helium, neon, argon, krypton, or xenon is introduced into the source gas of the second semiconductor layer 107, whereby the deposition rate of the second semiconductor layer 107 can be increased.

Note that when a rare gas such as helium, neon, argon, krypton, or xenon is introduced to the source gas of the second semiconductor layer 107, the crystallinity of the second semiconductor layer 107 is increased and off-current of the thin film transistor is increased; therefore, it is preferable to control a mixing ratio of the deposition gas containing silicon or germanium, hydrogen, and a gas containing nitrogen. Typically, the flow rate of the deposition gas containing silicon or germanium is increased with respect to that of hydrogen, which increases amorphousness, whereby the crystallinity and amorphousness of the mixed layer 107b and the layer 107c containing an amorphous semiconductor can be controlled.

At an early stage of deposition of the second semiconductor layer 107, since a gas containing nitrogen is included in the source gas, the crystal growth is partly suppressed; therefore, while a conical or pyramidal microcrystalline semiconductor region grows, an amorphous semiconductor region is formed. Further, crystal growth of the conical or pyramidal microcrystalline semiconductor region is stopped and a layer containing an amorphous semiconductor is formed. Before the conical or pyramidal microcrystalline semiconductor region grows, a microcrystalline semiconductor layer is deposited over the entire surface of the first semiconductor layer 106 using the first semiconductor layer 106 as a seed crystal in some cases.

Accordingly, the microcrystalline semiconductor layer 115a in FIG. 1 corresponds to the first semiconductor layer 106 in FIG. 12A.

In addition, the mixed layer 115b in FIG. 1 corresponds to the mixed layer 107b in the second semiconductor layer 107 in FIG. 12B.

Further, the layer 129c containing an amorphous semiconductor in FIG. 1 corresponds to the layer 107c containing an amorphous semiconductor in the second semiconductor layer 107 in FIG. 12B.

The impurity semiconductor layer 109 is formed by glow discharge plasma using a mixture of a deposition gas containing silicon or germanium, hydrogen, and phosphine (diluted with hydrogen or silane) in the reaction chamber of the plasma CVD apparatus. Amorphous silicon to which phosphorus is added or microcrystalline silicon to which phosphorus is added is formed by diluting the deposition gas containing silicon or germanium with hydrogen. In the case of manufacturing a p-channel thin film transistor, the impurity semiconductor layer 109 may be formed by glow discharge plasma using diborane instead of phosphine.

The conductive layer 111 can be formed using a material similar to that of the wirings 125 illustrated in FIG. 1 appropriately. The conductive layer 111 is formed by a CVD method, a sputtering method, or a vacuum evaporation method. Alternatively, the conductive layer 111 may be formed by discharging a conductive nanopaste of silver, gold, copper, or the like by a screen printing method, an ink-jet method, or the like and baking the conductive nanopaste.

The resist mask 113 is formed by a second photolithography process. The resist mask 113 has regions with different thicknesses. Such a resist mask can be formed using a multi-tone mask. The multi-tone mask is preferably used because the number of photomasks used and the number of manufacturing steps are reduced. In this embodiment, the multi-tone mask can be used in a process of forming patterns of the first semiconductor layer 106 and the second semiconductor layer 107 and a process of forming a source region and a drain region.

A multi-tone mask is a mask capable of light exposure with multi-level light quantity; typically, light exposure is performed with three levels of light quantity to provide an exposed region, a half-exposed region, and an unexposed region. By one light exposure and development step with the use of a multi-tone mask, a resist mask with plural thicknesses (typically, two kinds of thicknesses) can be formed. Therefore, by the use of a multi-tone mask, the number of photomasks can be reduced.

Figures 1, 14A:
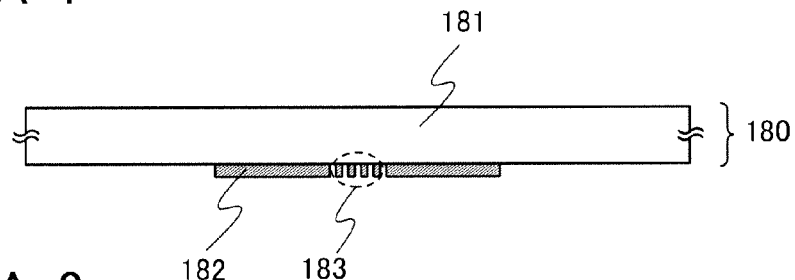
Figures 2, 14A:
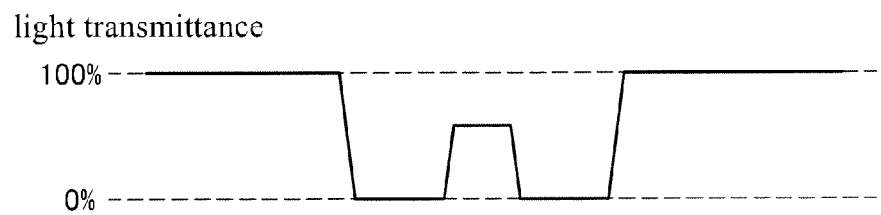
Figures 1, 14B:
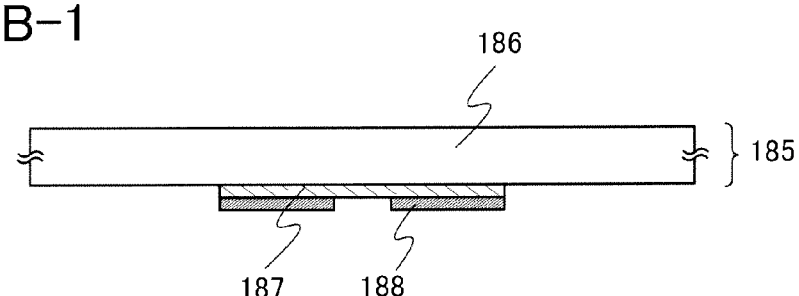
Figures 2, 14B:
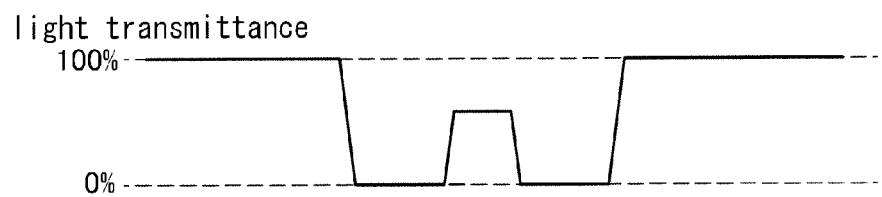

FIGS. 14A-1 and 14B-1 are cross-sectional views of typical multi-tone masks. FIG. 14A-1 illustrates a gray-tone mask 180 and FIG. 14B-1 illustrates a half-tone mask 185.

The gray-tone mask 180 illustrated in FIG. 14A-1 includes a light-blocking portion 182 formed using a light-blocking layer on a light-transmitting substrate 181, and a diffraction grating portion 183 provided with a pattern of the light-blocking layer.

The diffraction grating portion 183 has slits, dots, meshes, or the like that are provided at intervals which are less than or equal to the resolution limit of light used for the light exposure, whereby the light transmittance is controlled. Note that the slits, dots, or meshes provided at the diffraction grating portion 183 may be provided regularly or irregularly.

As the light-transmitting substrate 181, quartz or the like can be used. The light-blocking layer for forming the light-blocking portion 182 and the diffraction grating portion 183 may be formed using chromium, chromium oxide, or the like.

In the case where the gray-tone mask 180 is irradiated with light for light exposure, as illustrated in FIG. 14A-2, the light transmittance in the region overlapping with the light-blocking portion 182 is 0%, and the light transmittance in the region where none of the light-blocking portion 182 and the diffraction grating portion 183 are provided is 100%. Further, the light transmittance at the diffraction grating portion 183 is approximately in the range of 10% to 70%, which can be adjusted by the interval of slits, dots, or meshes of the diffraction grating, or the like.

The half-tone mask 185 illustrated in FIG. 14B-1 includes a semi-light-transmitting portion 187 which is formed on a light-transmitting substrate 186, using a semi-light-transmitting layer, and a light-blocking portion 188 formed using a light-blocking layer.

The semi-light-transmitting portion 187 can be formed by using a layer of MoSiN, MoSi, MoSiO, MoSiON, CrSi, or the like. The light-blocking portion 188 may be formed using a material similar to that for the light-blocking layer of the gray-tone mask, and chromium, chromium oxide, or the like is preferably used.

In the case where the half-tone mask 185 is irradiated with light for light exposure, as illustrated in FIG. 14B-2, the light transmittance in the region overlapping with the light-blocking portion 188 is 0%, and the light transmittance in the region where none of the light-blocking portion 188 and the semi-light-transmitting portion 187 are provided is 100%. Further, the light transmittance in the semi-light-transmitting portion 187 is approximately in the range of 10% to 70%, which can be adjusted by the kind, the thickness, or the like of the material to be used.

By light exposure using the multi-tone mask and development, a resist mask which includes regions having different thicknesses can be formed.

Figure 12C:
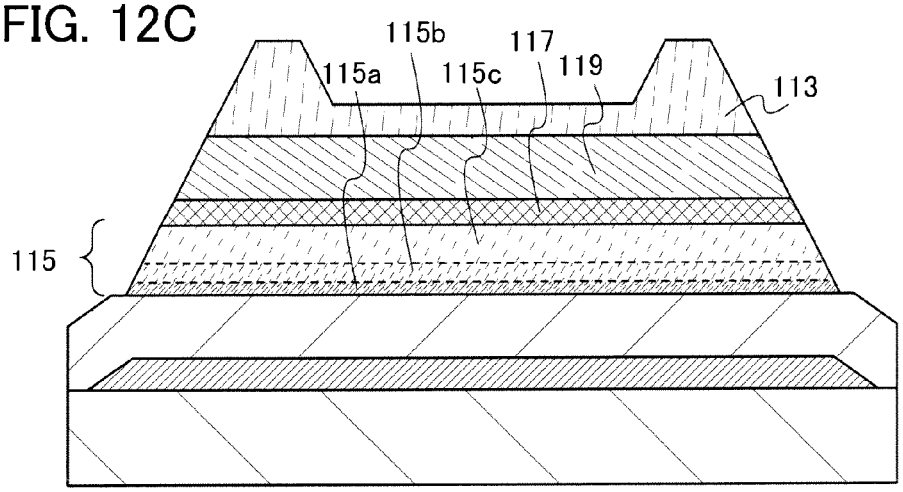

Next, with the use of the resist mask 113, the first semiconductor layer 106, the second semiconductor layer 107, the impurity semiconductor layer 109, and the conductive layer 111 are etched. Through this process, the first semiconductor layer 106, the second semiconductor layer 107, the impurity semiconductor layer 109, and the conductive layer 111 are divided for each element, to form a third semiconductor layer 115, an impurity semiconductor layer 117, and a conductive layer 119. Note that the third semiconductor layer 115 includes a microcrystalline semiconductor layer 115a, a mixed layer 115b, and a layer 115c containing an amorphous semiconductor (FIG. 12C).

Figure 13A:
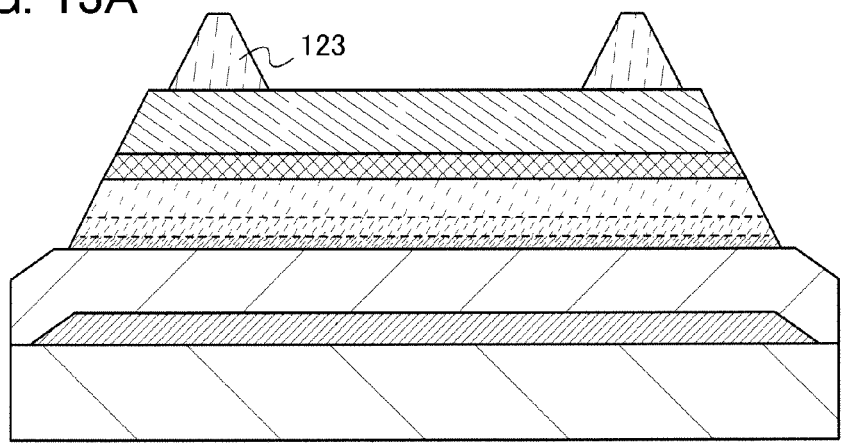
FIGS. 13A to 13C are cross-sectional views illustrating a method for manufacturing a thin film transistor.

Next, the resist mask 113 is reduced in its size to form a separated resist mask 123. Ashing using oxygen plasma may be performed in order that the resist mask is reduced in its size. Here, ashing is performed on the resist mask 113 so that the resist mask 113 is separated over the gate electrode. Accordingly, the resist mask 123 can be formed (FIG. 13A).

Figure 13B:
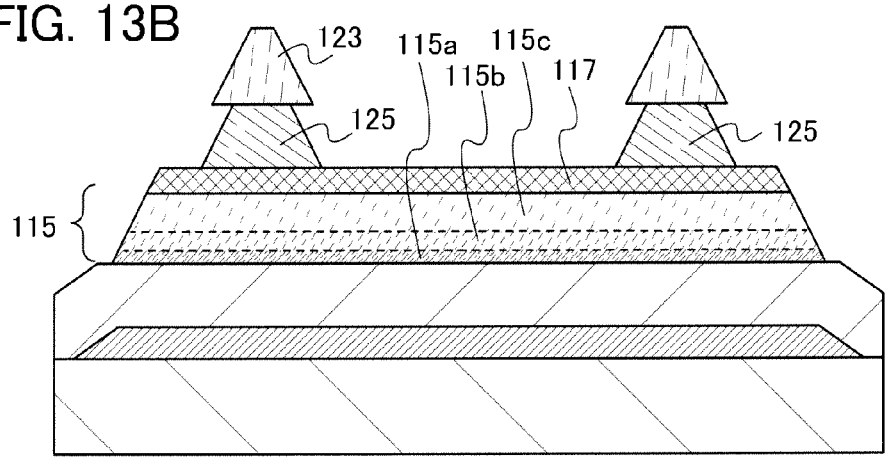

Next, the conductive layer 119 is etched using the resist mask 123, whereby wirings 125 serving as source and drain electrodes are formed (FIG. 13B). It is preferable that this etching of the conductive layer 119 be performed by wet etching. By wet etching, the conductive layer is etched isotropically. As a result, the side surface of the conductive layer is located on an inner side than that of the resist mask 123, and thus, the wirings 125 are formed. The wirings 125 serve not only as source and drain electrodes but also as signal lines. However, without limitation thereto, a signal line may be provided separately from the source and drain electrodes.

Figure 13C:
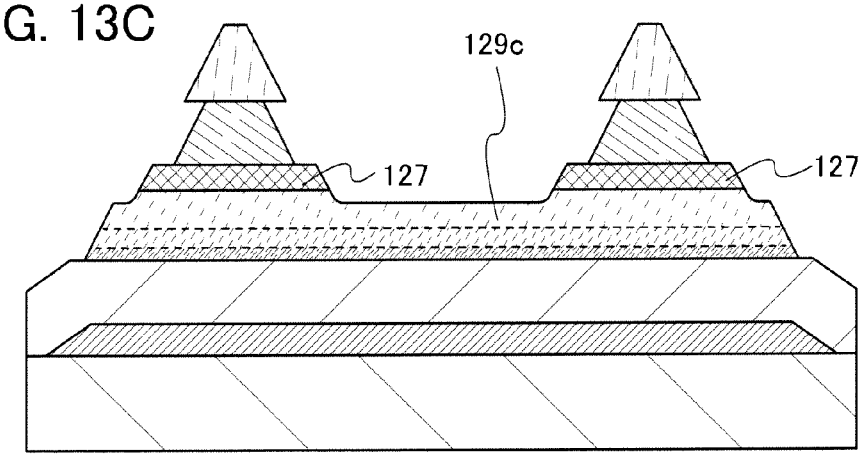

Next, with the use of the resist mask 123, the layer 115c containing an amorphous semiconductor and the impurity semiconductor layer 117 are each partly etched. Here, dry etching is employed. Through the above step, a layer 129c containing an amorphous semiconductor which has a depression on its surface and impurity semiconductor layers 127 serving as source and drain regions are formed (FIG. 13C). After that, the resist mask 123 is removed.

Note that here, the conductive layer 119 is etched by wet etching, and the layer 115c containing an amorphous semiconductor and the impurity semiconductor layer 117 are each partly etched by dry etching. Accordingly, since the conductive layer 119 is isotropically etched, the side surfaces of the wirings 125 are not aligned with the side surfaces of the impurity semiconductor layers 127, and the side surfaces of the impurity semiconductor layers 127 are located on outer sides than the side surfaces of the wirings 125.

Alternatively, the impurity semiconductor layer 117 and the layer 115c containing an amorphous semiconductor may be partly etched after etching of the conductive layer 119 and removal of the resist mask 123. By the etching, the impurity semiconductor layer 117 is etched using the wirings 125 as masks, so that the side surfaces of the wirings 125 are substantially aligned with the side surfaces of the impurity semiconductor layers 127.

Next, dry etching may be performed. A condition of dry etching is set so that the exposed region of the layer 129c containing an amorphous semiconductor is not damaged and the etching rate with respect to the layer 129c containing an amorphous semiconductor layer is low. In other words, a condition which gives almost no damages to the exposed surface of the layer 129c containing an amorphous semiconductor and hardly reduces the thickness of the exposed region of the layer 129c containing an amorphous semiconductor is applied. As an etching gas, a chlorine-based gas typified by $Cl_2$, $CF_4$, $N_2$, or the like is used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Next, the surface of the layer 129c containing an amorphous semiconductor may be subjected to plasma treatment typified by water plasma treatment, ammonia plasma treatment, nitrogen plasma treatment, or the like.

The water plasma treatment can be performed by generating plasma using a gas containing water as its main component typified by water vapor ($H_2O$ vapor), introduced into the reaction space.

As described above, after formation of the impurity semiconductor layers 127, dry etching is further performed under such a condition that the layer 129c containing an amorphous semiconductor is not damaged, whereby an impurity such as a residue existing on the exposed region of the layer 129c containing an amorphous semiconductor can be removed. Further, after dry etching, water plasma treatment is performed, whereby a residue of the resist mask can be removed. By the plasma treatment, insulation between the source region and the drain region can be ensured, and thus, in a thin film transistor which is completed, off-current can be reduced, and variation in electric characteristics can be reduced.

Through these steps, a thin film transistor with a channel formation region which is formed using a microcrystalline semiconductor layer can be manufactured with the small number of masks. Further, a thin film transistor with small off-current, large on-current, and high field-effect mobility can be manufactured with high productivity.

Embodiment 3

In this embodiment, a method for manufacturing a thin film transistor, which is different from that in Embodiment 2, will be described with reference to FIGS. 12A to 12C, FIGS. 15A to 15C, and FIGS. 16A and 16B.

Figure 15A:
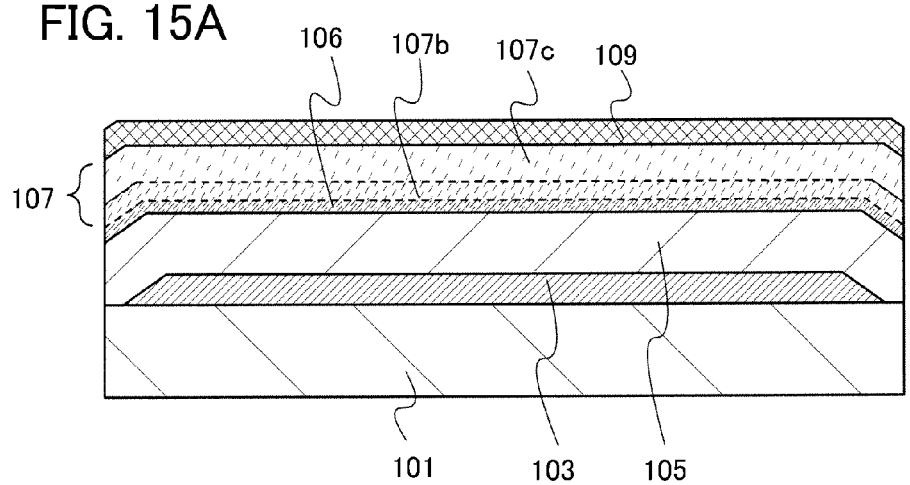
FIGS. 15A to 15C are cross-sectional views illustrating a method for manufacturing a thin film transistor.

As in Embodiment 2, a gate electrode 103 is formed over a substrate 101. Then, a gate insulating layer 105 is formed so as to cover the gate electrode 103, and a first semiconductor layer 106 is formed (FIG. 12A). Next, as in Embodiment 2, crystals are grown from the first semiconductor layer 106, whereby a second semiconductor layer 107 (a mixed layer 107b and a layer 107c containing an amorphous semiconductor) is formed. Then, an impurity semiconductor layer 109 is formed over the second semiconductor layer 107 (FIG. 15A). After that, a resist mask (not illustrated) is formed over the impurity semiconductor layer 109.

Figure 15B:
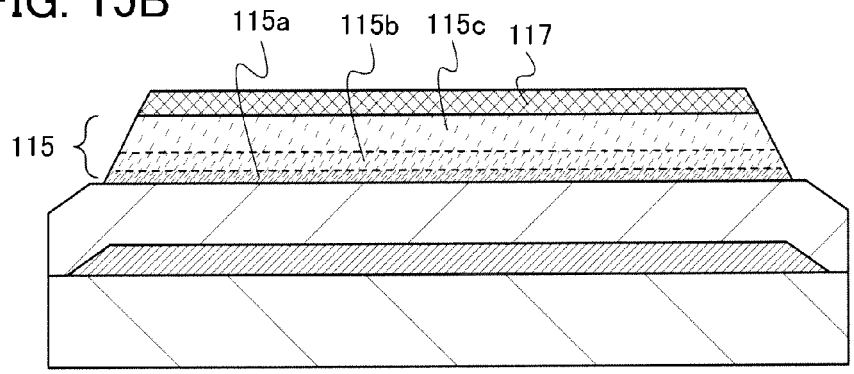

Next, with the use of the resist mask, the second semiconductor layer 107 and the impurity semiconductor layer 109 are etched. By this step, the second semiconductor layer 107 and the impurity semiconductor layer 109 are divided for each element, so that a second semiconductor layer 115 (a microcrystalline semiconductor layer 115a, a mixed layer 115b, and a layer 115c containing an amorphous semiconductor) and an impurity element layer 117 are formed (FIG. 15B).

Figure 15C:
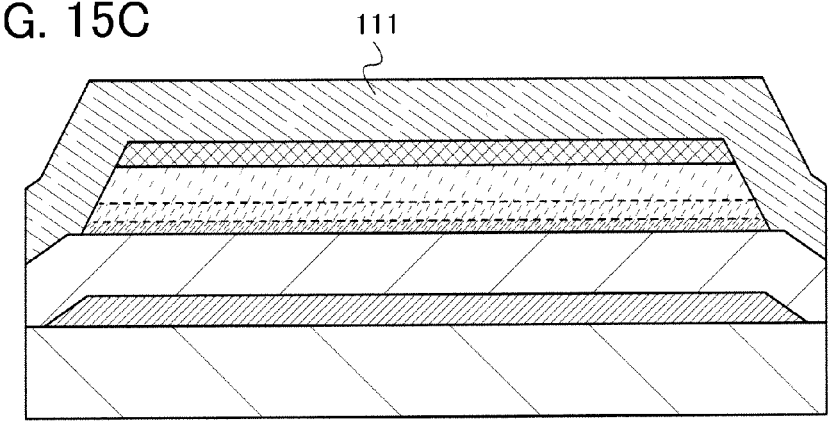

Next, a conductive layer 111 is formed over the gate insulating layer 105, the second semiconductor layer 115, and the impurity semiconductor layer 117 (FIG. 15C).

Figure 16A:
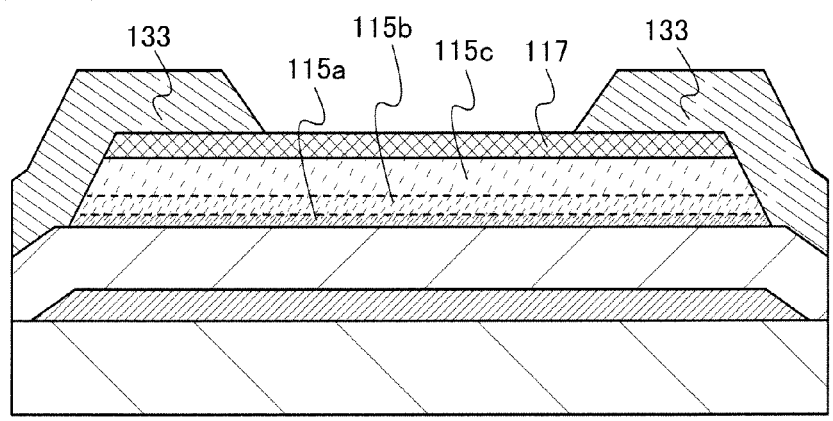
FIGS. 16A and 16B are cross-sectional views illustrating a method for manufacturing a thin film transistor.

Then, a resist mask (not illustrated) is formed over the conductive layer 111, and the conductive layer 111 is etched with the use of the resist mask, so that wirings 133 serving as source and drain electrodes are formed (FIG. 16A).

Figure 16B:
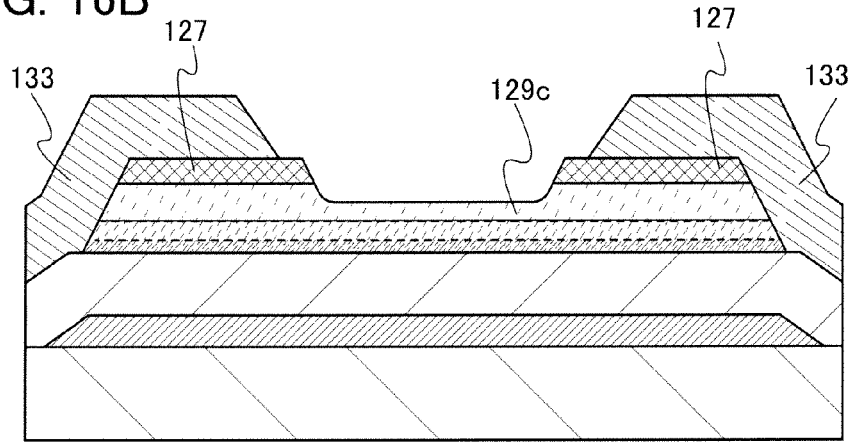

Next, the impurity semiconductor layer 117 is partly etched to form impurity semiconductor layers 127 serving as source and drain regions. In addition, the layer 115c containing an amorphous semiconductor is partly etched, whereby a layer 129c containing an amorphous semiconductor which has a depression portion is formed (FIG. 16B).

Through the above-described steps, a thin film transistor can be manufactured.

After forming the wirings 133, the impurity semiconductor layer 117 and the layer 115c containing an amorphous semiconductor are partly etched without removal of the resist mask; however, the impurity semiconductor layer 117 and the layer 115c containing an amorphous semiconductor may be partly etched after removal of the resist mask. By the etching, the impurity semiconductor layer 117 is etched using the wirings 133 as masks, so that the side surfaces of the wirings 133 are substantially aligned with the side surfaces of the impurity semiconductor layers 127.

Next, dry etching may be performed after the resist mask is removed. A condition of dry etching is set so that an exposed region of the layer 129c containing an amorphous semiconductor is not damaged and the etching rate with respect to the layer 129c containing an amorphous semiconductor is low. In other words, a condition which gives almost no damages to the exposed surface of the layer 129c containing an amorphous semiconductor and hardly reduces the thickness of the exposed region of the layer 129c containing an amorphous semiconductor is applied.

Next, the surface of the layer 129c containing an amorphous semiconductor may be irradiated with water plasma, ammonia plasma, nitrogen plasma, or the like.

The water plasma treatment can be performed by generating plasma using a gas containing water as its main component typified by water vapor ($H_2O$ vapor), introduced into a reaction space.

As described above, after the layer 129c containing an amorphous semiconductor is formed, dry etching is performed under a condition where the layer 129c containing an amorphous semiconductor is not damaged, whereby an impurity such as a residue existing on the layer 129c containing an amorphous semiconductor can be removed. Further, after dry etching, water plasma treatment is performed, whereby a residue of the resist mask can be removed. By the plasma treatment, insulation between the source region and the drain region can be ensured, and thus, in the thin film transistor, off-current can be reduced, and variation in electric characteristics can be reduced.

Through these steps, a thin film transistor with a channel formation region which is formed using a microcrystalline semiconductor layer can be manufactured. Further, a thin film transistor with small off-current, large on-current, and high field-effect mobility can be manufactured with high productivity.

Embodiment 4

In this embodiment, a series of steps from a step of forming a gate insulating layer to a step of forming an impurity semiconductor layer, which is applicable to Embodiments 2 and 3, will be described with reference to a timing chart in FIG. 17. Note that the gate insulating layer is formed in such a manner that a silicon oxynitride layer is stacked over a silicon nitride layer.

Figure 17:
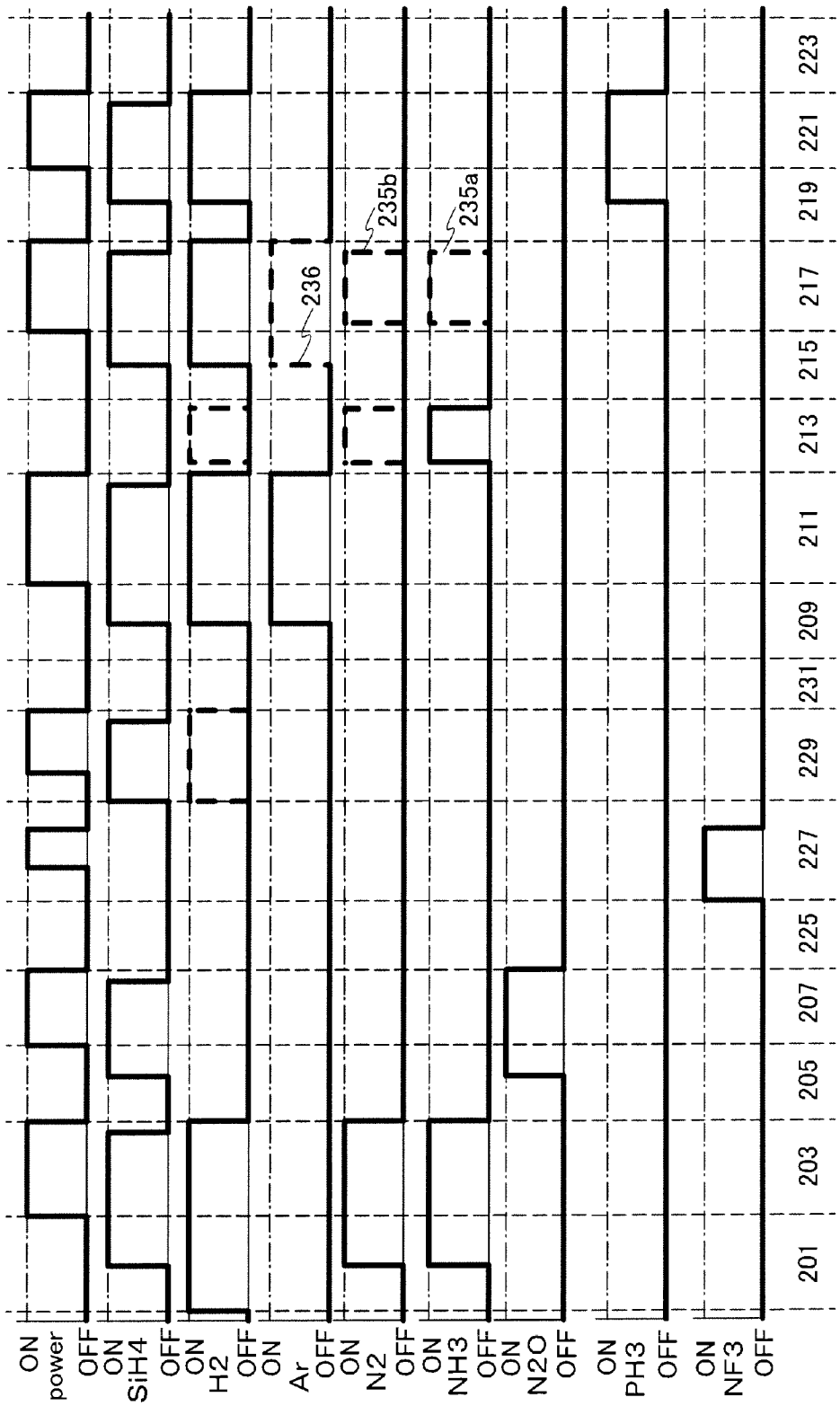
FIG. 17 is an example of a timing chart showing a process for manufacturing a thin film transistor.

First, a substrate 101 provided with a gate electrode 103 is heated in a treatment chamber of a CVD apparatus, and a source gas used for depositing a silicon nitride layer is introduced into the treatment chamber (pretreatment 201 in FIG. 17). Here, as an example, the source gas is introduced and stabilized, where the flow rate of SiH$_4$ is 40 sccm, the flow rate of H$_2$ is 500 sccm, the flow rate of N$_2$ is 550 sccm, and the flow rate of NH$_3$ is 140 sccm, the pressure in the treatment chamber is 100 Pa, the temperature of the substrate is 280° C., the output is 370 W, and plasma discharge is performed under this condition, whereby a silicon nitride layer with a thickness of approximately 110 nm is formed. After that, only the supply of SiH$_4$ is stopped, and after several seconds (five seconds in this embodiment), the plasma discharge is stopped (formation of SiN 203 in FIG. 17). This is because when plasma discharge is stopped in a state where there is still SiH$_4$ in the treatment chamber, granular compounds or mealy compounds which contain silicon as its main component are formed, which cause a reduction in yield.

Next, the source gas used for depositing the silicon nitride layer is exhausted, and a source gas for depositing a silicon oxynitride layer is introduced into the treatment chamber (replacement of gases 205 in FIG. 17). Here, as an example, the source gas is introduced and stabilized, where the flow rate of SiH$_4$ is 30 sccm and the flow rate of N$_2$O is 1200 sccm, the pressure in the treatment chamber is 40 Pa, the temperature of the substrate is 280° C., the output is 50 W, and plasma discharge is performed under this condition, whereby a silicon oxynitride layer with a thickness of approximately 110 nm is formed. After that, in a manner similar to the formation of the silicon nitride layer, only the supply of SiH$_4$ is stopped, and after several seconds (five seconds in this embodiment), the plasma discharge is stopped (formation of SiON 207 in FIG. 17).

Through the above steps, a gate insulating layer 105 can be formed. After formation of the gate insulating layer 105, the substrate 101 is carried out of the treatment chamber (unload 225 in FIG. 17).

After the substrate 101 is carried out of the treatment chamber, for example, an NF$_3$ gas is introduced into the treatment chamber and the inside of the treatment chamber is cleaned (cleaning treatment 227 in FIG. 17). After that, treatment for forming an amorphous silicon layer in the treatment chamber is performed (precoating treatment 229 in FIG. 17). By this treatment, an amorphous silicon layer is formed on the inner wall of the treatment chamber. After that, the substrate 101 is carried into the treatment chamber (load 231 in FIG. 17).

Next, a source gas used for depositing a first semiconductor layer 106 is introduced into the treatment chamber (replacement of gases 209 in FIG. 17). Then, the first semiconductor layer 106 is formed over the gate insulating layer 105. Here, as an example, the source gas is introduced and stabilized, where the flow rate of SiH$_4$ is 10 sccm, the flow rate of H$_2$ is 1500 sccm, and the flow rate of Ar is 1500 sccm, the pressure in the treatment chamber is 280 Pa, the temperature of the substrate is 280° C., the output is 50 W, and plasma discharge is performed under this condition, whereby a microcrystalline silicon layer with a thickness of approximately 5 nm is formed as the first semiconductor layer 106. After that, in a manner similar to the formation of the silicon nitride layer or the like as described above, only the supply of SiH$_4$ is stopped, and after several seconds (five seconds in this embodiment), the plasma discharge is stopped (formation of first semiconductor layer 211 in FIG. 17).

Next, nitrogen is supplied to the surface of the first semiconductor layer 106. Here, the surface of the first semiconductor layer 106 is exposed to ammonia, whereby nitrogen is supplied (here, referred to as "flush treatment") (flush treatment 213 in FIG. 17). Further, hydrogen may be included in ammonia. Alternatively, a nitrogen gas may be introduced into the treatment chamber instead of ammonia. Further alternatively, both ammonia and a nitrogen gas may be introduced into the treatment chamber. Here, for example, the pressure in the treatment chamber is about 20 Pa to 30 Pa, the temperature of the substrate is 280° C., and the treatment time is 60 seconds. Note that in the treatment of this process, the substrate 101 is exposed only to ammonia; however, plasma treatment may also be performed. After that, these gases are exhausted and a gas used for depositing a second semiconductor layer 107 is introduced (replacement of gases 215 in FIG. 17).

Next, the second semiconductor layer 107 is formed. Here, as an example, the source gas is introduced and stabilized, where the flow rate of SiH$_4$ is 30 sccm and the flow rate of H$_2$ is 1500 sccm, the pressure in the treatment chamber is 280 Pa, the temperature of the substrate is 280° C., the RF power source frequency is 13.56 MHz, the output power of the RF power source is 50 W, and plasma discharge is performed under this condition, whereby the second semiconductor layer 107 with a thickness of approximately 150 nm is formed.

In the step of forming the second semiconductor layer 107, ammonia which is introduced into the treatment chamber by the flush treatment is decomposed by plasma discharge. Then, nitrogen obtained by the decomposition of ammonia is taken into the second semiconductor layer 107 while deposition, so that the mixed layer and the layer containing an amorphous semiconductor, which each contain nitrogen, are formed. Further, an NH group or an NH$_2$ group is formed through the decomposition of ammonia, and thus, dangling bonds can be cross-linked with the NH group while the second semiconductor layer 107 is deposited. Alternatively, the dangling bond can be terminated with the NH$_2$ group. Note that in the case where a nitrogen gas is introduced into the treatment chamber as a gas containing nitrogen, reaction occurs between the nitrogen gas and a hydrogen gas included in the source gas of the second semiconductor layer 107 by plasma discharge, so that the NH group or the NH$_2$ group is generated. Different dangling bonds in the second semiconductor layer 107 are cross-linked with the NH group. In addition, different dangling bonds in the second semiconductor layer 107 are terminated with the NH$_2$ group and defect levels disappear.

After that, in a manner similar to the formation of the silicon nitride layer or the like as described above, only the supply of SiH$_4$ is stopped, and after several seconds (five seconds in this embodiment), the plasma discharge is stopped (formation of second semiconductor layer 217 in FIG. 17). After that, these gases are exhausted and a gas used for depositing an impurity semiconductor layer 109 is introduced (replacement of gases 219 in FIG. 17).

In the second semiconductor layer 107 which is formed by the above method, the nitrogen concentration measured by secondary ion mass spectrometry is as described in Embodiment 1 and nitrogen is segregated at the interface of microcrystalline semiconductor regions at the early stage of deposition of the second semiconductor layer 107. After that, nitrogen comes to be contained in the layer containing an amorphous semiconductor. However, as the second semiconductor layer 107 is deposited, the amount of nitrogen in the treatment chamber of the CVD apparatus is reduced. Therefore, after the nitrogen concentration has a peak in the mixed layer 107b, it is decreased in a deposition direction of the layer 107c containing an amorphous semiconductor.

Note that as indicated by a dashed line 235a in FIG. 17, ammonia may be supplied to the treatment chamber in the formation of second semiconductor layer 217. Instead of ammonia, as indicated by a dashed line 235b in FIG. 17, a nitrogen gas may be supplied. Further alternatively, both ammonia and a nitrogen gas may be supplied. Still further alternatively, nitrogen fluoride, nitrogen chloride, chloroamine, fluoroamine, or the like may be supplied instead of ammonia and nitrogen. As a result, the nitrogen concentration of the second semiconductor layer 107 is increased, so that dangling bonds included in the second semiconductor layer 107 are cross-linked, leading to a reduction in defect levels. In addition, the dangling bond is terminated and defect levels are reduced.

In the second semiconductor layer 107 formed by such a method, the nitrogen concentration measured by secondary ion mass spectrometry has a peak (maximum value) in the mixed layer 107b and is constant in a deposition direction of the layer 107c containing an amorphous semiconductor.

Alternatively, in the formation of second semiconductor layer 217, a rare gas may be used for the source gas as indicated by a dashed line 236. As a result, the growth rate of the second semiconductor layer 107 can be increased.

Next, an impurity semiconductor layer 109 is formed over the entire surface of the second semiconductor layer 107. In a later process, the impurity semiconductor layer 109 is patterned into impurity semiconductor layers 127 serving as source and drain regions. First, a source gas used for depositing the impurity semiconductor layer 109 is introduced into the treatment chamber. Here, as an example, the source gas is introduced and stabilized, where the flow rate of $SiH_4$ is 100 sccm and the flow rate of a mixed gas in which $PH_3$ is diluted with $H_2$ to 0.5 vol % is 170 sccm. Further, the pressure in the treatment chamber is 280 Pa, the temperature of the substrate is 280° C., the output is 60 W, and plasma discharge is performed under this condition, whereby an amorphous silicon layer containing phosphorus is formed with a thickness of approximately 50 nm. After that, in a manner similar to formation of the silicon nitride layer or the like as described above, only the supply of $SiH_4$ is stopped, and after several seconds (five seconds in this embodiment), the plasma discharge is stopped (formation of impurity semiconductor layer 221 in FIG. 17). After that, these gases are exhausted (exhaust 223 in FIG. 17).

As described above, components including and up to the impurity semiconductor layer 109 can be formed.

Through the above process, a microcrystalline semiconductor region containing nitrogen and an amorphous semiconductor region containing nitrogen can be formed. That is, a conical or pyramidal microcrystalline semiconductor region and a well-ordered semiconductor layer which has fewer defects and whose tail of a level at a band edge in the valence band is steep can be formed. As a result, a thin film transistor with large on-current and high field-effect mobility, and small off-current can be manufactured.

Embodiment 5

In this embodiment, a series of steps from a step of forming a gate insulating layer to a step of forming an impurity semiconductor layer, which is applicable to Embodiments 2 and 3, will be described.

In this embodiment, the inside of a treatment chamber is cleaned before a second semiconductor layer 107 is formed, and after that, the inner wall of the chamber is covered with a silicon nitride layer, whereby nitrogen is contained in the second semiconductor layer 107 and the nitrogen concentration is controlled. A method for forming a gate insulating layer 105 is similar to that in Embodiment 4; thus, a series of steps from a step of forming a first semiconductor layer 106 to a step of forming an impurity semiconductor layer 109 is described below with reference to FIG. 18.

The first semiconductor layer 106 is formed over the entire surface of the gate insulating layer 105. First, a source gas used for depositing the first semiconductor layer 106 is introduced into the treatment chamber. Here, as an example, by a method similar to that of Embodiment 2, a microcrystalline silicon layer with a thickness of approximately 5 nm is formed as the first semiconductor layer 106. After that, plasma discharge is stopped (formation of first semiconductor layer 211 in FIG. 18). Then, a substrate 101 is carried out of the treatment chamber (unload 225 in FIG. 18).

Figure 18:
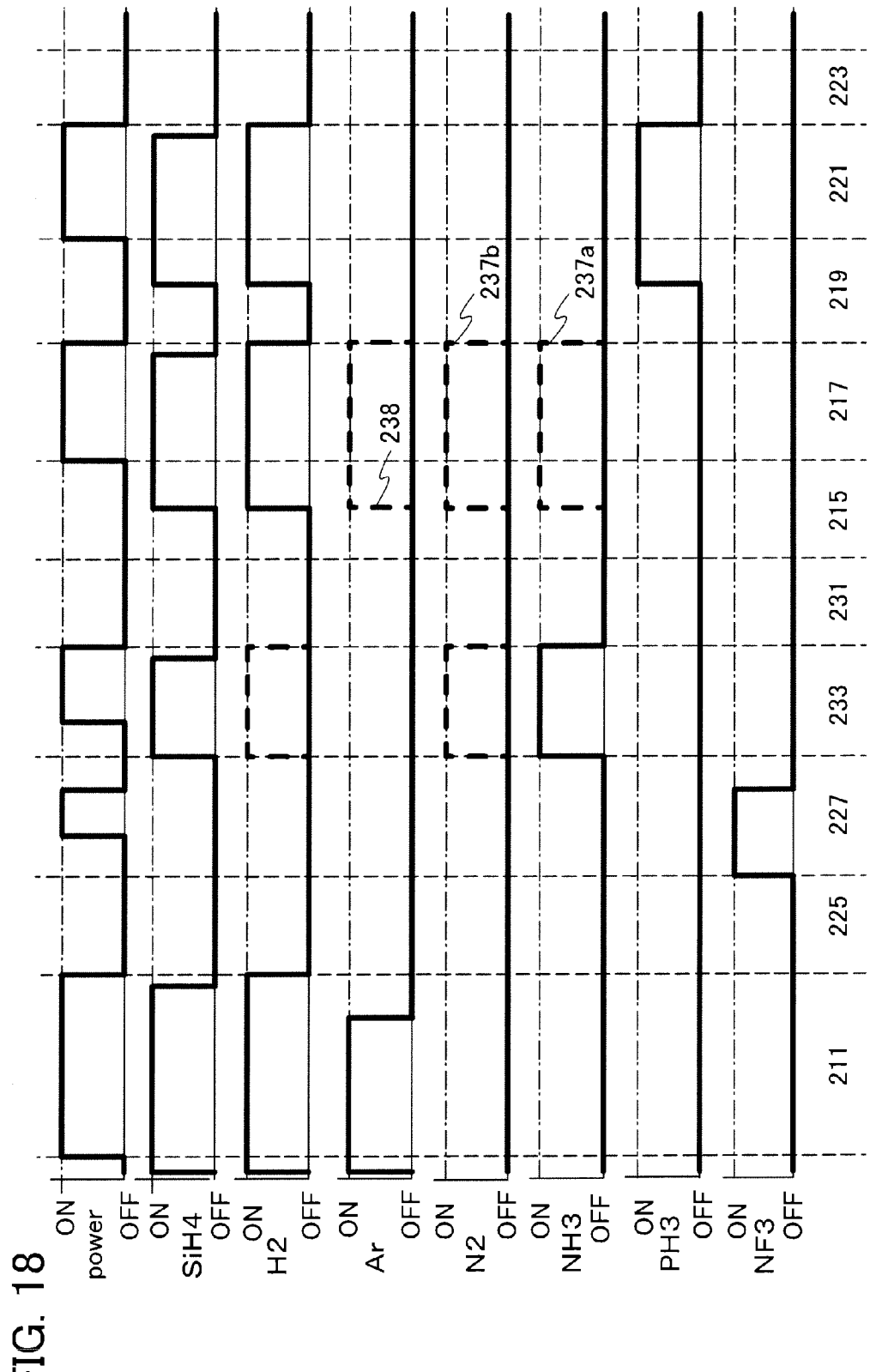
FIG. 18 is an example of a timing chart showing a process for manufacturing a thin film transistor.

After the substrate 101 is carried out of the treatment chamber, for example, an $NF_3$ gas is introduced into the treatment chamber and the inside of the treatment chamber is cleaned (cleaning treatment 227 in FIG. 18). After that, treatment for forming a silicon nitride layer in the treatment chamber is performed (precoating treatment 233 in FIG. 18). The silicon nitride layer is formed under a condition similar to that for the silicon nitride layer which is formed as the gate insulating layer in Embodiment 2. By this treatment, the silicon nitride layer is formed on the inner wall of the treatment chamber. After that, the substrate 101 is carried into the treatment chamber (load 231 in FIG. 18).

Note that the cleaning treatment 227 is not necessarily performed, which can improve the throughput.

Next, a source gas used for depositing the second semiconductor layer 107 is introduced into the treatment chamber (replacement of gases 215 in FIG. 18). Next, the second semiconductor layer 107 is formed. Here, as in Embodiment 2, the second semiconductor layer 107 is formed to a thickness of 150 nm. After that, plasma discharge is stopped (formation of second semiconductor layer 217 in FIG. 18).

In the step of forming the second semiconductor layer 107, when the silicon nitride layer formed in the treatment chamber is exposed to plasma, nitrogen is dissociated and taken into the second semiconductor layer 107 which is being deposited. Therefore, a mixed layer and a layer containing an amorphous semiconductor, which each contain nitrogen, are formed. Further, when the silicon nitride layer is exposed to plasma, an NH group or an $NH_2$ group is formed; thus, dangling bonds can be cross-linked with the NH group while the second semiconductor layer 107 is deposited. Alternatively, a dangling bond can be terminated with the $NH_2$ group.

In the second semiconductor layer 107 which is formed by the above method, the nitrogen concentration measured by secondary ion mass spectrometry is as described in Embodiment 1 and nitrogen is segregated at the interface of microcrystalline semiconductor regions at the early stage of deposition of the second semiconductor layer 107. After that, nitrogen comes to be contained in the layer containing an amorphous semiconductor. However, as the second semiconductor layer 107 is deposited, the amount of nitrogen in the treatment chamber of the CVD apparatus is reduced. Therefore, after the nitrogen concentration has a peak in the mixed layer 107b, it is decreased in a deposition direction of the layer 107c containing an amorphous semiconductor.

Note that as indicated by a dashed line 237a in FIG. 18, in the formation of second semiconductor layer 217, ammonia may be supplied to the treatment chamber. Instead of ammonia, as indicated by a dashed line 237b, a nitrogen gas may be supplied. Further alternatively, both ammonia and a nitrogen gas may be supplied to the treatment chamber. Still further alternatively, nitrogen fluoride, nitrogen chloride, chloroamine, fluoroamine, or the like may be supplied instead of ammonia and nitrogen. As a result, the nitrogen concentration of the second semiconductor layer 107 is increased, so that dangling bonds included in the second semiconductor layer 107 are cross-linked, leading to a reduction in defect levels. Alternatively, a dangling bond of the second semiconductor layer 107 is terminated and defect levels are reduced.

In the second semiconductor layer 107 formed by such a method, the nitrogen concentration measured by secondary ion mass spectrometry has a peak (maximum value) in the mixed layer 107b and is constant in a deposition direction of the layer 107c containing an amorphous semiconductor.

Alternatively, in the formation of second semiconductor layer 217, a rare gas may be used for the source gas as indicated by a dashed line 238. As a result, the growth rate of the second semiconductor layer 107 can be increased.

Then, these gases are exhausted and a gas used for depositing the impurity semiconductor layer 109 is introduced (replacement of gases 219 in FIG. 18). In a manner similar to that of Embodiment 1, the impurity semiconductor layer 109 is formed (formation of impurity semiconductor layer 221 in FIG. 18). After that, the source gas of the impurity semiconductor layer 109 is exhausted (exhaust 223 in FIG. 18).

Through this process, ammonia which is introduced into the treatment chamber in the precoating treatment is dissociated by the plasma discharge, so that nitrogen is contained in the plasma. Further, when the silicon nitride layer formed on the inner wall of the treatment chamber is exposed to plasma, part of silicon nitride is dissociated and nitrogen is contained in the plasma. As a result, the second semiconductor layer can contain nitrogen.

In addition, in this embodiment, a gas containing nitrogen is supplied to the treatment chamber in which the second semiconductor layer 107 is formed, and further, an NH group or an $NH_2$ group is generated. As described above, dangling bonds included in the semiconductor layer are cross-linked with the NH group. Further, a dangling bond included in the semiconductor layer is terminated with the $NH_2$ group. Therefore, by forming the second semiconductor layer 107 in the treatment chamber to which a gas containing nitrogen is supplied, a semiconductor layer including an NH group with which dangling bonds are cross-linked can be formed. Further, a semiconductor layer including an $NH_2$ group with which a dangling bond is terminated can be formed. In addition, a microcrystalline semiconductor region containing nitrogen can be formed in the mixed layer.

In addition, by covering the inner wall of the treatment chamber with a silicon nitride layer just before the second semiconductor layer is formed, the nitrogen concentration can be controlled, and the second semiconductor layer can be formed.

Further, by covering the inner wall of the treatment chamber with the silicon nitride layer, an element or the like included in the inner wall of the treatment chamber can be prevented from being mixed into the second semiconductor layer 107.

Note that in the description above, since the second semiconductor layer 107 is formed in the same treatment chamber as that in which the first semiconductor layer 106 is formed, cleaning treatment and precoating treatment are performed after formation of the first semiconductor layer 106; however, this embodiment may be carried out in combination with any of Embodiments 2 to 4. That is, after the first semiconductor layer 106 is deposited, a silicon nitride layer is formed in the treatment chamber and flush treatment 213 may further be performed.

Through the above process, a microcrystalline semiconductor region containing nitrogen and an amorphous semiconductor region containing nitrogen can be formed. That is, a conical or pyramidal microcrystalline semiconductor region and a well-ordered semiconductor layer which has fewer defects and whose tail of a level at a band edge in the valence band is steep can be formed. As a result, a thin film transistor with large on-current and high field-effect mobility, and small off-current can be manufactured.

Embodiment 6

In this embodiment, a series of steps from a step of forming a gate insulating layer to a step of forming an impurity semiconductor layer, which is applicable to Embodiments 2 and 3, will be described.

In this embodiment, by introducing nitrogen as a deposition gas into a treatment chamber in which a second semiconductor layer 107 is formed, the nitrogen concentration of the second semiconductor layer 107 can be controlled. A series of steps from a step of forming a gate insulating layer 105 to a step of forming a first semiconductor layer 106 is similar to that in Embodiment 1. Here, a series of steps from a step of forming the first semiconductor layer 106 to a step of forming an impurity semiconductor layer 109 is described below with reference to FIG. 19.

The first semiconductor layer 106 is formed over the entire surface of the gate insulating layer 105. First, a source gas used for depositing the first semiconductor layer 106 is introduced into a treatment chamber. Here, as an example, by a method similar to that of Embodiment 1, a microcrystalline silicon layer with a thickness of approximately 5 nm is formed as the first semiconductor layer 106. After that, plasma discharge is stopped (formation of first semiconductor layer 211 in FIG. 19). Then, the gas is exhausted and a gas used for depositing the second semiconductor layer 107 is introduced (replacement of gases 215 in FIG. 19).

Next, the second semiconductor layer 107 is formed. Here, as an example, the source gas is introduced and stabilized, where the flow rate of $SiH_4$ is 30 sccm, the flow rate of $H_2$ is 1425 sccm, and the flow rate of 1000 ppm $NH_3$ (diluted with hydrogen) is 25 sccm, the pressure in the treatment chamber is 280 Pa, the temperature of the substrate is 280° C., the RF power source frequency is 13.56 MHz, the output power of the RF power source is 50 W, and plasma discharge is performed under this condition, whereby the second semiconductor layer 107 with a thickness of approximately 150 nm is formed. Through this process, ammonia is dissociated by the plasma discharge, so that nitrogen is contained in the plasma and thus nitrogen is contained in the second semiconductor layer. Further, when an NH group is generated in the plasma, dangling bonds can be cross-linked while the second semiconductor layer is deposited. In addition, when an $NH_2$ group is generated in the plasma, a dangling bond can be terminated while the second semiconductor layer is deposited (formation of second semiconductor layer 217 in FIG. 19).

Note that as indicated by a dashed line 232, a nitrogen gas may be supplied to the treatment chamber in the formation of second semiconductor layer 217, instead of ammonia, as a gas containing nitrogen. Alternatively, both ammonia and a nitrogen gas may be supplied to the treatment chamber. Further alternatively, nitrogen fluoride, nitrogen chloride, chloroamine, fluoroamine, or the like may be supplied instead of ammonia and nitrogen. As a result, the nitrogen concentration of the second semiconductor layer 107 is increased, so that dangling bonds included in the second semiconductor layer 107 are cross-linked, leading to a reduction in defect levels. Alternatively, the dangling bond of the second semiconductor layer 107 is terminated and defect levels are reduced.

In the second semiconductor layer 107 formed by such a method, the nitrogen concentration measured by secondary ion mass spectrometry has a peak (maximum value) in the mixed layer 107b and is constant in a deposition direction of the layer 107c containing an amorphous semiconductor.

Alternatively, in the formation of second semiconductor layer 217, a rare gas may be used for the source gas as indicated by a dashed line 234. As a result, the growth rate of the second semiconductor layer 107 can be increased.

Figure 19:
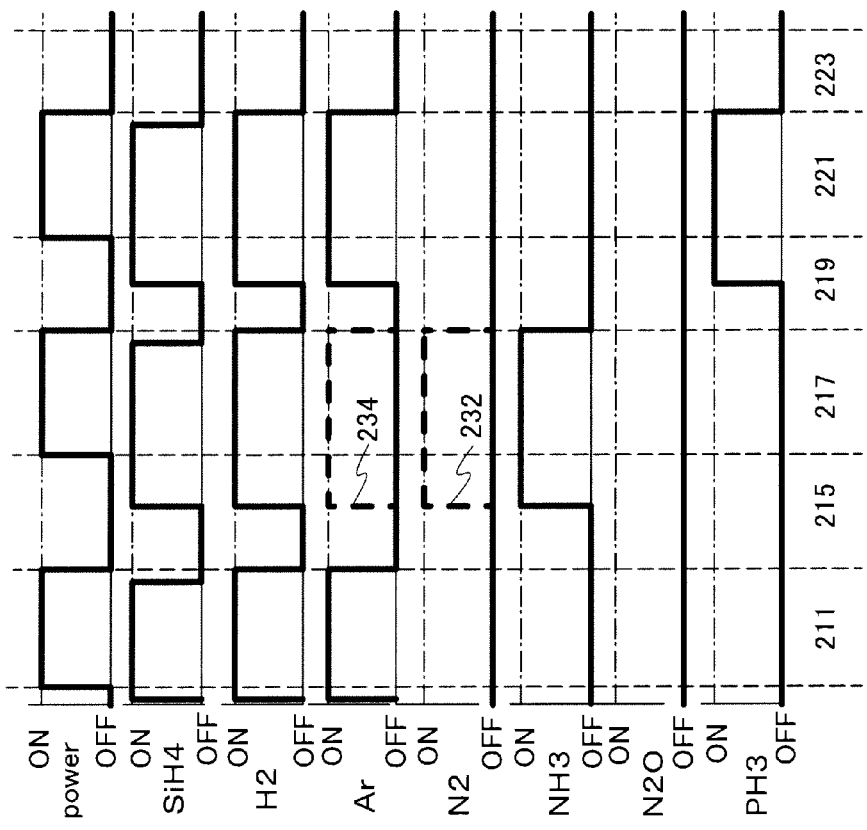
FIG. 19 is an example of a timing chart showing a process for manufacturing a thin film transistor.

After that, these gases are exhausted and a gas used for depositing the impurity semiconductor layer 109 is introduced (replacement of gases 219 in FIG. 19). In a manner similar to that of Embodiment 2, the impurity semiconductor layer 109 is formed (formation of impurity semiconductor layer 221 in FIG. 19). Then, the source gas of the impurity semiconductor layer 109 is exhausted (exhaust 223 in FIG. 19).

Through the above process, a microcrystalline semiconductor region containing nitrogen and an amorphous semiconductor region containing nitrogen can be formed. That is, a conical or pyramidal microcrystalline semiconductor region and a well-ordered semiconductor layer which has fewer defects and whose tail of a level at a band edge in the valence band is steep can be manufactured. As a result, a thin film transistor with large on-current and high field-effect mobility, and small off-current can be manufactured.

Embodiment 7

In this embodiment, a series of steps from a step of forming a gate insulating layer to a step of forming an impurity semiconductor layer, which is applicable to Embodiments 2 and 3, will be described with reference to FIG. 20.

In this embodiment, in a method for forming a second semiconductor layer 107, a gas containing nitrogen is introduced into a treatment chamber by flush treatment 213 after the formation of first semiconductor layer 211 in Embodiment 2. In addition, a gas containing nitrogen is introduced again into the treatment chamber during formation of the second semiconductor layer 107 (that is, in formation of second semiconductor layer 217), as indicated by a solid line 239a (FIG. 20). As the gas containing nitrogen, here, ammonia is used. Note that instead of ammonia, as indicated by a dashed line 239b, a nitrogen gas may be used. Alternatively, both ammonia and a nitrogen gas may be used. Still further alternatively, nitrogen fluoride, nitrogen chloride, chloroamine, fluoroamine, or the like may be supplied instead of ammonia and nitrogen. As a result, at the early stage of deposition and during deposition of the second semiconductor layer 107, the nitrogen concentration becomes high, so that the defect levels can be reduced.

In addition, as a method for adding nitrogen to the second semiconductor layer 107, a silicon nitride layer is formed in the treatment chamber after the first semiconductor layer 106 is formed in Embodiment 5. In addition, a gas containing nitrogen may be introduced again into the treatment chamber during formation of the second semiconductor layer 107. As the gas containing nitrogen, here, ammonia is used. A nitrogen gas may also be used instead of ammonia. Alternatively, both ammonia and a nitrogen gas may be used. Still further alternatively, nitrogen fluoride, nitrogen chloride, chloroamine, fluoroamine, or the like may be supplied instead of ammonia and nitrogen. As a result, at the early stage of deposition and during deposition of the second semiconductor layer 107, the nitrogen concentration becomes high, so that the defect levels can be reduced.

Figure 20:
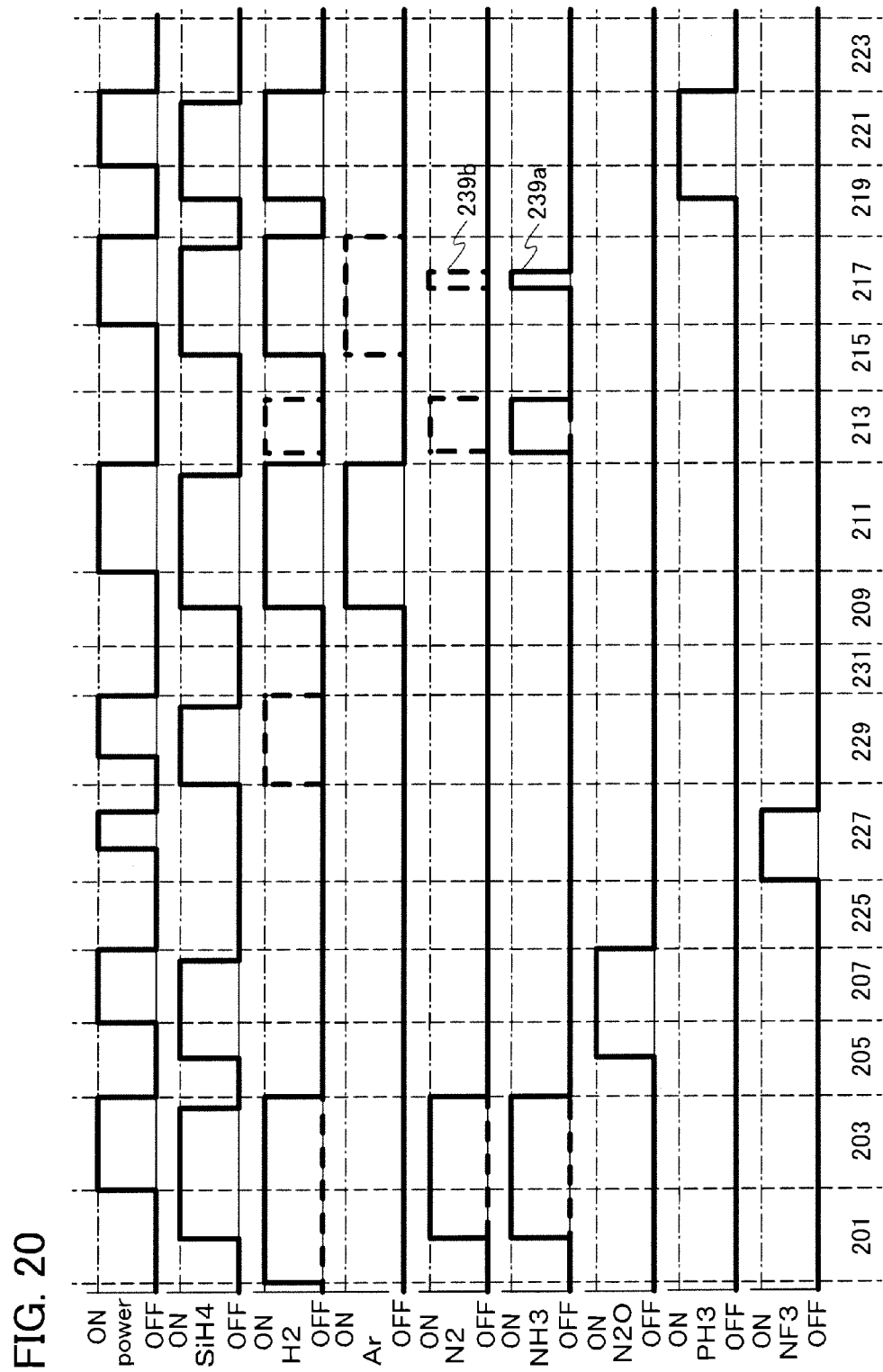
FIG. 20 is an example of a timing chart showing a process for manufacturing a thin film transistor.

Then, these gases are exhausted and a gas used for depositing an impurity semiconductor layer 109 is introduced (replacement of gases 219 in FIG. 20). In a manner similar to that of Embodiment 2, the impurity semiconductor layer 109 is formed (formation of impurity semiconductor layer 221 in FIG. 20). After that, the source gas of the impurity semiconductor layer 109 is exhausted (exhaust 223 in FIG. 20).

Through the above process, a microcrystalline semiconductor region containing nitrogen and an amorphous semiconductor region containing nitrogen can be formed. That is, a conical or pyramidal microcrystalline semiconductor region and a well-ordered semiconductor layer which has fewer defects and whose tail of a level at a band edge in the valence band is steep can be manufactured. As a result, a thin film transistor with large on-current and high field-effect mobility, and small off-current can be manufactured.

Embodiment 8

In this embodiment, the channel length of a thin film transistor is as short as less than or equal to 10 μm. One mode of the thin film transistor in which resistance of source and drain regions can be reduced will be described below. Here, description is made using Embodiment 1; however, the mode can be applied to any other embodiments as appropriate.

In the case where an impurity semiconductor layer 109 is formed using microcrystalline silicon to which phosphorus is added or microcrystalline silicon to which boron is added, in the second semiconductor layer 107 illustrated in FIG. 12B, a microcrystalline semiconductor layer, typically, a microcrystalline silicon layer is formed between the mixed layer 107b or the layer 107c containing an amorphous semiconductor and the impurity semiconductor layer 109, whereby a layer having low density is not formed at the early stage of deposition of the impurity semiconductor layer 109, and the impurity semiconductor layer 109 can be grown with the microcrystalline semiconductor layer as a seed crystal; thus, the interface characteristics can be improved. As a result, resistance at the interface between the impurity semiconductor layer 109 and the mixed layer 107b or the layer 107c containing an amorphous semiconductor can be reduced. Accordingly, the amount of current flowing through the source region, the semiconductor layer, and the drain region of the thin film transistor can be increased and on-current and field-effect mobility can be increased.

Embodiment 9

In this embodiment, an element substrate and a display device including the element substrate to which any of the thin film transistors described in Embodiments 1 to 8 can be applied will be described below. As examples of the display device, a liquid crystal display device, a light-emitting display device, electronic paper, and the like are given. The thin film transistor described in any of the above embodiments can be used for an element substrate of any other display devices. Here, a liquid crystal display device including the thin film transistor described in Embodiment 1, typically, a vertical alignment (VA) mode liquid crystal display device will be described with reference to FIG. 25 and FIG. 26.

Figure 25:
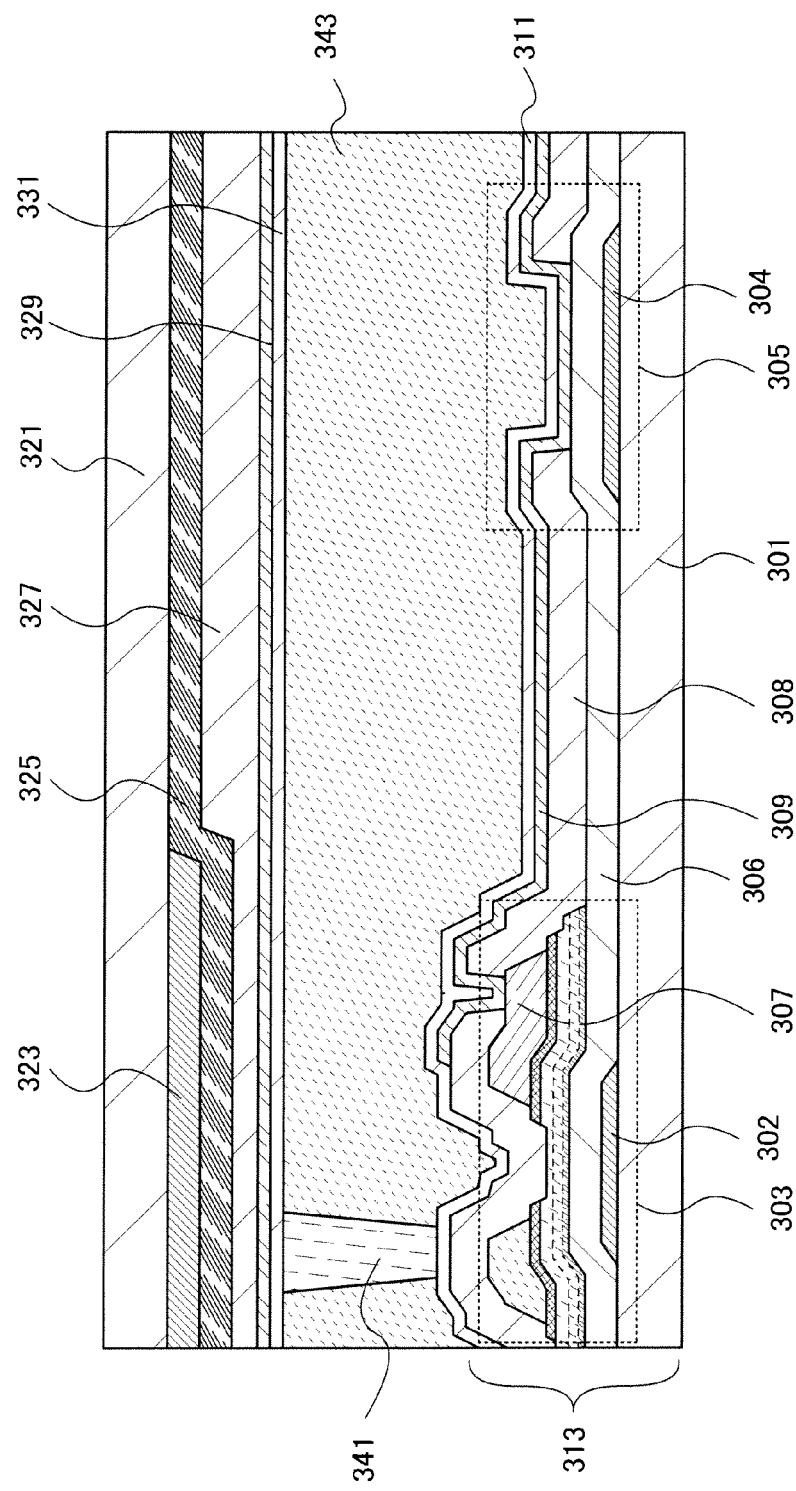
FIG. 25 is a cross-sectional view illustrating a display device.

FIG. 25 illustrates a cross-sectional structure of a pixel portion of a liquid crystal display device. A thin film transistor 303 manufactured by any of the above embodiments and a capacitor 305 are formed over a substrate 301. Further, a pixel electrode 309 is formed over an insulating layer 308 which is formed over the thin film transistor 303. A source or drain electrode 307 of the thin film transistor 303 and the pixel electrode 309 are connected to each other in an opening formed in the insulating layer 308. An alignment film 311 is formed over the pixel electrode 309.

The capacitor 305 includes a capacitor wiring 304 which is formed at the same time as a gate electrode 302 of the thin film transistor 303, a gate insulating layer 306, and the pixel electrode 309.

A stack body including components from the substrate 301 to the alignment film 311 is referred to as an element substrate 313.

A counter substrate 321 is provided with a coloring layer 325 and a light-blocking layer 323 for blocking incidence of light into the thin film transistor 303. In addition, a planarizing layer 327 is formed on the light-blocking layer 323 and the coloring layer 325. A counter electrode 329 is formed on the planarizing layer 327, and an alignment film 331 is formed on the counter electrode 329.

Note that the light-blocking layer 323, the coloring layer 325, and the planarizing layer 327 on the counter substrate 321 function as a color filter. Note that one or both of the light-blocking layer 323 and the planarizing layer 327 are not necessarily formed on the counter substrate 321.

The coloring layer has a function of preferentially transmitting light of a predetermined wavelength range, among light of a wavelength range of visible light. In general, a coloring layer which preferentially transmits light of a wavelength range of red light, a coloring layer which preferentially transmits light of a wavelength range of blue light, and a coloring layer which preferentially transmits light of a wavelength range of green light are combined to be used for a color filter. However, the combination of the coloring layers is not limited to the above combination.

The substrate 301 and the counter substrate 321 are fixed to each other by a sealing material (not illustrated), and a liquid crystal layer 343 fills a space surrounded by the substrate 301, the counter substrate 321, and the sealing material. Further, a spacer 341 is provided to keep a distance between the substrate 301 and the counter substrate 321.

The pixel electrode 309, the liquid crystal layer 343, and the counter electrode 329 are overlapped with each other, whereby a liquid crystal element is formed.

Figure 26:
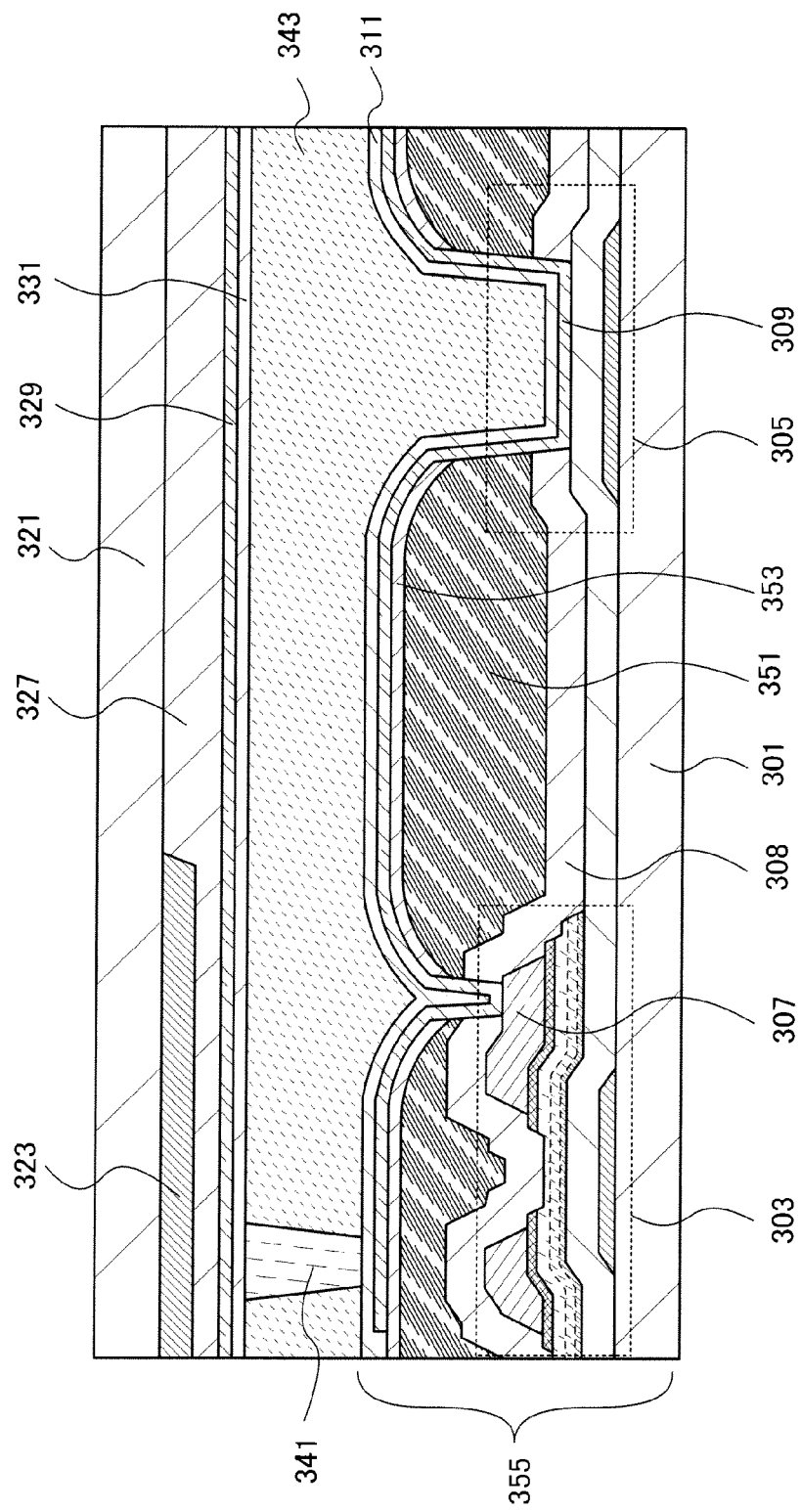
FIG. 26 is a cross-sectional view illustrating a display device.

FIG. 26 illustrates a liquid crystal display device different from that in FIG. 25. Here, a coloring layer is formed not on the counter substrate 321 side but over a substrate 301 provided with a thin film transistor 303.

FIG. 26 illustrates a cross-sectional structure of a pixel portion of a liquid crystal display device. The thin film transistor 303 manufactured by any of the above embodiments and a capacitor 305 are formed over the substrate 301.

Further, a coloring layer 351 is formed over an insulating layer 308 which is formed over the thin film transistor 303. Further, a protective layer 353 is formed over the coloring layer 351 in order to prevent an impurity contained in the coloring layer 351 from being mixed into a liquid crystal layer 343. A pixel electrode 309 is formed over the coloring layer 351 and the protective layer 353. As the coloring layer 351, a layer which preferentially transmits light of a predetermined wavelength range (red light, blue light, or green light) may be formed for each pixel. Further, since the coloring layer 351 also functions as a planarizing layer, uneven alignment of the liquid crystal layer 343 can be suppressed.

A source or drain electrode 307 of the thin film transistor 303 and the pixel electrode 309 are connected to each other in an opening formed in the insulating layer 308, the coloring layer 351, and the protective layer 353. An alignment film 311 is formed over the pixel electrode 309.

The capacitor 305 includes a capacitor wiring 304 which is formed at the same time as a gate electrode 302 of the thin film transistor 303, a gate insulating layer 306, and the pixel electrode 309.

A stack body including components from the substrate 301 to the alignment film 311 is referred to as an element substrate 355.

The counter substrate 321 is provided with a light-blocking layer 323 for blocking incidence of light into the thin film transistor 303 and a planarizing layer 327 covering the light-blocking layer 323 and the counter substrate 321. A counter electrode 329 is formed on the planarizing layer 327, and an alignment film 331 is formed on the counter electrode 329.

The pixel electrode 309, the liquid crystal layer 343, and the counter electrode 329 are overlapped with each other, whereby a liquid crystal element is formed.

Note that although the VA mode liquid crystal display device is described here as a liquid crystal display device, the present invention is not limited thereto. That is, an element substrate which is formed using the thin film transistor in accordance with Embodiment 1 can also be applied to an FFS mode liquid crystal display device, an IPS mode liquid crystal display device, a TN mode liquid crystal display device, and other modes of liquid crystal display devices.

Since the thin film transistor with large on-current, high field-effect mobility, and small off-current is used as a pixel transistor in the liquid crystal display device of this embodiment, image quality of the liquid crystal display device can be improved. Further, electric characteristics of the thin film transistor are not degraded even when the thin film transistor is downsized; therefore, by reducing the area of the thin film transistor, the aperture ratio of the liquid crystal display device can be increased. In addition, the area of a pixel can be reduced, so that resolution of the liquid crystal display device can be improved.

Further, in the liquid crystal display device illustrated in FIG. 26, the light-blocking layer 323 and the coloring layer 351 are not formed over the same substrate. Therefore, misalignment of a mask in formation of the coloring layer 351 can be prevented. Accordingly, the area of the light-blocking layer 323 is not necessarily increased, which can increase the aperture ratio of the pixel.

Embodiment 10

By being provided with a light-emitting element without formation of the alignment film 311, the element substrate 313 described in Embodiment 9 can be used for a light-emitting display device or a light-emitting device. In a light-emitting display device or a light-emitting device, a light-emitting element utilizing electroluminescence is typically used as a light-emitting element. Light-emitting elements utilizing electroluminescence are classified according to whether a light-emitting material is an organic compound or an inorganic compound. In general, the former is referred to as an organic EL element and the latter as an inorganic EL element.

In the light-emitting display device or the light-emitting device of this embodiment, a thin film transistor with large on-current, high field-effect mobility, and small off-current is used as a pixel transistor; therefore, the light-emitting display device or the light-emitting device can have favorable image quality (for example, a high contrast) and low power consumption.

Embodiment 11

A display device including the thin film transistor according to any of the above embodiments can be applied to a variety of electronic devices (including an amusement machine). Examples of the electronic devices are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like. In particular, as described in Embodiments 9 and 10, the thin film transistor according to any of the above embodiments can be applied to a liquid crystal display device, a light-emitting device, an electrophoretic display device, or the like and thus can be used for a display portion of an electronic device. Specific examples will be described below.

A semiconductor device including the thin film transistor according to any of the above embodiments can be applied to electronic paper. An electronic paper can be used for electronic devices of a variety of fields as long as they can display data. For example, electronic paper can be applied to an electronic book (e-book) device, a poster, an advertisement in a vehicle such as a train, a digital signage, a public information display (PID), displays of various cards such as a credit card, and the like. Examples of such electronic devices are illustrated in FIGS. 27A to 27D.

Figure 27A:
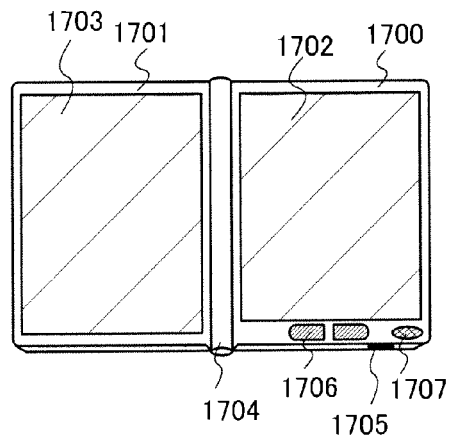
FIGS. 27A to 27D each illustrate an electronic device to which a thin film transistor is applied.

FIG. 27A illustrates an example of the electronic book device. For example, the electronic book device includes two housings, a housing 1700 and a housing 1701. The housing 1700 and the housing 1701 are combined with a hinge 1704 so that the electronic book device can be opened and closed. With such a structure, the electronic book device can operate like a paper book.

A display portion 1702 and a display portion 1703 are incorporated in the housing 1700 and the housing 1701, respectively. The display portion 1702 and the display portion 1703 may be configured to display one image or different images. In the case where the display portion 1702 and the display portion 1703 display different images, for example, a display portion on the right side (the display portion 1702 in FIG. 27A) can display text and a display portion on the left side (the display portion 1703 in FIG. 27A) can display graphics.

FIG. 27A illustrates an example in which the housing 1700 is provided with an operation portion and the like. For example, the housing 1700 is provided with a power source 1705, an operation key 1706, a speaker 1707, and the like. With the operation key 1706, pages can be turned. Note that a keyboard, a pointing device, and the like may be provided on the same surface as the display portion of the housing. Furthermore, an external connection terminal (an earphone terminal, a USB terminal, a terminal that can be connected to various cables including an AC adapter and a USB cable, or the like), a recording medium insertion portion, and the like may be provided on the back surface or the side surface of the housing. Further, the electronic book device may have a function of an electronic dictionary.

The electronic book device may transmit and receive data wirelessly. Through wireless communication, desired book data or the like can be purchased and downloaded from an electronic book server.

Figure 27B:
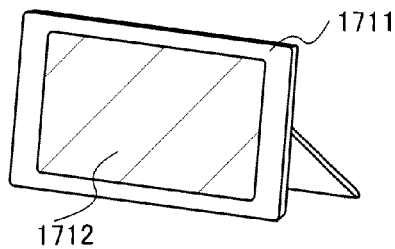

FIG. 27B illustrates an example of the digital photo frame. For example, in the digital photo frame, a display portion 1712 is incorporated in a housing 1711. Various images can be displayed in the display portion 1712. For example, the display portion 1712 can display data of an image shot by a digital camera or the like to function as a normal photo frame.

Note that the digital photo frame is provided with an operation portion, an external connection portion (a USB terminal, a terminal that can be connected to various cables including a USB cable, or the like), a recording medium insertion portion, and the like. Although these components may be provided on the surface on which the display portion is provided, it is preferable to provide them on the side surface or the back surface for the design of the digital photo frame. For example, a memory storing data of an image taken by a digital camera is inserted into the recording medium insertion portion of the digital photo frame, whereby the image data can be transferred and then displayed in the display portion 1712.

The digital photo frame may be configured to transmit and receive data wirelessly. The structure may be employed in which desired image data is transferred wirelessly to be displayed.

Figure 27C:
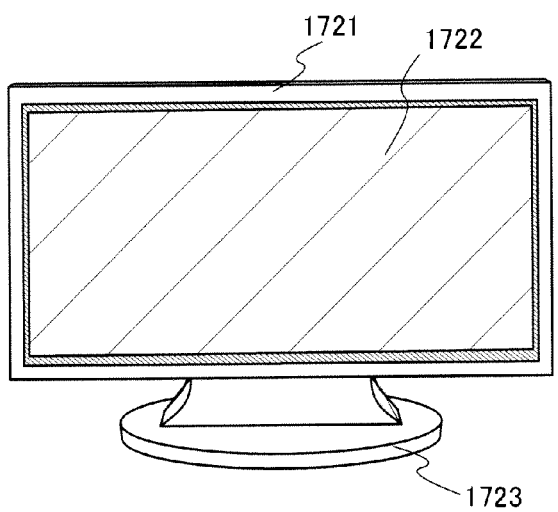

FIG. 27C illustrates an example of the television device. In the television device, a display portion 1722 is incorporated in a housing 1721. The display portion 1722 can display an image. Further, the housing 1721 is supported by a stand 1723 here. The display device described in Embodiment 9 or 10 can be applied to the display portion 1722.

The television device can be operated with an operation switch of the housing 1721 or a separate remote controller. Channels and volume can be controlled with an operation key of the remote controller so that an image displayed in the display portion 1722 can be controlled. Further, the remote controller may be provided with a display portion for displaying data output from the remote controller.

Note that the television device is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 27D:
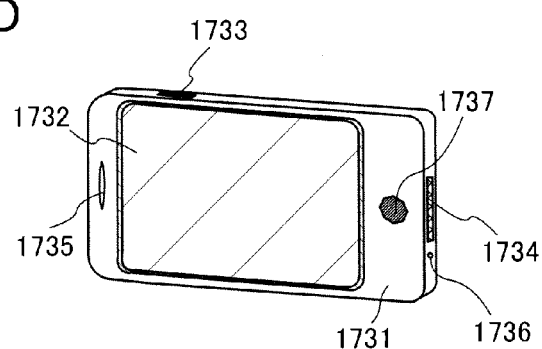

FIG. 27D illustrates an example of the mobile phone. The mobile phone is provided with a display portion 1732 incorporated in a housing 1731, an operation button 1733, an operation button 1737, an external connection port 1734, a speaker 1735, a microphone 1736, and the like. Any of the display devices described in Embodiments 9 and 10 can be applied to the display portion 1732.

The display portion 1732 of the mobile phone illustrated in FIG. 27D is a touchscreen. When the display portion 1732 is touched with a finger or the like, contents displayed in the display portion 1732 can be controlled. Further, operations such as making calls and composing mails can be performed by touching the display portion 1732 with a finger or the like.

There are mainly three screen modes for the display portion 1732. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1732 so that characters displayed on a screen can be input. In that case, it is preferable to display a keyboard or number buttons on a large area of the screen of the display portion 1732.

When a detection device including a sensor for detecting inclination, such as a gyroscope or an acceleration sensor, is provided inside the mobile phone, display data of the display portion 1732 can be automatically switched by determining the orientation of the mobile phone (whether the mobile phone is placed horizontally or vertically for a landscape mode or a portrait mode).

The screen modes are switched by touching the display portion 1732 or using the operation button 1737 of the housing 1731. Alternatively, the screen modes can be switched depending on kinds of images displayed in the display portion 1732. For example, when a signal of an image displayed in the display portion is the one of moving image data, the screen mode can be switched to the display mode. When the signal is the one of text data, the screen mode can be switched to the input mode.

Further, in the input mode, when input by touching the display portion 1732 is not performed for a certain period of time while a signal detected by an optical sensor in the display portion 1732 is detected, the screen mode may be controlled so as to be switched from the input mode to the display mode.

The display portion 1732 can function as an image sensor. For example, an image of a palm print, a fingerprint, or the like is taken by an image sensor when the display portion 1732 is touched with a palm or a finger, whereby personal authentication can be performed. Further, by providing a backlight or a sensing light source which emits near-infrared light in the display portion, an image of a finger vein, a palm vein, or the like can be taken.

This embodiment can be implemented in combination with any of the structures described in the other embodiments as appropriate.

EXAMPLE 1

In this example, a cross-sectional structure including an insulating layer, a microcrystalline semiconductor layer, a mixed layer, and a layer containing an amorphous semiconductor and concentrations of impurity elements in the structure will be described with reference to FIG. 21, FIG. 22, FIG. 23, and FIG. 24.

A method for forming a sample is described below.

A silicon oxide layer was formed as the insulating layer over a glass substrate (AN100 manufactured by Asahi Glass Co., Ltd.).

Here, a silicon oxide layer with a thickness of 100 nm was formed by a plasma CVD method. The deposition condition at this time was as follows: a source gas was introduced and stabilized, where the flow rate of tetraethyl orthosilicate (TEOS) was 15 sccm and the flow rate of $O_2$ was 750 sccm, the pressure in a treatment chamber was 100 Pa, the temperature of an upper electrode was 300° C., the temperature of a lower electrode was 297° C., the RF power source frequency was 27 MHz, the power of the RF power source was 300 W, and plasma discharge was performed.

Next, over the insulating layer, the microcrystalline semiconductor layer, the mixed layer, and the layer containing an amorphous semiconductor were successively formed.

Here, as the microcrystalline semiconductor layer, a microcrystalline silicon layer with a thickness of 5 nm was formed. The deposition condition at this time was as follows: as for a source gas, the flow rate of $SiH_4$ was 10 sccm and the flow rate of $H_2$ was 1500 sccm, the pressure in the treatment chamber was 280 Pa, the temperature of the substrate was 280° C., the RF power source frequency was 13.56 MHz, the power of the RF power source was 50 W, and plasma discharge was performed.

Then, the mixed layer and the layer containing an amorphous semiconductor were formed over the microcrystalline semiconductor layer. In this example, a silicon layer containing nitrogen was formed to a thickness of 145 nm as the mixed layer and the layer containing an amorphous semiconductor. The deposition condition at this time was as follows: as for a source gas, the flow rate of $SiH_4$ was 20 sccm, the flow rate of $H_2$ was 1475 sccm, and the flow rate of 1000 ppm $NH_3$ (diluted with hydrogen) was 25 sccm, the pressure in the treatment chamber was 280 Pa, the temperature of the substrate was 280° C., the RF power source frequency was 13.56 MHz, the power of the RF power source was 50 W, and plasma discharge was performed.

Note that when a silicon layer containing nitrogen is deposited over the microcrystalline semiconductor layer under the condition described above, crystals grow using the microcrystalline semiconductor layer as a seed crystal at the early stage of deposition. However, crystallinity is suppressed with nitrogen of $NH_3$ contained in the source gas, and an amorphous semiconductor region is gradually increased. A layer including a microcrystalline semiconductor region becomes the mixed layer, and a layer in which crystals do not grow and which includes only the amorphous semiconductor region becomes the layer containing an amorphous semiconductor.

As a protective layer, an amorphous silicon layer with a thickness of 100 nm was formed over the layer containing an amorphous semiconductor. The deposition condition at this time was as follows: as for the source gas, the flow rate of $SiH_4$ was 280 sccm and the flow rate of H2 was 300 sccm, the deposition temperature was 280° C., the pressure was 170 Pa, the RF power source frequency was 13.56 MHz, the power of the RF power source was 60 W, and plasma discharge was performed.

Figure 21:
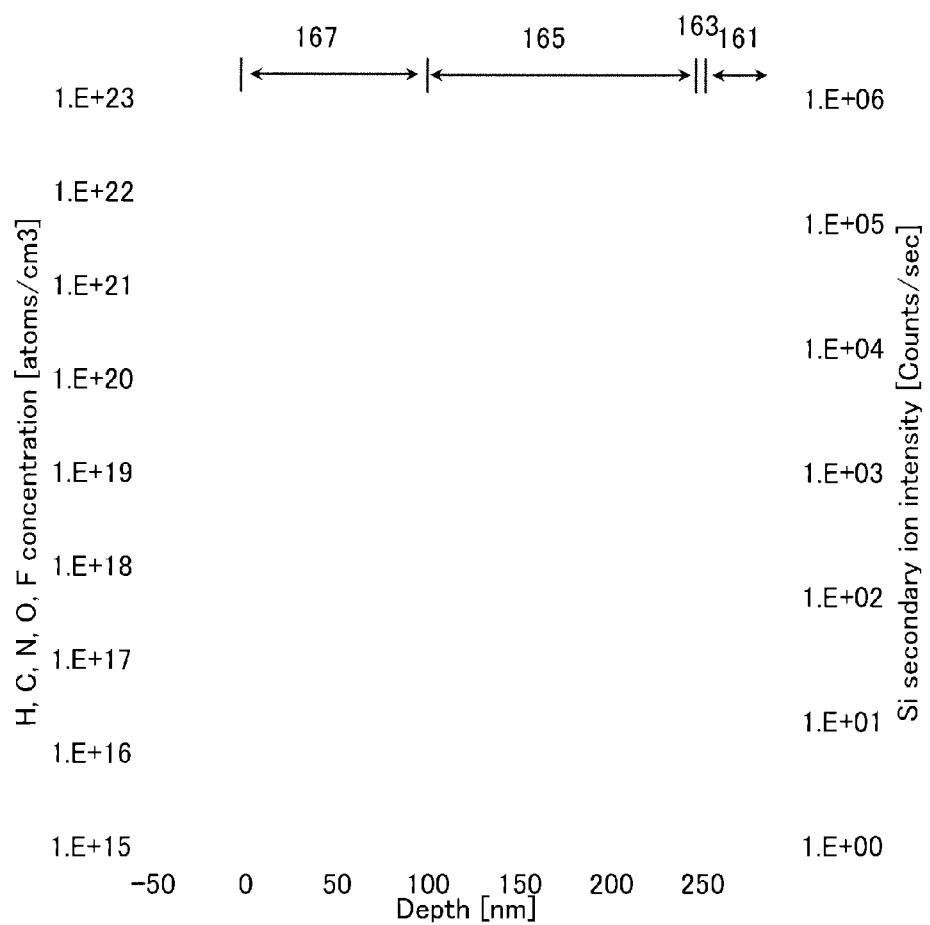
FIG. 21 shows a measurement result of SIMS.
Figure 22:
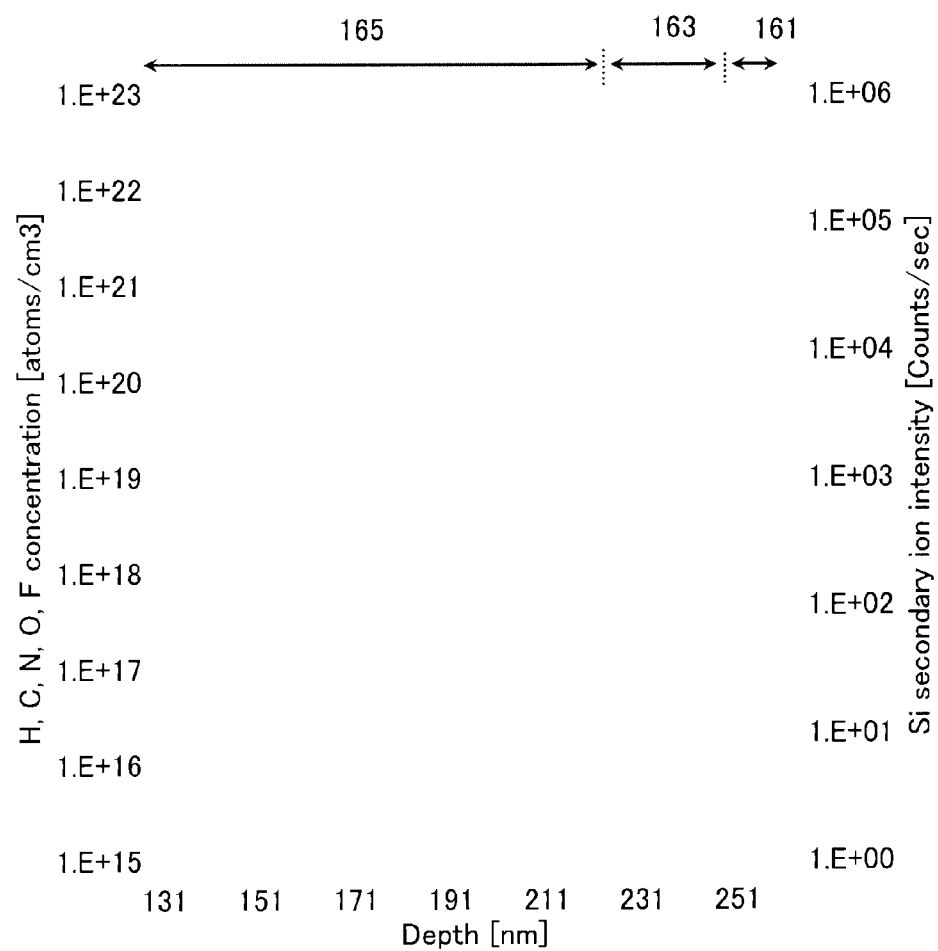
FIG. 22 shows a measurement result of SIMS.

FIG. 21 shows a diagram in which a cross-sectional TEM (transmission electron microscope) image of the above sample which was subjected to ion milling and a result of measuring the concentrations of the impurity elements by SIMS are superimposed. FIG. 22 shows an enlarged view including the microcrystalline semiconductor layer, the mixed layer, and the layer containing an amorphous semiconductor, which are shown in FIG. 21. In FIG. 21 and FIG. 22, the surface of the protective layer was irradiated with primary ions and thus SIMS measurement was conducted.

In this embodiment, a quadrupole mass analyzer, PHI ADEPT-1010, manufactured by ULVAC-PHI, Incorporated, was used as a SIMS measuring apparatus. In addition, irradiation with $Cs^+$, as primary ions, was performed with an acceleration voltage of 3 kV.

In FIG. 21 and FIG. 22, the horizontal axis represents a depth and the vertical axis on the left side represents the concentrations of hydrogen, carbon, nitrogen, oxygen, and fluorine. The vertical axis on the right side represents the secondary ion intensity of silicon.

As for the horizontal axis, a portion from a depth of 0 nm to a depth of 100 nm corresponds to a protective layer 167, a portion from a depth of 100 nm to a depth of 245 nm approximately corresponds to a region 165 which was formed under a deposition condition of the layer containing an amorphous semiconductor and the mixed layer, a portion from a depth of 245 nm to a depth of 250 nm corresponds to a microcrystalline semiconductor layer 163, and a portion from a depth of 250 nm to the right side of the diagram corresponds to an insulating layer 161.

According to FIG. 22, since lattice fringes can be observed in a region from a depth of 225 nm to a depth of 250 nm approximately in the TEM image, it is found that a microcrystalline semiconductor region is formed there. In addition, according to the SIMS measurement result, the nitrogen concentration profile has a maximum value at a depth of about 240 nm. This is because of the following. Under the deposition condition of the mixed layer and the layer containing an amorphous semiconductor, that is, under a condition where nitrogen which suppresses crystallization is contained in the atmosphere, although crystals grow using the microcrystalline semiconductor layer as a seed crystal at the early stage of deposition, nitrogen is unlikely to be incorporated into the microcrystalline semiconductor region; therefore, the nitrogen concentration is low in the microcrystalline semiconductor region. However, as the crystal grows, the concentration of nitrogen which is not incorporated into the microcrystalline semiconductor region is increased, so that the crystal growth is inhibited and an amorphous semiconductor region is formed; consequently, nitrogen is segregated at the interface of different microcrystalline semiconductor regions and the interface between the microcrystalline semiconductor region and the amorphous semiconductor region, resulting in increase in nitrogen concentration. Since the amorphous semiconductor region contains nitrogen, the nitrogen concentration is constant (here, $1\times10^{20}$ atoms/cm$^3$) in a region where crystals do not grow, that is, in a region including only the amorphous semiconductor region.

In addition, the hydrogen concentration is gradually increased from a depth of about 242 nm, which shows that the amorphous semiconductor region is gradually increased. Further, since the hydrogen concentration is constant (here, $4\times10^{21}$ atoms/cm$^3$) from a depth of 213 nm, it is found that the microcrystalline semiconductor region is not formed but the amorphous semiconductor region is formed.

In the microcrystalline semiconductor region, a proportion of bonded silicon atoms is high and thus the hydrogen concentration is low. On the other hand, in the amorphous semiconductor region, a proportion of bonded silicon atoms is low and the number of dangling bonds of silicon is larger than in the microcrystalline semiconductor region. Provided that hydrogen is bonded to the dangling bond, the hydrogen concentration becomes high in the amorphous semiconductor region. According to the above, a gradual increase in hydrogen concentration in the concentration profile obtained by SIMS shows a reduction in crystallinity. In addition, the constant hydrogen concentration shows that the amorphous semiconductor region is formed. That is, it is found that the crystallinity is gradually lowered from the interface between the insulating layer and the microcrystalline semiconductor layer to the microcrystalline semiconductor layer and the mixed layer, and the layer containing an amorphous semiconductor includes the amorphous semiconductor region.

The carbon concentration is $3\times10^{17}$ atoms/cm$^3$ to $7\times10^{19}$ atoms/cm$^3$ in a region from a depth of 225 nm to a depth of 250 nm approximately, and is $5\times10^{16}$ atoms/cm$^3$ to $3\times10^{17}$ atoms/cm$^3$ in a region from a depth of 131 nm to a depth of 225 nm approximately.

The oxygen concentration is $2\times10^{17}$ atoms/cm$^3$ to $2\times10^{19}$ atoms/cm$^3$ in a region from a depth of 225 nm to a depth of 250 nm approximately, and is $4\times10^{16}$ atoms/cm$^3$ to $3\times10^{17}$ atoms/cm$^3$ in a region from a depth of 131 nm to a depth of 225 nm approximately.

The fluorine concentration is $6\times10^{16}$ atoms/cm$^3$ to $4\times10^{17}$ atoms/cm$^3$ in a region from a depth of 225 nm to a depth of 250 nm approximately, and is $3\times10^{16}$ atoms/cm$^3$ to $6\times10^{16}$ atoms/cm$^3$ in a region from a depth of 131 nm to a depth of 225 nm approximately.

Figure 23:
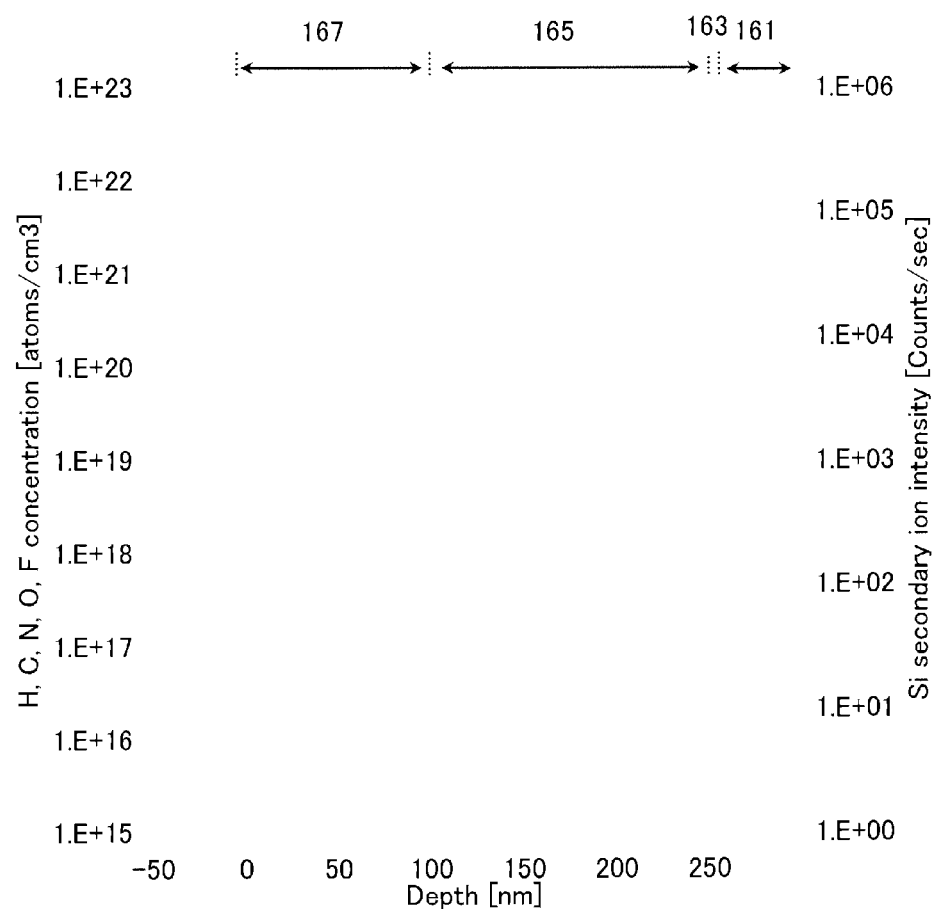
FIG. 23 shows a measurement result of SIMS.
Figure 24:
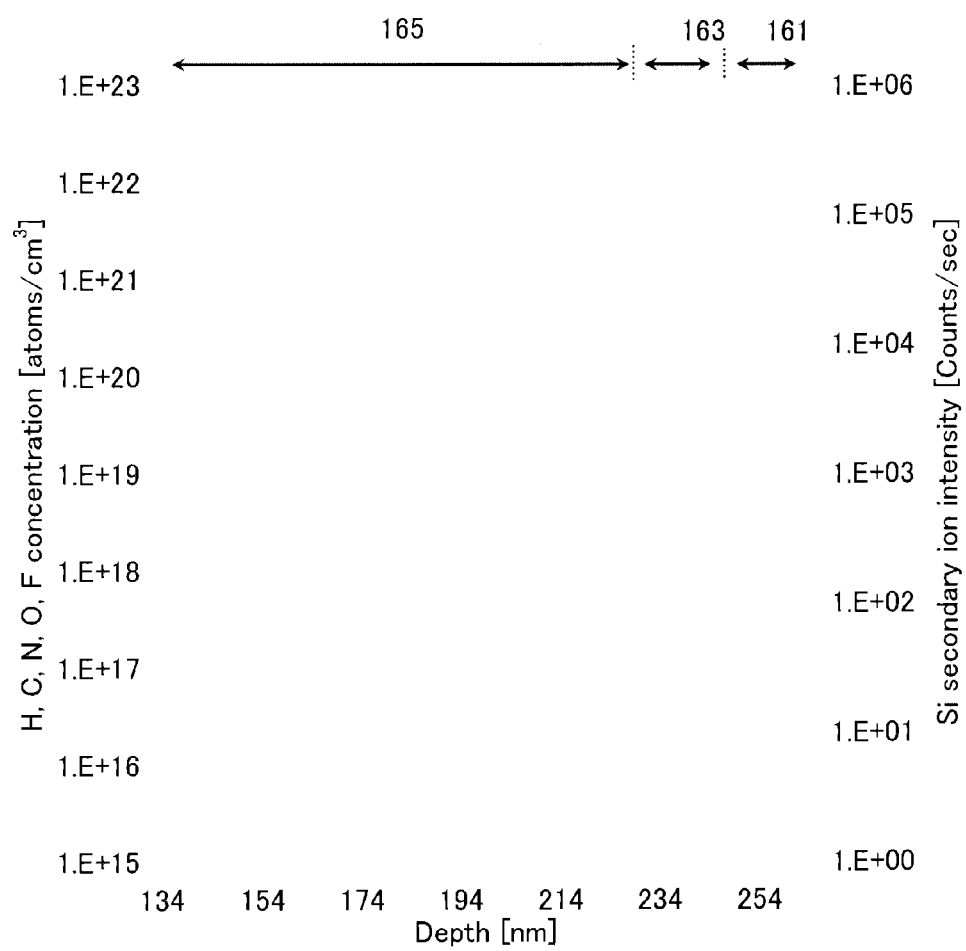
FIG. 24 shows a measurement result of SIMS.

Next, FIG. 23 shows a diagram in which a result of observing the sample using TEM and a result of measuring the concentrations of the impurity elements by SSDP-SIMS (substrate side depth profile-SIMS) are superimposed. FIG. 24 shows an enlarged view including the microcrystalline semiconductor layer, the mixed layer, and the layer containing an amorphous semiconductor, which are shown in FIG. 23. In FIG. 23 and FIG. 24, since the sample was measured by SSDP-SIMS, the surface of the substrate was irradiated with primary ions and thus SIMS measurement was conducted. This measurement was performed to examine whether or not the resolution was decreased by a phenomenon (knock on effect) in which the element of the layer on the surface side was diffused into the substrate and the measurement accuracy of the impurity element concentration, particularly, the nitrogen concentration in the mixed layer was deteriorated.

The TEM image is the same as that in FIG. 21 and FIG. 22; therefore, the measurement result of SSDP-SIMS is described here. Note that the vertical axis and the horizontal axis represent the same as in FIG. 21 and FIG. 22.

According to FIG. 24, since lattice fringes can be observed in a region from a depth of 225 nm to a depth of 250 nm approximately in the TEM image, it is found that a crystalline region is formed there. In addition, according to the SSDP-SIMS measurement result in FIG. 24, the nitrogen concentration profile has a maximum value at a depth of about 237 nm. Since the amorphous structure contains nitrogen, the nitrogen concentration is constant (here, $1\times10^{20}$ atoms/cm$^3$) in a region where crystals do not grow, that is, in a region including only the amorphous structure.

In addition, the hydrogen concentration is gradually increased from a depth of about 247 nm. Further, the hydrogen concentration is constant from a depth of 212 nm ($4\times10^{21}$ atoms/cm$^3$ here).

The carbon concentration is $1\times10^{18}$ atoms/cm$^3$ to $2\times10^{19}$ atoms/cm$^3$ in a region from a depth of 225 nm to a depth of 247 nm approximately, and is $2\times10^{17}$ atoms/cm$^3$ to $1\times10^{18}$ atoms/cm$^3$ in a region from a depth of 134 nm to a depth of 225 nm approximately.

The oxygen concentration is $2\times10^{20}$ atoms/cm$^3$ to $4\times10^{21}$ atoms/cm$^3$ in a region from a depth of 225 nm to a depth of 247 nm approximately, and is $8\times10^{18}$ atoms/cm$^3$ to $2\times10^{20}$ atoms/cm$^3$ in a region from a depth of 134 nm to a depth of 225 nm approximately.

The fluorine concentration is $4\times10^{17}$ atoms/cm$^3$ to $8\times10^{17}$ atoms/cm$^3$ in a region from a depth of 225 nm to a depth of 247 nm approximately, and is $1\times10^{17}$ atoms/cm$^3$ to $4\times10^{17}$ atoms/cm$^3$ in a region from a depth of 134 nm to a depth of 225 nm approximately.

In FIG. 24, the concentrations of oxygen, carbon, and fluorine are higher than in FIG. 22, which is caused by a knock on effect. However, the concentrations of nitrogen and hydrogen, and the maximum value of the nitrogen profile are the same as in FIG. 22 and FIG. 24. Accordingly, in the microcrystalline semiconductor layer, the mixed layer, and the layer containing an amorphous semiconductor which are described in this example, the nitrogen concentration profile has a peak concentration in the mixed layer and is flat in the layer containing an amorphous semiconductor. Further, the microcrystalline semiconductor region included in the mixed layer contains nitrogen at $1\times10^{20}$ atoms/cm$^3$ to $2\times10^{21}$ atoms/cm$^3$. Furthermore, the layer containing an amorphous semiconductor contains nitrogen at $1\times10^{20}$ atoms/cm$^3$.

This application is based on Japanese Patent Application serial no. 2009-055549 filed with Japan Patent Office on Mar. 9, 2009, the entire contents of which are hereby incorporated by reference.

REFERENCE NUMERALS

101: substrate, 103: gate electrode, 105: gate insulating layer, 106: semiconductor layer, 107: semiconductor layer, 109: impurity semiconductor layer, 111: conductive layer, 113: resist mask, 115: semiconductor layer, 117: impurity semiconductor layer, 119: conductive layer, 123: resist mask, 125: wiring, 127: impurity semiconductor layer, 133: wiring, 141: crystal nuclei, 145: N atom, 147: O atom, 161: insulating layer, 163: microcrystalline semiconductor layer, 165: region, 167: protective layer, 180: gray-tone mask, 181: light-transmitting substrate, 182: light-blocking portion, 183: diffraction grating portion, 185: half-tone mask, 186: light-transmitting substrate, 187: semi-light-transmitting portion, 188: light-blocking portion, 201: pretreatment, 203: formation of SiN, 205: replacement of gases, 207: formation of SiON, 209: replacement of gases, 211: formation of first semiconductor layer, 213: flush treatment, 215: replacement of gases, 217: formation of second semiconductor layer, 219: replacement of gases, 221: formation of impurity semiconductor layer, 223: exhaust, 225: unload, 227: cleaning treatment, 229: precoating treatment, 231: load, 232: dashed line, 233: precoating treatment, 234: dashed line, 236: dashed line, 238: dashed line, 301: substrate, 302: gate electrode, 303: thin film transistor, 304: capacitor wiring, 305: capacitor, 306: gate insulating layer, 307: drain electrode, 308: insulating layer, 309: pixel electrode, 311: alignment film, 313: element substrate, 321: counter substrate, 323: light-blocking layer, 325: coloring layer, 327: planarizing layer, 329: counter electrode, 331: alignment film, 341: spacer, 343: liquid crystal layer, 351: coloring layer, 353: protective layer, 355: element substrate, 107b: mixed layer, 107c: layer containing amorphous semiconductor, 108a: microcrystalline semiconductor region, 108b: amorphous semiconductor region, 108c: microcrystalline semiconductor region, 115a: microcrystalline semiconductor layer, 115b: mixed layer, 115c: layer containing amorphous semiconductor, 129c: layer containing amorphous semiconductor, 129d: amorphous semiconductor layer, 151a: growth region, 151b: growth region, 153a: growth region, 153b: growth region, 155a: growth region, 155b: growth region, 1700: housing, 1701: housing, 1702: display portion, 1703: display portion, 1704: hinge, 1705: power source, 1706: operation key, 1707: speaker, 1711: housing, 1712: display portion, 1721: housing, 1722: display portion, 1723: stand, 1731: housing, 1732: display portion, 1733: operation button, 1734: external connection port, 1735: speaker, 1736: microphone, 1737: operation button, 235a: dashed line, 235b: dashed line, 237a: dashed line, 237b: dashed line, 239a: solid line, 239b: dashed line

What is claimed is:

1. A semiconductor device comprising:
   a thin film transistor over a substrate;
   an insulating layer over the thin film transistor; and
   a liquid crystal element over the insulating layer,
   wherein the thin film transistor comprises:
     a gate electrode over the substrate;
     a gate insulating layer covering the gate electrode;
     a semiconductor layer over the gate insulating layer; and
     impurity semiconductor layers configured to form a source region and a drain region over the semiconductor layer,
   wherein a nitrogen concentration profile in the semiconductor layer exhibits an increase from the gate insulating layer side toward the impurity semiconductor layers to reach a maximum value and then decreases, and
   wherein the liquid crystal element includes a pixel electrode which is electrically connected to the source region or the drain region through an opening of the insulating layer.

2. The semiconductor device according to claim 1, wherein a region of the semiconductor layer which has the maximum value of the nitrogen concentration profile in the semiconductor layer is located closer to the gate insulating layer than to the impurity semiconductor layers.

3. The semiconductor device according to claim 1, wherein the maximum value is greater than or equal to $1\times10^{20}$ atoms/cm$^3$ and less than or equal to $1\times10^{21}$ atoms/cm$^3$.

4. The semiconductor device according to claim 1, wherein the nitrogen concentration profile is obtained by SIMS.

5. The semiconductor device according to claim 1, wherein the semiconductor layer comprises a microcrystalline semiconductor layer.

6. The semiconductor device according to claim 1, wherein the semiconductor layer comprises a layer containing an amorphous semiconductor.

7. The semiconductor device according to claim 1, wherein the semiconductor layer comprises a mixed layer including an amorphous semiconductor region and a microcrystalline semiconductor region.

8. The semiconductor device according to claim 1, further comprising a capacitor comprising a capacitor wiring, the gate insulating layer, and the pixel electrode, the capacitor wiring is formed at the same time as the gate electrode.

9. The semiconductor device according to claim 1, wherein the semiconductor device is a liquid crystal display device.

10. A semiconductor device comprising:
    a thin film transistor over a substrate;
    an insulating layer over the thin film transistor; and
    a liquid crystal element over the insulating layer,
    wherein the thin film transistor comprises:
      a gate electrode over the substrate;
      a gate insulating layer covering the gate electrode;
      a semiconductor layer over the gate insulating layer; and
      impurity semiconductor layers configured to form a source region and a drain region over the semiconductor layer,
    wherein a nitrogen concentration profile in the semiconductor layer exhibits an increase from the gate insulating layer toward the impurity semiconductor layers to reach a maximum value and then a substantially constant value, and
    wherein the liquid crystal element includes a pixel electrode which is electrically connected to the source region or the drain region through an opening of the insulating layer.

11. The semiconductor device according to claim 10, wherein the maximum value is greater than or equal to $1\times10^{20}$ atoms/cm$^3$ and less than or equal to $1\times10^{21}$ atoms/cm$^3$.

12. The semiconductor device according to claim 10, wherein the nitrogen concentration profile is obtained by SIMS.

13. The semiconductor device according to claim 10, wherein the semiconductor layer comprises a microcrystalline semiconductor layer.

14. The semiconductor device according to claim 10, wherein the semiconductor layer comprises a layer containing an amorphous semiconductor.

15. The semiconductor device according to claim 10, wherein the semiconductor layer comprises a mixed layer including an amorphous semiconductor region and a microcrystalline semiconductor region.

16. The semiconductor device according to claim 10, further comprising a capacitor comprising a capacitor wiring, the gate insulating layer, and the pixel electrode, the capacitor wiring is formed at the same time as the gate electrode.

17. The semiconductor device according to claim 10, wherein the semiconductor device is a liquid crystal display device.

18. A semiconductor device comprising:
a thin film transistor over a substrate; and
a light-emitting element over the thin film transistor,
wherein the thin film transistor comprises:
- a gate electrode over the substrate;
- a gate insulating layer covering the gate electrode;
- a semiconductor layer over the gate insulating layer; and
- impurity semiconductor layers configured to form a source region and a drain region over the semiconductor layer, wherein a nitrogen concentration profile in the semiconductor layer exhibits an increase from the gate insulating layer side toward the impurity semiconductor layers to reach a maximum value and then decreases, and wherein the light-emitting element is electrically connected to the source region or the drain region of the thin film transistor.

19. The semiconductor device according to claim 18, wherein a region of the semiconductor layer which has the maximum value of the nitrogen concentration profile in the semiconductor layer is located closer to the gate insulating layer than to the impurity semiconductor layers.

20. The semiconductor device according to claim 18, wherein the maximum value is greater than or equal to $1\times10^{20}$ atoms/cm$^3$ and less than or equal to $1\times10^{21}$ atoms/cm$^3$.

21. The semiconductor device according to claim 18, wherein the nitrogen concentration profile is obtained by SIMS.

22. The semiconductor device according to claim 18, wherein the semiconductor layer comprises a microcrystalline semiconductor layer.

23. The semiconductor device according to claim 18, wherein the semiconductor layer comprises a layer containing an amorphous semiconductor.

24. The semiconductor device according to claim 18, wherein the semiconductor layer comprises a mixed layer including an amorphous semiconductor region and a microcrystalline semiconductor region.

25. The semiconductor device according to claim 18, wherein the light-emitting element comprises an organic compound.

26. The semiconductor device according to claim 18, wherein the semiconductor device is an EL display device.

* * * * *